US012684834B2

(12) United States Patent
You et al.

(10) Patent No.: US 12,684,834 B2
(45) Date of Patent: Jul. 14, 2026

(54) COMPLEMENTARY FIELD EFFECT TRANSISTOR WITH CONDUCTIVE THROUGH SUBSTRATE LAYER

(71) Applicant: Taiwan Semiconductor Manufacturing Co., Ltd., Hsinchu (TW)

(72) Inventors: Wei-Xiang You, Hsinchu (TW); Wei-De Ho, Hsinchu (TW); Hsin Yang Hung, Hsinchu (TW); Meng-Yu Lin, Hsinchu (TW); Hsiang-Hung Huang, Hsinchu (TW); Chun-Fu Cheng, Hsinchu (TW); Kuan-Kan Hu, Hsinchu (TW); Szu-Hua Chen, Hsinchu (TW); Ting-Yun Wu, Hsinchu (TW); Wei-Cheng Tzeng, Hsinchu (TW); Wei-Cheng Lin, Hsinchu (TW); Cheng-Yin Wang, Hsinchu (TW); Jui-Chien Huang, Hsinchu (TW); Szuya Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 703 days.

(21) Appl. No.: 18/168,504

(22) Filed: Feb. 13, 2023

(65) Prior Publication Data

US 2024/0072115 A1     Feb. 29, 2024

Related U.S. Application Data

(60) Provisional application No. 63/477,367, filed on Dec. 27, 2022, provisional application No. 63/402,916, filed on Aug. 31, 2022.

(51) Int. Cl.
*H10D 62/10* (2025.01)
*H10D 30/67* (2025.01)
(Continued)

(52) U.S. Cl.
CPC ....... *H10D 62/121* (2025.01); *H10D 30/6729* (2025.01); *H10D 30/6735* (2025.01);
(Continued)

(58) Field of Classification Search
CPC ............. H10D 62/121; H10D 30/6729; H10D 30/6735; H10D 30/6757; H10D 84/0167;
(Continued)

(56) References Cited

U.S. PATENT DOCUMENTS

2019/0172828 A1* 6/2019 Smith ................. H10D 30/6757
2020/0066683 A1* 2/2020 Kim ...................... H10W 20/20
(Continued)

*Primary Examiner* — Yara B Green
*Assistant Examiner* — Akhee Sarker-Nag
(74) *Attorney, Agent, or Firm* — Seed IP Law Group

(57) ABSTRACT

A device includes: a complementary transistor including: a first transistor having first and second source/drain regions; and a second transistor stacked on the first transistor, and having a third source/drain region and a fourth source/drain region, the third source/drain region overlapping the first source/drain region, the fourth source/drain region overlapping the second source/drain region. The device further includes: a first source/drain contact electrically coupled to the third source/drain region; a second source/drain contact electrically coupled to the second source/drain region; a gate isolation structure adjacent the first and second transistors; and an interconnect structure electrically coupled to the first source/drain contact and the second source/drain contact. The interconnect structure includes: a conductive layer in contact with the first source/drain contact and the second source/drain contact, the conductive layer being in the gate isolation structure; an opening in the conductive layer; and a dielectric layer in the opening.

20 Claims, 56 Drawing Sheets

(51) Int. Cl.
*H10D 84/01* (2026.01)
*H10D 84/03* (2025.01)
*H10W 20/41* (2026.01)

(52) U.S. Cl.
CPC ..... *H10D 30/6757* (2025.01); *H10D 84/0167* (2025.01); *H10D 84/017* (2025.01); *H10D 84/0188* (2025.01); *H10D 84/038* (2025.01); *H10W 20/435* (2026.01)

(58) Field of Classification Search
CPC ............. H10D 84/017; H10D 84/0188; H10D 84/038; H10D 62/151; H10D 64/254; H10D 84/013; H10D 84/0149; H10D 84/0186; H10D 84/83; H10W 20/435; H10W 20/0698; H10W 20/069; H10W 20/20; H10W 20/40
See application file for complete search history.

(56) References Cited

U.S. PATENT DOCUMENTS

2020/0111798 A1* 4/2020 Paul ..................... H10B 10/125
2020/0411388 A1* 12/2020 Wu ................... H10D 84/0195

* cited by examiner

100

100

100

262A

100

100A

100A

COMPLEMENTARY FIELD EFFECT TRANSISTOR WITH CONDUCTIVE THROUGH SUBSTRATE LAYER

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Complementary field effect transistors (CFETs) may be utilized to increase the density of transistors in an integrated circuit. A CFET may include an N-type transistor and a P-type transistor stacked vertically. The gate electrodes of the N-type and P-type transistors may be electrically shorted together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
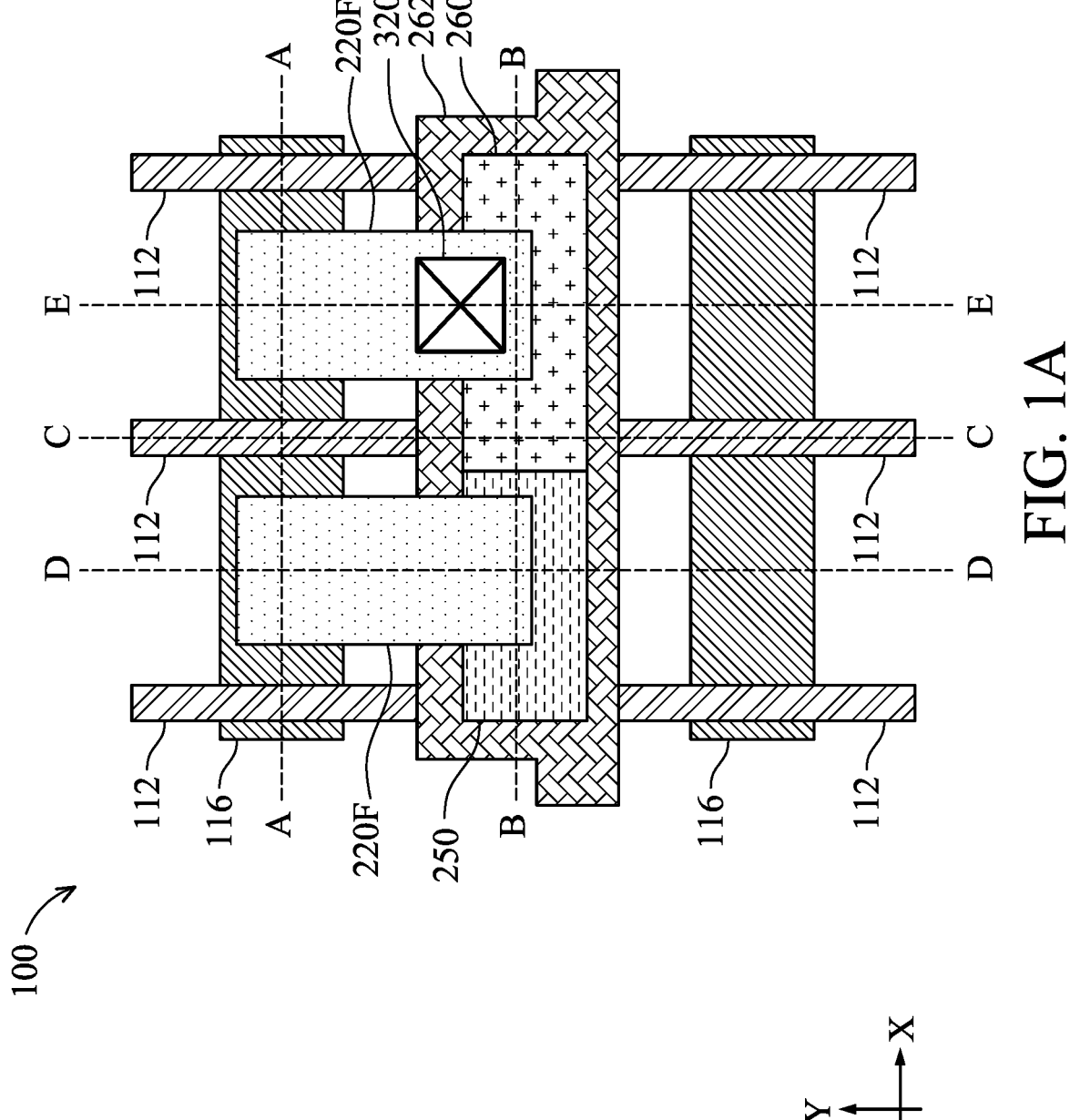
FIGS. 1A-1F are views of an integrated circuit including a CFET, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in this specification and the appended claims, the terms "fill," "fills," "filling" and "filled" include the meaning of partially fill and completely fill (or fills, filling, filled, etc.). For example, a conductive layer may be said to "fill" an opening, which may include that the conductive layer contacts adjacent walls of the opening, or that the conductive layer is present in the opening with one or more different material layers between the conductive layer and the adjacent walls.

As used in this specification and the appended claims, the terms "surround," "surrounds," "surrounding" and "surrounded" include the meaning of completely surround and partially surround (or surrounds, surrounding, surrounded, etc.). For example, a six-sided volume (e.g., a rectangular prism) being "surrounded" includes the meanings of being fully surrounded on all six sides by a material, or may be partially surrounded, such that one or more of the six sides is less than fully covered by the material and has at least a portion thereof exposed.

Embodiments of the present disclosure provide an integrated circuit with a CFET having improved electrical characteristics. The CFET includes a first transistor stacked vertically on a second transistor. The first and second transistors each have a plurality of semiconductor nanostructures that act as the channel regions for the first and second transistors. A first gate metal surrounds the semiconductor nanostructures of the first transistor. A second gate metal surrounds the semiconductor nanostructures of the second transistor.

Three-dimensional (3D) stacking to form CFETs has been proposed as a potential transistor architecture to further extend Moore's law. Due to the nature of 3D stacking NFETs and PFETs, a vertical local interconnect (VLI, or conductive through-substrate layer "TSL") is advantageous to connect the top and bottom devices to each other. However, the large area of the VLI may cause considerable gate-to-source/drain capacitances (Cgs/Cgd) which significantly degrades the performance and/or power of complementary metal-oxide-semiconductor (CMOS) circuits. A first metal layer on top of the VLI may be separated from the VLI by large distances due to potential shorts to the VLI through source/drain contacts and source/drain vias, which wastes limited first metal layer routing resources.

The conductive TSL has an L shape or other shape that has a cutout region overlapping one or more transistors adjacent the first and/or second transistors. In the cutout region, conductive material of the conductive TSL is replaced by a non-conductive material, such as a dielectric material, which reduces parasitic capacitance between the conductive TSL and the overlapped transistor(s). The conductive TSL with cutout region enhances routing flexibility, for example, allowing contact landing on the dielectric material without short to the conductive TSL, thereby releasing first metal layer routing resources. Improved design can be achieved by control of the dielectric material area recess, for example, by trading off resistance and capacitance. A low-k dielectric can be adopted for a gate isolation structure liner in which the conductive TSL is formed, which is advantageous to reduce capacitance in the L-shaped conductive TSL.

Figure 1B:
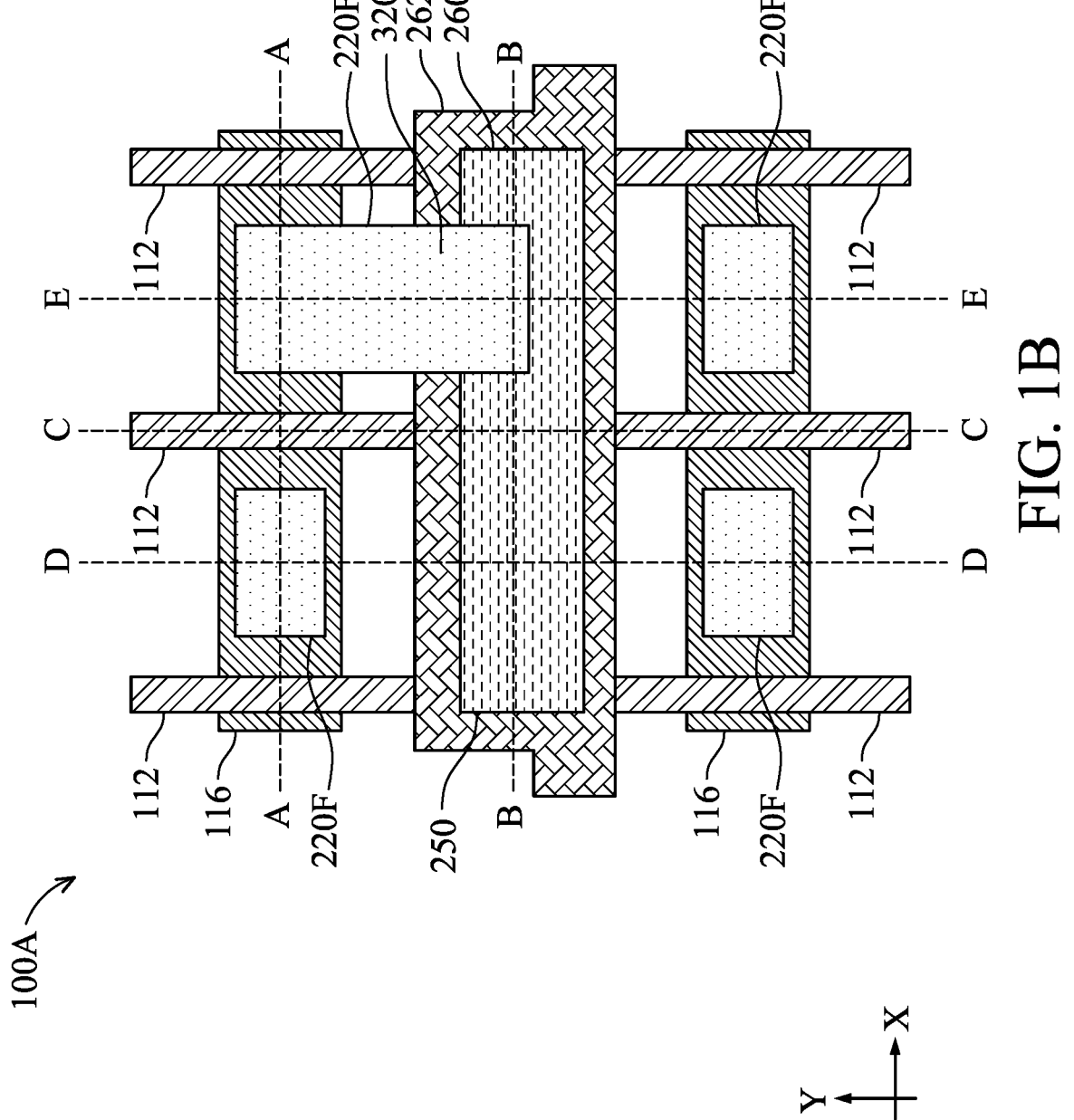
Figure 1C:
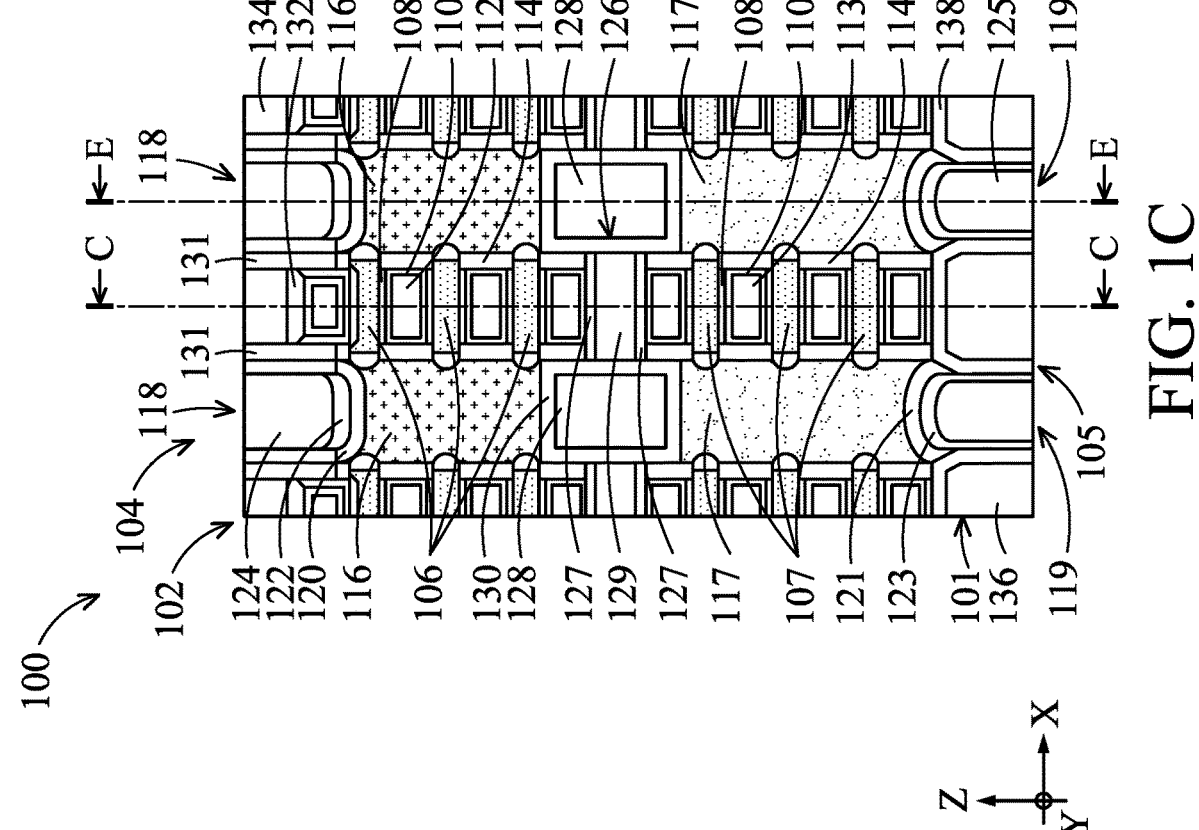
Figure 1E:
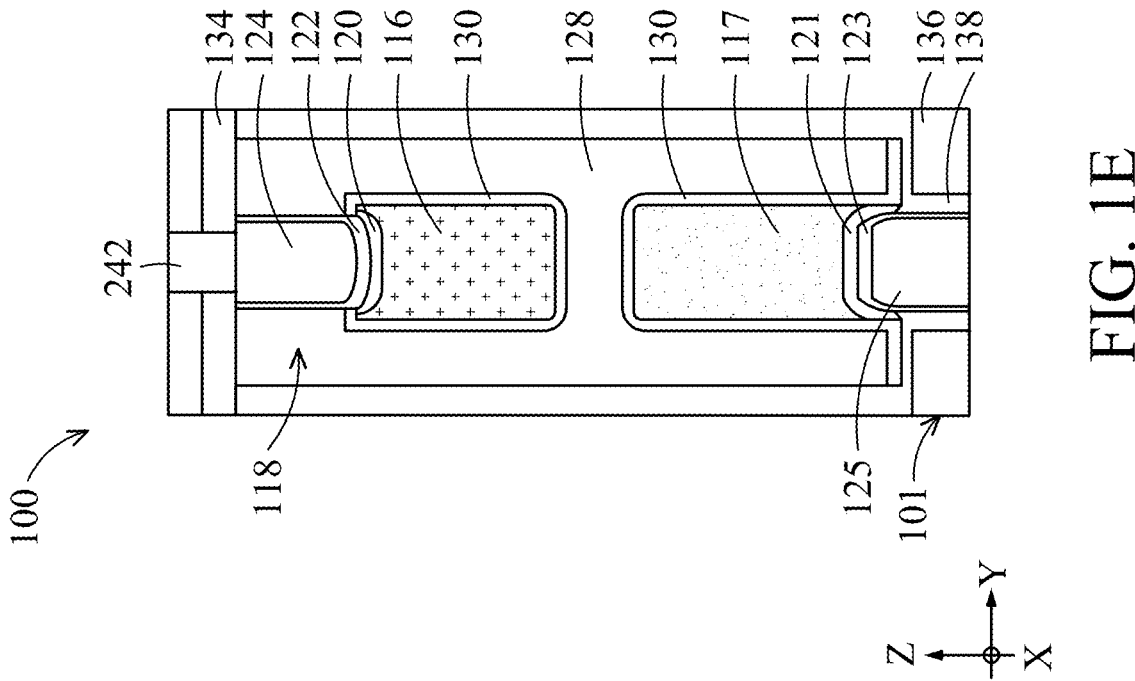
Figure 1D:
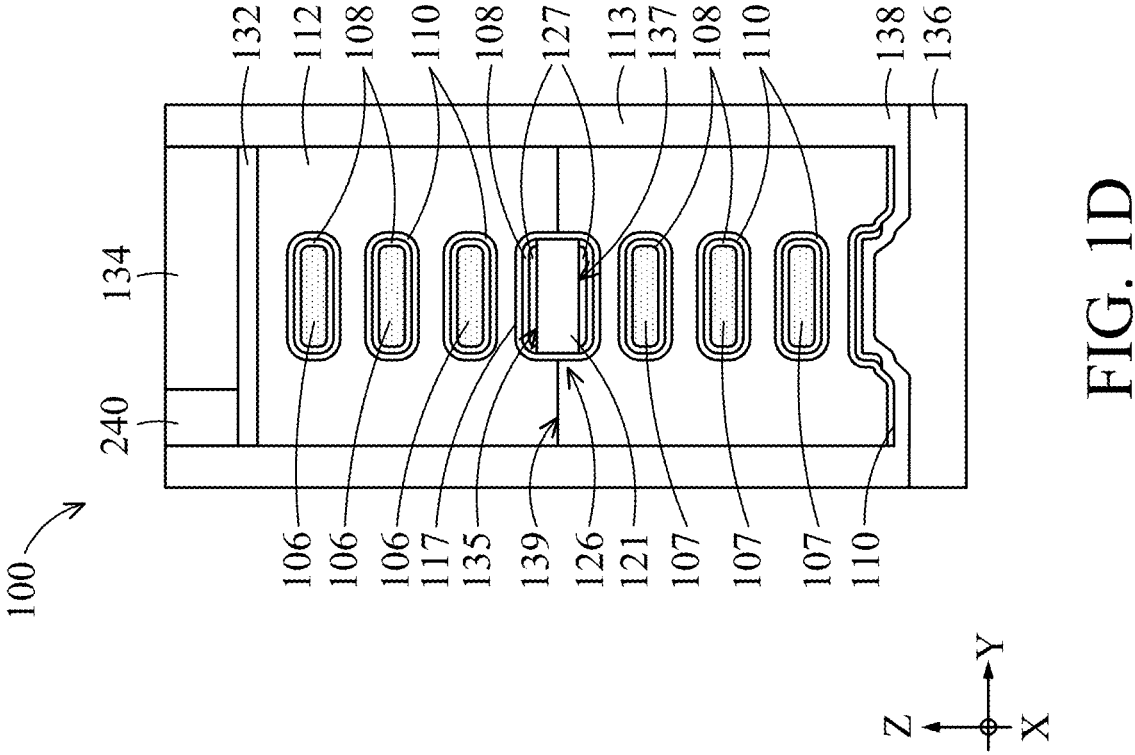

FIGS. 1A and 1B are diagrammatic top views of integrated circuits 100, 100A in accordance with various embodiments. The integrated circuit 100 includes an L-shaped conductive TSL 250 that has a lower portion that is wider than an upper portion thereof. The integrated circuit 100A includes an inverted-L-shaped conductive TSL 250 that has an upper portion that is wider than a lower portion thereof. FIGS. 1C-1E are diagrammatic cross-sectional and perspective views of CFETs of the integrated circuits 100, 100A. Some features may be omitted from view in the figures for clarity of illustration.

FIG. 1C is a cross-sectional view of an integrated circuit 100, in accordance with some embodiments. The view of FIG. 1C may correspond to the cross-sectional line A-A in FIGS. 1A and 1B. The integrated circuit 100 includes a complimentary field effect transistor (CFET) 102. The CFET 102 includes a first transistor 104 of a first conductivity type and a second transistor 105 of a second conductivity type. The first transistor 104 is vertically stacked on the second transistor 105. The CFET 102 utilizes an isolation structure 126 to separate the stacked channel regions of the first transistor 104 from the stacked channels of the second transistor 105 in order to improve electrical characteristics of the CFET 102. In other words, a hybrid nanostructure (e.g. hybrid sheet) including the stacked channel region of first transistor 104, isolation structure 126, and the stacked channel region of second transistor 105 is formed.

The CFET transistor 102 may correspond to a gate all around transistor. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around CFET 102 may include a plurality of semiconductor nanostructures corresponding to channel regions of the CFET 102. The semiconductor nanostructures may include nanosheets, nanowires, or other types of nanostructures. The gate all around transistors may also be termed nanostructure transistors.

The view of FIG. 1C is an X-view of the integrated circuit 100 in which the X-axis is the horizontal axis, the Z-axis is the vertical axis, and the Y-axis extends into and out of the drawing sheet. As used herein, the term "X-view" corresponds to a cross-sectional view in which the X-axis is the horizontal dimension and the Z-axis is the vertical dimension. As used herein, the term "Y-view" corresponds to a cross-sectional view in which the Y-axis is the horizontal dimension and the Z-axis is the vertical dimension.

The integrated circuit 100 includes a substrate 101. The substrate 101 can include a semiconductor layer, a dielectric layer, or combinations of semiconductor layers and dielectric layers. Furthermore, conductive structures may be formed within the substrate 101 as backside conductive vias and interconnections, as will be described in more detail below. In some embodiments, the substrate 101 includes a single crystalline semiconductor layer on at least a surface portion. The substrate 101 may include a single crystalline semiconductor material such as, but not limited to Si, Ge, SiGe, GaAs, InSb, GaP, GaSb, InAlAs, InGaAs, GaSbP, GaAsSb and InP.

In some embodiments, the substrate 101 may include dielectric layers including one or more of silicon oxide, silicon nitride, silicon oxynitride, silicon carbonitride, silicon oxycarbonitride, fluorine-doped silicate glass (FSG), a low-K dielectric material or other dielectric materials. In some embodiments, the substrate 101 may include shallow trench isolation regions formed in a semiconductor layer. Various configurations of a substrate 101 can be utilized without departing from the scope of the present disclosure. In some embodiments, the substrate 101 is not present, for example, when removed prior to forming a backside interconnect structure.

The transistor 105 is formed above the substrate 101. The transistor 104 is formed above the transistor 105. In some embodiments, the transistor 104 is an N-type transistor and the transistor 105 is a P-type transistor. However, in some embodiments, the transistor 104 may be a P-type transistor and the transistor 105 may be an N-type transistor.

The transistor 104 includes a plurality of semiconductor nanostructures 106. The semiconductor nanostructures 106 are stacked in the vertical direction or Z-direction. In the example of FIG. 1C, there are three stacked semiconductor nanostructures 106. However, in practice, there may be only two stacked nanostructures 106 or there may be more than three stacked semiconductor nanostructures 106 without departing from the scope of the present disclosure. Furthermore, in some embodiments there may be only a single semiconductor nanostructure 106 and a single semiconductor nanostructure 107. The semiconductor nanostructures 106 correspond to channel regions of the transistor 102. The semiconductor nanostructures 106 may be nanosheets, nanowires, or other types of nanostructures.

The transistor 105 includes a plurality of semiconductor nanostructures 107. The semiconductor nanostructures 107 are stacked in the vertical direction or Z-direction. In the example of FIG. 1C, there are three stacked semiconductor nanostructures 107. However, in practice, there may be only two stacked nanostructures 107 or there may be more than three stacked nanostructures 107 without departing from the scope of the present disclosure. The semiconductor nanostructures 107 correspond to channel regions of the transistor 102. The semiconductor nanostructures 107 may be nanosheets, nanowires, or other types of nanostructures. The number of semiconductor nanostructures 107 may be the same as the number of semiconductor nanostructures 106 or may be different than the number of semiconductor nanostructures 106.

The semiconductor nanostructures 106 and 107 may include Si, SiGe, or other semiconductor materials. In a non-limiting example described herein, the semiconductor nanostructures 106 are silicon. The vertical thickness of the semiconductor nanostructures 106 can be between 2 nm and 5 nm. The semiconductor nanostructures 106 may be separated from each other in the vertical direction by 4 nm to 10 nm. Other thicknesses and materials can be utilized for the semiconductor nanostructures 106 without departing from the scope of the present disclosure. The semiconductor nanostructures 107 may have a same material and dimensions as the semiconductor nanostructures 106 or a different semiconductor material from the semiconductor nanostructures 106.

The transistors 104 and 105 include a gate dielectric. The gate dielectric includes an interfacial gate dielectric layer 108 and a high-K gate dielectric layer 110. The interfacial gate dielectric layer 108 is a low-K gate dielectric layer. The interfacial gate dielectric layer is in contact with the semiconductor nanostructures 106 and 107. The high-K gate dielectric layer 110 is in contact with the low-K gate dielectric layer. The interfacial gate dielectric layer 108 is positioned between the semiconductor nanostructures 106 and the high-K gate dielectric layer 110 and between the semiconductor nanostructures 107 and the high-K gate dielectric layer 110.

The interfacial gate dielectric layer 108 can include a dielectric material such as silicon oxide, silicon nitride, or other suitable dielectric materials. The interfacial gate dielectric layer 108 can include a comparatively low-K dielectric with respect to high-K dielectric such as hafnium oxide or other high-K dielectric materials that may be used in gate dielectrics of transistors. The interfacial gate dielectric layer 108 can include a native oxide layer that grows on surfaces of the semiconductor nanostructures 106 and 107. The interfacial gate dielectric layer 108 may have a thickness between 0.4 nm and 2 nm. Other materials, configurations, and thicknesses can be utilized for the interfacial gate dielectric layer 108 without departing from the scope of the present disclosure.

The high-K gate dielectric layer includes one or more layers of a dielectric material, such as HfO2, HfSiO, HfSiON, HfTaO, HfTIO, HfZrO, zirconium oxide, aluminum oxide, titanium oxide, hafnium dioxide-alumina (HfO2-Al2O3) alloy, other suitable high-k dielectric materials, and/or combinations thereof. The thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO2 with dipole doping including La and Mg, and a second layer including a higher-K ZrO layer with crystallization.

The transistor 104 includes a gate metal 112. The gate metal 112 surrounds the semiconductor nanostructures 106. The gate metal 112 is in contact with the high-K gate dielectric layer 110. The gate metal 112 corresponds to a gate electrode of the transistor 104. In an example in which the transistor 104 is an N-type transistor, the gate metal 112 can include a material that results in a desired work function with the semiconductor nanostructures 106. In one example, the gate metal 112 includes titanium aluminum, titanium, aluminum, tungsten, ruthenium, molybdenum, copper, gold, or other conductive materials. In some embodiments, the gate metal 112 surrounds the semiconductor nanostructures 106 on four sides, e.g., top, bottom, left and right sides. In some embodiments, such as in a forksheet transistor, the gate metal 112 may surround the semiconductor nanostructures 106 on three sides, with the gate metal 112 being substantially not present on the fourth side. For example, the gate metal 112 may be present on outer edges of the fourth side, and may occupy less than about 5% of area of the fourth side.

FIG. 1C illustrates a single gate metal 112. However, in practice, the gate electrode from the transistor 104 can include multiple metal layers. For example, the gate metal 112 can include one or more liner layers or adhesive layers such as tantalum, tantalum nitride, titanium nitride, or other materials. The gate metal 112 can include a gate fill material that fills the remaining volume between the semiconductor nanostructures 106 after the one or more liner layers have been deposited. Various materials, combinations of materials, and configurations may be utilized for the gate metal 112 without departing from the scope of the present disclosure.

The transistor 105 includes a gate metal 113. The gate metal 113 surrounds the semiconductor nanostructures 107. The gate metal 113 is in contact with the high-K gate dielectric layer 110. The gate metal 113 corresponds to a gate electrode of the transistor 105. In an example in which the transistor 105 is a P-type transistor, the gate metal 113 can include a material that results in a desired work function with the semiconductor nanostructures 107. In one example, the gate metal 113 includes titanium nitride, titanium, aluminum, tungsten, ruthenium, molybdenum, copper, gold, or other conductive materials.

FIG. 1C illustrates a single gate metal 113. However, in practice, the gate electrode from the transistor 105 can include multiple metal layers that wrap around the semiconductor nanostructures 107. For example, the gate metal 113 can include one or more liner layers or adhesive layers such as tantalum, tantalum nitride, titanium nitride, or other materials. The gate metal 113 can include a gate fill material that fills the remaining volume between the semiconductor nanostructures 107 after the one or more liner layers have been deposited. Various materials, combinations of materials, and configurations may be utilized for the gate metal 113 without departing from the scope of the present disclosure.

The transistor 104 includes source/drain regions 116. The source/drain regions 116 are in contact with each of the semiconductor nanostructures 106. Each semiconductor nanostructure 106 extends in the X-direction between the source/drain regions 116. The source/drain regions 116 include a semiconductor material. The transistor 105 includes source/drain regions 117. The source/drain regions 117 are in contact with each of the semiconductor nanostructures 107. Each semiconductor nanostructure 107 extends in the X-direction between the source/drain regions 117. The source/drain regions 117 include a semiconductor material.

In an example in which the transistor 104 is an N-type transistor and the transistor 105 is a P-type transistor, the source/drain regions 116 can be doped with N-type dopant species. The N-type dopant species can include P, As, or other N-type dopant species. The source/drain regions 117 can be doped with P-type dopant species in the case of a P-type transistor. The P-type dopant species can include B or other P-type dopant species. The doping can be performed in-situ during an epitaxial growth process of the source/drain regions 117. The source/drain regions 116 and 117 can include other materials and structures without departing from the scope of the present disclosure.

As used herein, the term "source/drain region" may refer to a source region or a drain region individually or collectively dependent upon the context. Accordingly, one of the source/drain regions 116 may be a source region while the other source/drain region 116 is a drain region, or vice versa. Furthermore, in some cases, one or both of the source/drain regions 116 may be shared with one or more laterally adjacent transistors.

The transistors 104 and 105 each include inner spacers 114. The inner spacers 114 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. In one example, the inner spacers 114 include silicon oxycarbonitride.

The inner spacers 114 of the transistor 104 physically separate the gate metal 112 from the source/drain regions 116. This prevents short circuits between the gate metal 112 and the source/drain regions 116. The inner spacers 114 of the transistor 105 physically separate the gate metal 113 from the source/drain regions 117. This prevents short circuits between the gate metal 113 and the source/drain regions 117.

The transistor 104 may include source/drain contacts 118. Each source/drain contact 118 is positioned over and is electrically connected to a respective source/drain region 116. Electrical signals may be applied to the source/drain regions 116 via the source/drain contacts. The source/drain contacts 118 may include silicide 120. The silicide 120 is formed at the top of the source/drain regions 116. The silicide 120 can include titanium silicide, aluminum silicide, nickel silicide, tungsten silicide, or other suitable silicides.

The source/drain contacts 118 may also include a conductive layer 122 positioned on the silicide 120. The conductive layer can include titanium nitride, tantalum nitride, titanium, tantalum, or other suitable conductive materials. The source/drain contacts 118 may also include a conductive layer 124 on the conductive layer 122. The conductive layer 124 can include a conductive material such as tungsten, cobalt, ruthenium, titanium, aluminum, tantalum, or other suitable conductive materials. Other materials and configurations can be utilized for the source/drain contacts 118 without departing from the scope of the present disclosure.

The transistor 105 may include source/drain contacts 119. Each source/drain contact 119 is positioned below and is electrically connected to a respective source/drain region 117. Electrical signals may be applied to the source/drain regions 117 via the source/drain contacts. The source/drain contacts 119 may include silicide 121. The silicide 121 is formed at the bottom of the source/drain regions 117. The silicide 121 can include titanium silicide, aluminum silicide, nickel silicide, tungsten silicide, or other suitable silicides.

The source/drain contacts 119 may also include a conductive layer 123 positioned on the silicide 121. The conductive layer can include titanium nitride, tantalum nitride, titanium, tantalum, or other suitable conductive materials. The source/drain contacts 119 may also include a conductive layer 125 on the conductive layer 123. The conductive layer 125 can include a conductive material such as tungsten, cobalt, ruthenium, titanium, aluminum, tantalum, or other suitable conductive materials. Other materials and configurations can be utilized for the source/drain contacts 119 without departing from the scope of the present disclosure.

The transistor 102 includes sidewall spacers 131. The sidewall spacers 131 are positioned adjacent to the uppermost portion of the gate metal 112 and electrically isolate the gate metal 112 from the source/drain contacts 118. The sidewall spacers 131 may include one or more of silicon oxide, silicon nitride, silicon oxynitride, silicon carbonitride, silicon oxycarbonitride, fluorine-doped silicate glass (FSG), a low-K dielectric material or other dielectric materials. Other thicknesses and materials can be utilized for the sidewall spacers 131 without departing from the scope of the present disclosure.

The transistor 102 may include a gate cap metal 132 positioned on an uppermost portion of the gate metal 112. In some embodiments, the gate cap metal 132 includes tungsten, fluorine free tungsten, or other suitable conductive materials. The gate cap metal 132 may have a height between 1 nm and 10 nm. Other configurations, materials, and thicknesses can be utilized for the gate cap metal 132 without departing from the scope of the present disclosure.

The substrate 101 may include a dielectric layer 136 and a dielectric layer 138. The dielectric layer 138 may be positioned in contact with sidewalls of the source/drain contacts 119 and a lowermost portion of the interfacial gate dielectric layer 108 of the transistor 105. The dielectric layer 138 may include silicon oxide, silicon nitride, silicon oxynitride, silicon carbonitride, silicon oxycarbonitride, fluorine-doped silicate glass (FSG), a low-K dielectric material or other dielectric materials. The dielectric layer 136 is positioned in contact with the dielectric layer 138. The dielectric layer 136 may include silicon oxide, silicon nitride, silicon oxynitride, silicon carbonitride, silicon oxycarbonitride, fluorine-doped silicate glass (FSG), a low-K dielectric material or other dielectric materials.

The transistor 102 can be operated by applying voltages to the source/drain regions 116/117 and the gate metals 112/113. The voltages can be applied to the source/drain regions 116/117 via the source/drain contacts 118/119. The voltages can be applied to the gate metals 112/113 via a gate contact not shown in FIG. 1C. Though not apparent in the view of FIG. 1C, the gate metal 112 and the gate metal 113 are shorted together. Accordingly, the gate metal 112 and the gate metal 113 jointly correspond to the gate electrode of the CFET 102. The voltage applied to the gate metals 112/113 may turn on the transistor 104 and turn off the transistor 105 or may turn on the transistor 105 and turn off the transistor 104. While the gate metals 112/113 are shorted together, the source/drain regions 116 are not shorted together with the source/drain regions 117. Depending on a particular electrical circuit configuration, the flow of current can be selectively enabled or prohibited through the source/drain regions 116 and 117 individually.

As described previously, it may be beneficial to obtain desired work functions for the transistors 104 and 105 by utilizing different materials for the gate metals 112 and 113. One possible way of forming the gate metals 112/113 is to first deposit the gate metal 113 around all of the semiconductor nanostructures 106 and 107 and then to perform a timed etch to remove the gate metal 113 from around the semiconductor nanostructures 106. This is followed by depositing the gate metal 112 around the semiconductor nanostructures 106 after the timed etch of the gate metal 113. However, one drawback of this process is that in some cases the gate metal 113 may not be entirely removed directly below the lowest semiconductor nanostructure 106. This can interfere with the work function of the transistor 104, thereby affecting the threshold voltage of the transistor 104 in an undesired manner.

The CFET 102 avoids or reduces the possibility of work function interference by utilizing an isolation structure 126 between the semiconductor nanostructures 106 and the semiconductor nanostructures 107. More particularly, the isolation structure 126 is positioned directly between the lowest semiconductor nanostructure 106 and the highest semiconductor nanostructure 107. The isolation structure 126 may include upper and lower semiconductor layers 127 and a dielectric layer 129 between the upper and lower semiconductor layers 127. Various structures and compositions can be utilized for the isolation structure 126 without departing from the scope of the present disclosure.

The dielectric layer 129 may include silicon oxide, silicon nitride, silicon oxynitride, silicon carbonitride, silicon oxycarbonitride, fluorine-doped silicate glass (FSG), a low-K dielectric material or other dielectric materials. The dielectric layer 129 may have a length in the X direction between 15 nm and 30 nm. A length in this range may be sufficient to match or exceed the length of the semiconductor nanostructures 106 and 107 in the X direction. However, depending on the length of the semiconductor nanostructures 106 and 107, a greater or lower length of the dielectric layer 129 may be selected. The dielectric layer 129 may have a height in the Z direction between 5 nm and 25 nm. These dimensions may be sufficient to ensure that there is no possibility of work function interference from the gate metal 113 with the semiconductor nanostructures 106. Furthermore, these dimensions may provide reduced gate to drain capacitance. Other materials, dimensions, and configurations can be utilized for the dielectric layer 129 without departing from the scope of the present disclosure. The dielectric layer 129 may be termed a dielectric nanostructure. The dielectric nanostructure can include a dielectric nanosheet, the dielectric nanowires, or another type of dielectric nanostructure.

The dielectric layer 129 has a top surface 135 and a bottom surface 137. The gate metals 112 and 113 meet at an interface 139. In some embodiments, the interface 139 between the gate metals 112 and 113 is lower than a top surface 135 of the dielectric layer 129. In some embodiments, the interface 139 is lower than a top surface 135 and higher than a bottom surface 137 of the dielectric layer 139. This can help to ensure that there is not work function interference of the transistor 104 by the gate metal 113.

Each semiconductor layer 127 may have a vertical thickness between 1 nm and 5 nm. The semiconductor layers 127 may include silicon or another suitable semiconductor material. Other materials and dimensions may be utilized for the semiconductor layers 127 without departing from the scope of the present disclosure.

Although FIG. 1C illustrates a single dielectric layer 129, in practice, the dielectric layer 129 may include multiple layers of different dielectric material between the semiconductor layers 127. For example, a first dielectric layer of silicon oxide may be positioned in contact with each of the semiconductor layers 127. A second dielectric layer of silicon nitride may be positioned between upper and lower portions of the first dielectric layer. Various configurations for a dielectric barrier between the top semiconductor nanostructure 107 and the bottom semiconductor nanostructure 106 may be utilized without departing from the scope of the present disclosure.

FIG. 1D is a Y-view of the integrated circuit 100 of FIG. 1C taken along cut lines C-C of FIG. 1C. Accordingly, in the view of FIG. 1D, the Y-axis is the horizontal axis, while the X-axis extends into and out of the drawing sheet. The view of FIG. 1D is a wide cut through the gate metals 112 and 113 of the transistors 104 and 105. FIG. 1D illustrates how the gate metal 112 wraps around each of the semiconductor nanostructures 106 of the transistor 104. Correspondingly, the gate metal 113 wraps around each of the semiconductor nanostructures 107 of the transistor 105.

FIG. 1D illustrates that a gate contact 240 extends into the dielectric layer 134. The gate contact 240 contacts the gate cap metal 132. Accordingly, the gate contact 240 is electrically connected to the gate metals 112 and 113 of the transistors 104 and 105. The gate contact 240 can include tungsten, titanium, tantalum, aluminum, copper, tantalum nitride, titanium nitride, or other suitable conductive materials. Various configurations and materials can be utilized for the gate contact 240 without departing from the scope of the present disclosure.

FIG. 1D also illustrates the isolation structure 126 positioned between the lowest semiconductor nanostructure 106 and the highest semiconductor nanostructure 107. The isolation structure 126 includes the dielectric layer 129 and the semiconductor layers 127 above and below the dielectric layer 129. FIG. 1D also illustrates that the interfacial gate dielectric layer 108 is present on the outer surfaces of the semiconductor layers 127. The high-K gate dielectric layer 110 surrounds the isolation structure 126 in the Y-Z plane.

In some embodiments, the width of the isolation structure 126 in the Y direction is substantially equal to or slightly greater than the width of the semiconductor nanostructures 106/107 in the Y direction. The isolation structure 126 is thicker than the semiconductor nanostructures 106/107 in the Z direction. Furthermore, the isolation structure 126 is thicker in the Z direction than the portion of the gate metal 113 between the top semiconductor nanostructure 107 and the isolation structure 126. This is because the sacrificial semiconductor layer 154 (see FIG. 2A) is thicker than the sacrificial semiconductor layers 152. The gate metals 112/113 are formed in place of the sacrificial semiconductor nanostructures 152.

In some embodiments, a junction or interface of the gate metals 112/113 occurs at a vertical height corresponding to a vertical midway level of the isolation structure 126. The junction or interface of the gate metals 112/113 may occur at any vertical level between the semiconductor layers 127. Other configurations of the gate metals 112/113 and the isolation structure 126 can be utilized without departing from the scope of the present disclosure.

FIG. 1E is a cross-sectional view of the integrated circuit 100 of FIG. 1C taken along cut lines E-E of FIG. 1C.

Accordingly, in the view of FIG. 1E, the Y-axis is the horizontal axis, while the x-axis extends into and out of the drawing sheet. The view of FIG. 1E is a wide cut through the source/drain regions 116 and 117 from one side of the CFET 102.

FIG. 1E illustrates that the dielectric layer 130 surrounds the source/drain regions 116 and 117 in the Y-Z plane, aside from where the source/drain contacts 118/119 are connected to the source/drain regions 116/117. FIG. 1E also illustrates the interlevel dielectric layer 128 surrounds the outer surfaces of the dielectric layer 130 and fills the space between the source/drain region 116 and the source/drain region 117. FIG. 1E also illustrates a conductive via 142 electrically connected to the source/drain contact 118 of the transistor 104. The conductive via 142 may include tungsten, titanium, aluminum, copper, titanium nitride, tantalum nitride, or other suitable conductive layers. Though not shown in FIG. 1E, a conductive via may also extend through the substrate 101 to contact the bottom of the source/drain contact 119 in order to provide electrical connection to the source/drain regions 117.

Figure 1F:
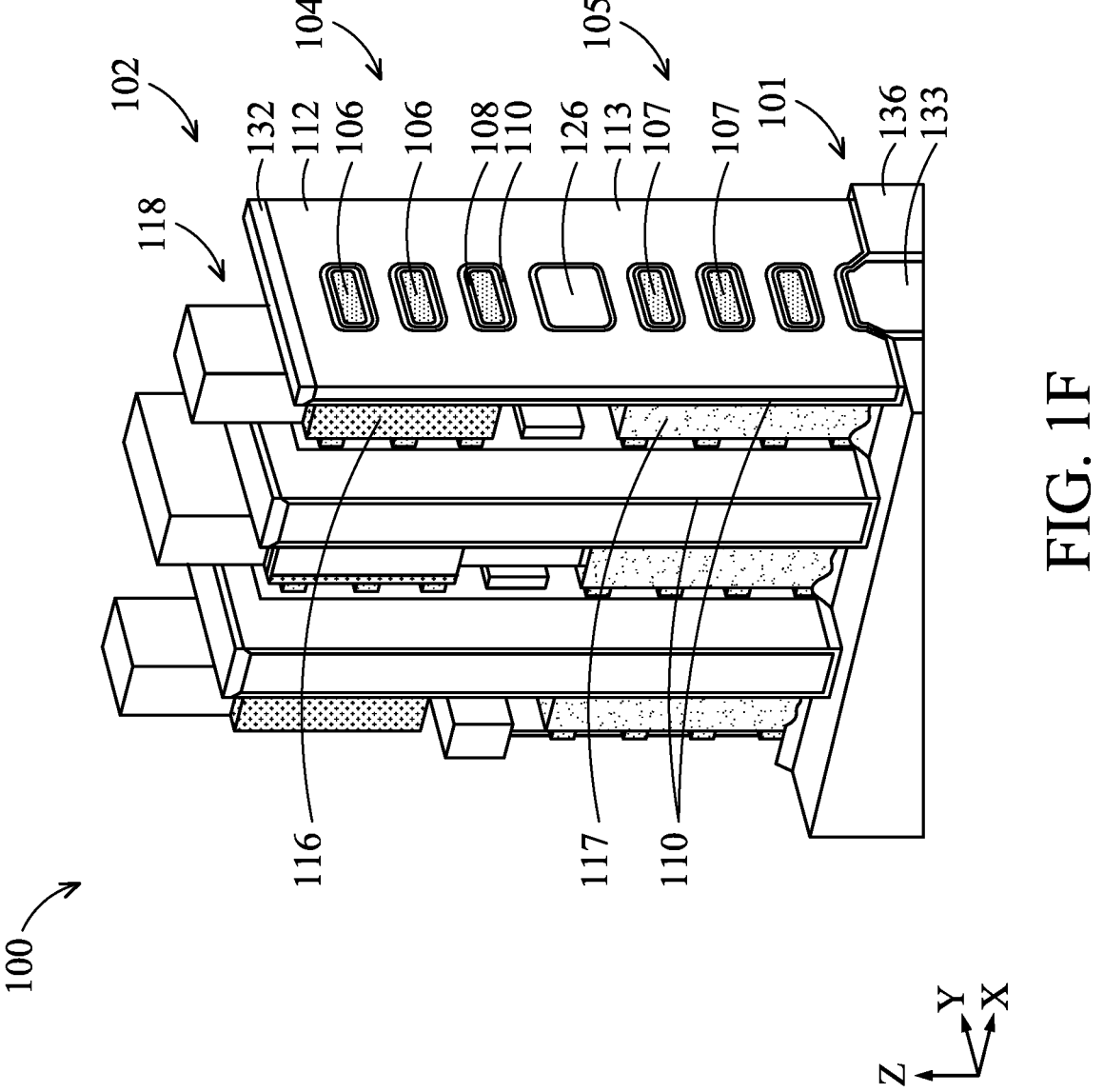

FIG. 1F is a perspective view of the integrated circuit 100 of FIG. 1C, in accordance with some embodiments. FIG. 1F does not illustrate the interlevel dielectric layer 128 or the dielectric layer 130 so that the position of the source/drain regions 116 and 117 is apparent. FIG. 1F illustrates the semiconductor nanostructures 106 and 107, the interfacial gate dielectric layer 108 and the high-K gate dielectric layer 110 surrounding the semiconductor nanostructures 106 and 107, the gate metal 112 surrounding the semiconductor nanostructures 106, and the gate metal 113 surrounding the semiconductor nanostructures 107. The isolation structure 126 is present between the lowest semiconductor nanostructure 106 and the highest semiconductor nanostructure 107. The gate cap metal 132 is visible on top of the gate metal 112. The source/drain contact 118 is coupled to the source/drain region 116. FIG. 1F also illustrates that the high-K dielectric layer 110 is also present on sidewalls of the gate metals 112 and 113 and that the bottom of the gate metal 113. The substrate 101, may also include a semiconductor layer 133, although at this point in processing the semiconductor layer 133 may also be entirely removed after forming backside conductive structures. Various other configurations of the integrated circuit 100 can be utilized without departing from the scope of the present disclosure.

FIGS. 2A-2M are cross-sectional views of an integrated circuit 100 at various stages of processing, in accordance with some embodiments. FIGS. 2A-2M illustrate a process for forming a CFET 102, in accordance with some embodiments.

Figure 2B:
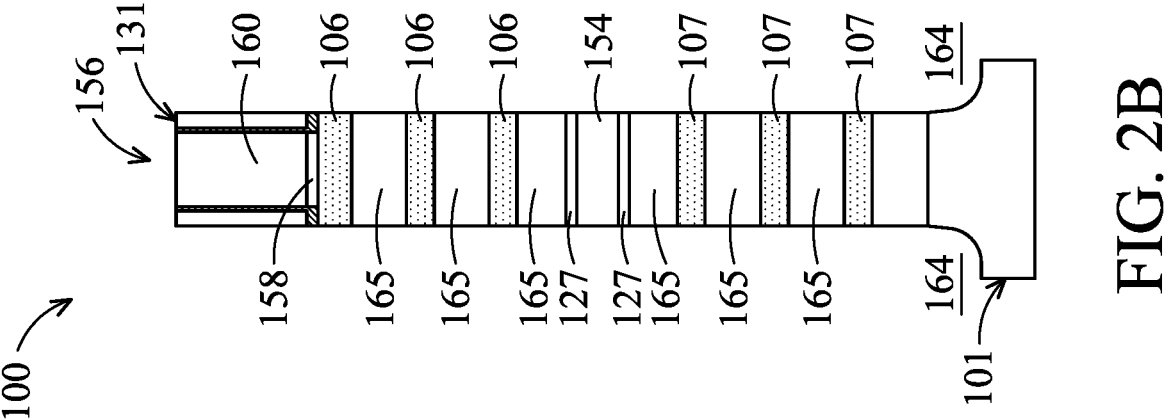
FIGS. 2A-2M are cross-sectional views of an integrated circuit at various stages of processing, in accordance with some embodiments.
Figure 2A:
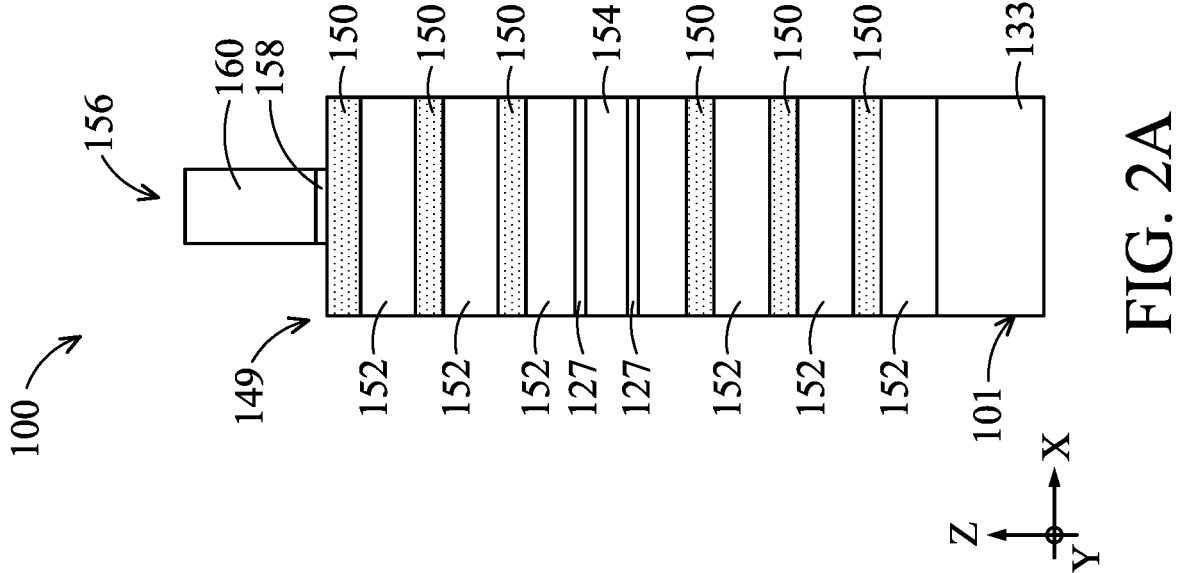

FIG. 2A is a cross-sectional X-view of an integrated circuit 100, in accordance with some embodiments. In FIG. 2A, a semiconductor fin 149 includes a plurality of semiconductor layers 150, a plurality of sacrificial semiconductor layers 152 stacked on the substrate 101, semiconductor layers 127, and a special sacrificial semiconductor layer 154. The sacrificial semiconductor layers 152 are positioned between the semiconductor layers 150. As will be described in more detail below, the semiconductor layers 150 will eventually be patterned to form the semiconductor nanostructures 106/107 that corresponds to the channel regions of the complementary transistors 104/105 that collectively make up the CFET 102. Accordingly, the semiconductor layers 150 can have materials and vertical thicknesses described in relation to the semiconductor nanostructures 106/107 of FIGS. 1A and 1B. The semiconductor fin 149 may be termed a hybrid nanostructure, or may be patterned to form a hybrid nanostructure as will be described in more detail below.

The sacrificial semiconductor layers 152 includes a semiconductor material different than the semiconductor material of the semiconductor layers 150. In particular, the sacrificial semiconductor layers 152 include materials that are selectively etchable with respect to the material of the semiconductor layers 150. As will be described in further detail below, the sacrificial semiconductor layers 152 will eventually be patterned to form sacrificial semiconductor nanostructures. The sacrificial semiconductor nanostructures will eventually be replaced by gate metals positioned between the semiconductor nanostructures 106. In one example, the sacrificial semiconductor layers 152 can include a single crystalline semiconductor material such as, but not limited to Si, Ge, SiGe, GaAs, InSb, GaP, GaSb, InAlAs, InGaAs, GaSbP, GaAsSb and InP. In an example process described herein, the sacrificial semiconductor layers 152 include SiGe, while the semiconductor layers 150 include Si. Other materials and configurations can be utilized for the sacrificial semiconductor layers 152 and the semiconductor layers 150 without departing from the scope of the present disclosure.

In some embodiments, each semiconductor layer 150 includes intrinsic silicon and each sacrificial semiconductor layer 152 includes silicon germanium. The sacrificial semiconductor layers may have a relatively low germanium concentration of between 10% and 35%. A concentration in this range can provide sacrificial semiconductor layers 152 that are selectively etchable with respect to the semiconductor layers 150. In some embodiments, the semiconductor layers 150 have a thickness between 2 nm and 5 nm. In some embodiments, the sacrificial semiconductor layers 152 have a thickness between 4 nm and 10 nm. Other materials, concentrations, and thicknesses can be utilized for the semiconductor layers 150 and the sacrificial semiconductor layers 152 without departing from the scope of the present disclosure.

In some embodiments, the semiconductor fin 149 is formed by performing a series of epitaxial growth processes. A first epitaxial growth process grows the lowest sacrificial semiconductor layer 152 on the substrate 101. A second epitaxial growth process grows the lowest semiconductor layer 150 on the lowest sacrificial semiconductor layer 152. Alternating epitaxial growth processes are performed to form the four lowest sacrificial semiconductor layers 152 and the three lowest semiconductor layers 150. Depending on the number of semiconductor nanostructures desired for the lower transistor 105 of the CFET 102, more or fewer sacrificial semiconductor layers 152 and semiconductor layers 150 can be formed.

After the semiconductor layers 150 and sacrificial semiconductor layers 152 associated with the lower transistor 105 have been formed, layers associated with the isolation structure 126 will be formed. In particular, an epitaxial growth process is performed to form the lower semiconductor layer 127. In one example, the lower semiconductor layer 127 is intrinsic silicon having a thickness between 1 nm and 3 nm. After the lower semiconductor layer 127 is formed, another epitaxial growth process is performed to form a special sacrificial semiconductor layer 154. The sacrificial semiconductor layer 154 has a composition that is selectively etchable with respect to the semiconductor layers 150 and the sacrificial semiconductor layers 152. In an example in which the sacrificial semiconductor layers 152 are silicon germanium with a relatively low concentration of germanium, the sacrificial semiconductor layer 154 can include silicon germanium with a relatively high concentration of germanium. In some embodiments, the concentration of germanium in the sacrificial semiconductor layer 154 is greater than 50%.

In some embodiments, the concentration of germanium in the sacrificial semiconductor layer 154 is at least an additional 25% above the concentration of germanium in the sacrificial semiconductor layers 152. For example, if the sacrificial semiconductor layers 152 have a germanium concentration of 35%, then the sacrificial semiconductor layer 154 will have a germanium concentration greater than or equal to 60%. In some embodiments, the concentration of germanium in the sacrificial semiconductor layer 154 is greater than the concentration of germanium in the sacrificial semiconductor layers 152 by a factor of 2-5. In some embodiments, the germanium concentration of the sacrificial semiconductor layer 154 is less than or equal to 80%. The sacrificial semiconductor layers 154 may have a thickness between 5 nm and 25 nm and a length between 15 nm and 30 nm. The thickness of the sacrificial semiconductor layer 154 is greater than the thickness of the sacrificial semiconductor layers 152. The thickness of the sacrificial semiconductor layers 152 is greater than the thickness of the semiconductor layer 150. Other compositions, materials, and thicknesses can be utilized for the sacrificial semiconductor layer 154 without departing from the scope of the present disclosure.

After formation of the sacrificial semiconductor layer 154, an epitaxial growth process is performed to form the upper semiconductor layer 127 on the sacrificial semiconductor layer 154. The upper semiconductor layer 127 may have a composition thickness substantially identical to the composition in thickness of the lower semiconductor layer 127.

After formation of the sacrificial semiconductor layer 154 and the upper semiconductor layer 127, the upper sacrificial semiconductor layers 152 and semiconductor layers 150 associated with the upper transistor 104 are formed. The upper sacrificial semiconductor layers 152 and semiconductor layers 150 can be formed with alternating epitaxial growth processes as described in relation to the lower semiconductor layers 150 and sacrificial semiconductor layers 152.

A dummy gate structure 156 has been formed on top of the highest semiconductor layer 150. The dummy gate structure 156 may correspond to a fin extending in the Y direction. The dummy gate structure 156 is referred to as a dummy gate structure or "sacrificial gate structure" because the gate electrodes of the transistor 102 will be formed, in part, in place of the dummy gate structure 156.

The dummy gate structure 156 includes a dielectric layer 158. The dielectric layer 158 can include a thin layer of silicon oxide grown on the top semiconductor layer 150 via chemical vapor deposition (CVD), physical vapor deposition (PVD), or atomic layer deposition (ALD). The dielectric layer 158 may have a thickness between 0.2 nm and 2 nm. Other thicknesses materials, and deposition processes can be utilized for the dielectric layer 158 without departing from the scope of the present disclosure.

The dummy gate structure 156 includes a layer of polysilicon 160. The layer of polysilicon 160 can have a thickness between 20 nm and 100 nm. The layer of polysilicon 160 can be deposited by an epitaxial growth, a CVD process, a physical vapor deposition (PVD) process, or an ALD process. Other thicknesses and deposition processes can be used for depositing the layer of polysilicon 160 without departing from the scope of the present disclosure.

The dummy gate structure 156 may also include one or more additional dielectric layers above the layer of polysilicon 160. Various configurations and materials can be utilized for the dummy gate structure 156 without departing from the scope of the present disclosure.

FIG. 2B is an X-view of the integrated circuit 100, in accordance with some embodiments. In FIG. 2B, a sidewall spacer 131 has been formed on sidewalls of the dummy gate structure 156. The sidewall spacer 131 may include multiple dielectric layers. Each of the dielectric layers of the sidewall spacer 131 may include silicon oxide, silicon nitride, silicon oxynitride, silicon carbonitride, silicon oxycarbonitride, fluorine-doped silicate glass (FSG), a low-K dielectric material or other dielectric materials. The dielectric layers of the sidewall spacer 131 can be deposited by CVD, PVD, ALD, or other suitable processes.

Figure 2D:
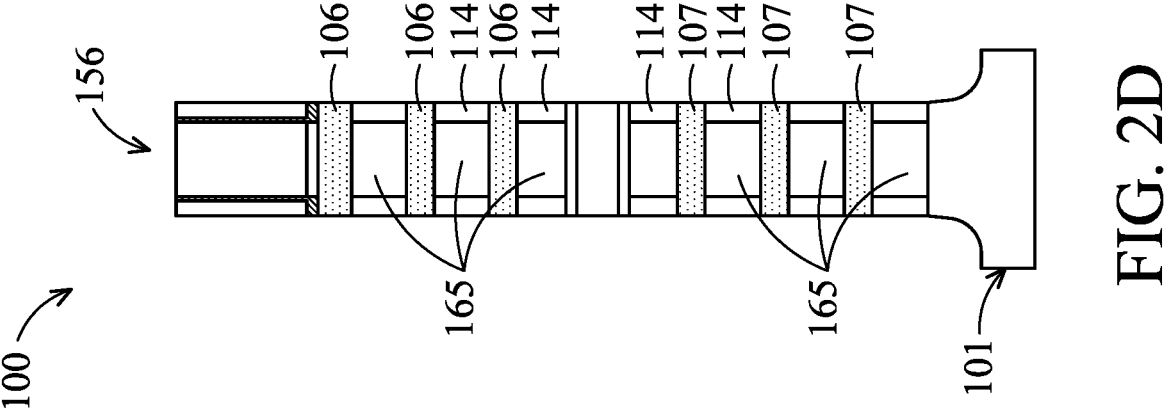
Figure 2C:
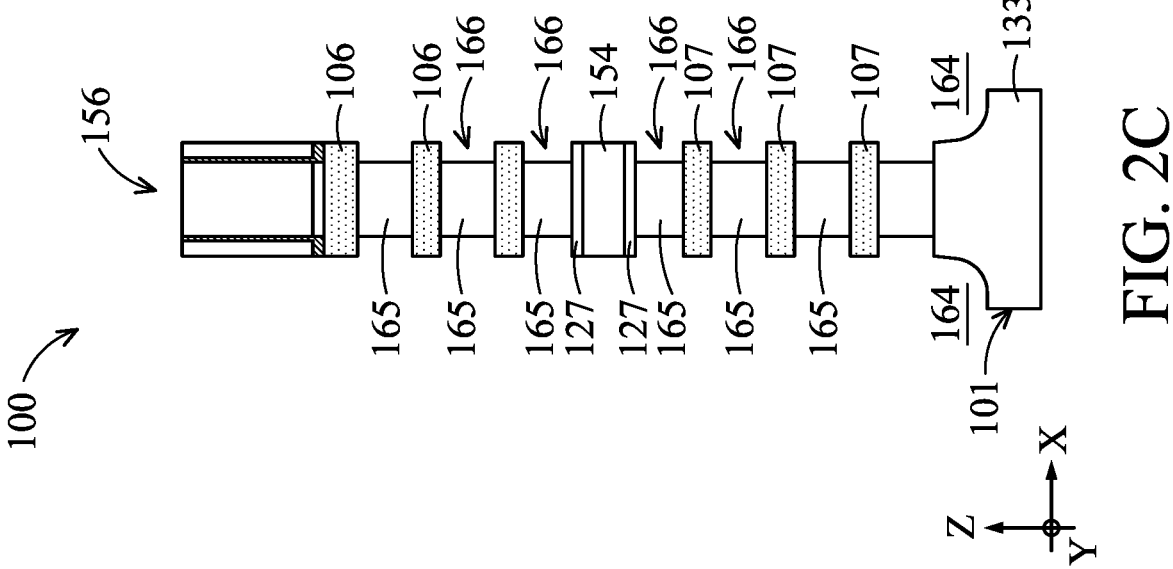

FIG. 2C is an X-view of the integrated circuit 100, in accordance with some embodiments. In FIG. 2C, source/drain trenches 164 have been formed through the semiconductor fins 149. The source/drain trenches 164 correspond to locations at which source/drain regions 116 and 117 will be formed. The etching process to form the source/drain trenches 164 etches the semiconductor layers 150, the sacrificial semiconductor layers 152, the semiconductor layers 127, and the sacrificial semiconductor layer 154 to form semiconductor nanostructures 106 and 107 from the semiconductor layers 150. More particularly, the etching process forms stacks of semiconductor nanostructures 106 and 107. The semiconductor nanostructures 106 correspond to the channel regions of the transistor 104. The semiconductor nanostructures 107 correspond to the channel regions of the transistor 105. The etching process also forms sacrificial semiconductor nanostructures 165 from the sacrificial semiconductor layers 152. The sacrificial semiconductor nanostructures 165 are positioned between the semiconductor nanostructures 106 and between the semiconductor nanostructures 107. The source/drain trenches 164 extend into the substrate 101.

The etching process can include one or more anisotropic etching processes that selectively etch the materials of the semiconductor layers 150 and sacrificial semiconductor layers 152 in the vertical direction. The etching process may include a single step or multiple steps. The etching process may include one or more timed etches. Other types of etching processes can be utilized without departing from the scope of the present disclosure.

In FIG. 2C, a recess step has been performed to recess the sacrificial semiconductor nanostructures 165. The recessing process removes outer portions of the sacrificial semiconductor nanostructures 165 without entirely removing the sacrificial semiconductor nanostructures 165. The recessing process can be performed with an isotropic etch that selectively etches the material of the sacrificial semiconductor nanostructures 165 with respect to the materials of the semiconductor nanostructures 106/107, the sacrificial semiconductor layer 154, and the substrate 102. The isotropic etching process can include a timed etching process. The duration of the etching process is selected to remove only a portion of the sacrificial semiconductor nanostructures 165 without entirely removing the sacrificial semiconductor nanostructures 165. The result of the etching process is that recesses 166 are formed in the sacrificial semiconductor nanostructures 165.

The etching process can include a dry etch with a gas that is a mixture of $SF_6$, $H_2$, and $CF_4$. The etching process may etch the sacrificial semiconductor nanostructures 165 at a rate that is greater than 10 times the rate at which the sacrificial semiconductor layer 154 is etched. Other etchants and etching processes can be utilized without departing from the scope of the present disclosure.

FIG. 2D is an X view of the integrated circuit 100, in accordance with some embodiments. In FIG. 2D, inner spacers 114 have been formed in the recesses 166. The inner spacers 114 can be formed by depositing a dielectric layer on the exposed sidewalls of the semiconductor nanostructures 106/107, on the bottom of the source/drain trenches 164, and in the recesses 166 formed in the sacrificial semiconductor nanostructures 165. The dielectric layer can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. The dielectric layer can be formed by CVD, PVD, ALD, or via another process. The lateral thickness of the dielectric layer may be between 2 nm and 10 nm. Other thicknesses, materials, and deposition processes can be utilized for the dielectric layer without departing from the scope of the present disclosure.

An etching process is then performed to remove excess portions of the dielectric layer. The etching process can include an isotropic etching process that etches in all directions. The isotropic etching process is timed so that the dielectric layer is removed at all locations except the locations of increased lateral thickness resulting from the recesses 166 in the sacrificial semiconductor nanostructures 165. The result is that the inner spacers 114 remain at the recesses 166 in the sacrificial semiconductor nanostructures 165. Other processes can be utilized to form the inner spacers 114 without departing from the scope of the present disclosure.

Figure 2F:
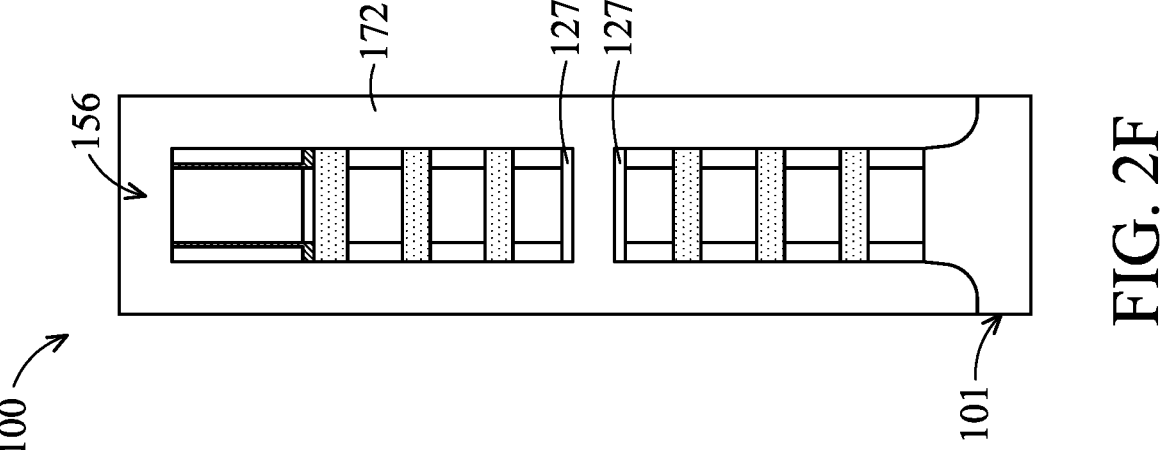
Figure 2E:
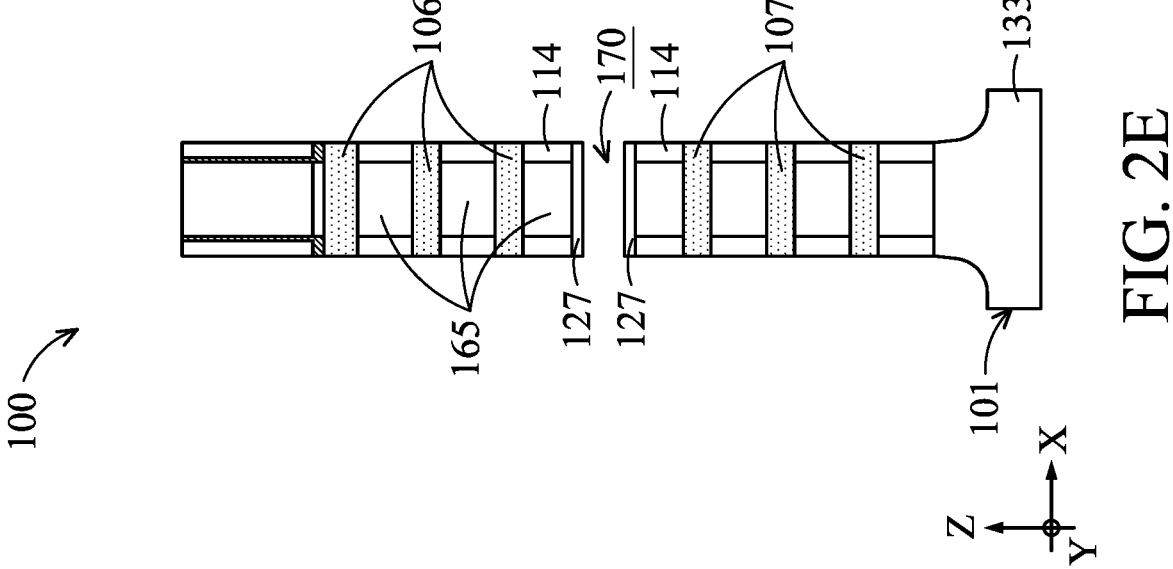

FIG. 2E is an X view of the integrated circuit 100, in accordance with some embodiments. In FIG. 2E, an etching process has been performed to remove the sacrificial semiconductor layer 154 from between the semiconductor layers 127. The etching process can include an isotropic etch that selectively etches the sacrificial semiconductor layer 154 with respect to the semiconductor nanostructures 106/107, the substrate 101, and the sacrificial semiconductor layers 165. Because the sacrificial semiconductor layer 154 has a significantly different concentration of germanium with respect to the sacrificial semiconductor nanostructures 165, the sacrificial semiconductor layer 154 can be etched selectively with respect to the sacrificial semiconductor nanostructures 165 and the semiconductor nanostructures 106/107. In some embodiments, the etching process can include a dry etch process using an etchant of $CF_4$ or HBr gas that etches the sacrificial semiconductor layer 154 at a rate that is higher than 10 times the etching rate of the semiconductor nanostructures 106/107 and the semiconductor layers 127. Other etching processes can be utilized without departing from the scope of the present disclosure.

The result of the etching process in FIG. 2E is that a void 170 is formed between the semiconductor layers 127. As will be described in more detail below, a dielectric layer 129 will be formed in place of the void 170.

FIG. 2F is an X view of the integrated circuit 100, in accordance with some embodiments. In FIG. 2F, a dielectric layer 172 has been deposited. The dielectric layer 172 is deposited in the void 170 between the semiconductor layers 127, and the source/drain trenches 164, and on the dummy gate structure 156. The dielectric layer 172 can include silicon oxide, silicon nitride, silicon oxynitride, silicon car-bonitride, silicon oxycarbonitride, fluorine-doped silicate glass (FSG), a low-K dielectric material or other dielectric materials without departing from the scope of the present disclosure. The dielectric layer 172 can be deposited using CVD, ALD, or PVD. Other materials and deposition processes can be used for the dielectric layer 172 without departing from the scope of the present disclosure.

Figure 2H:
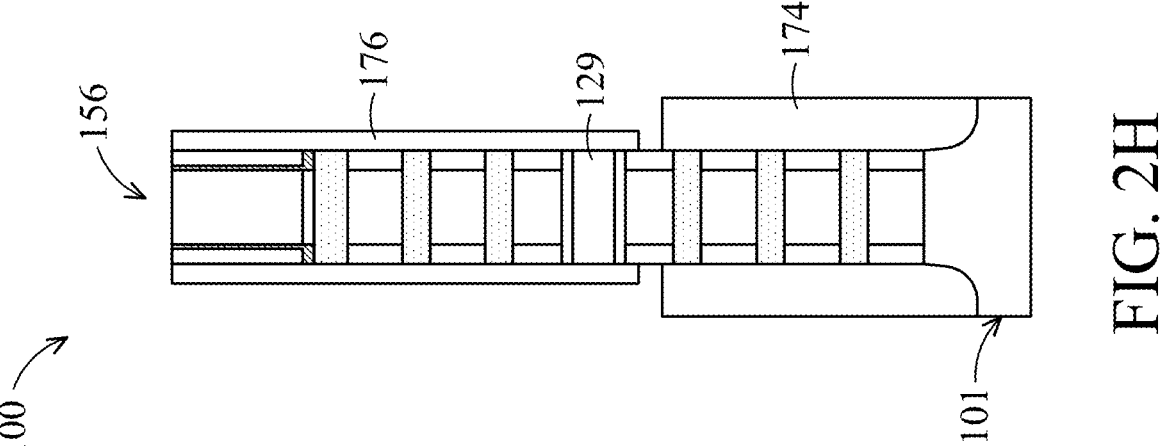
Figure 2G:
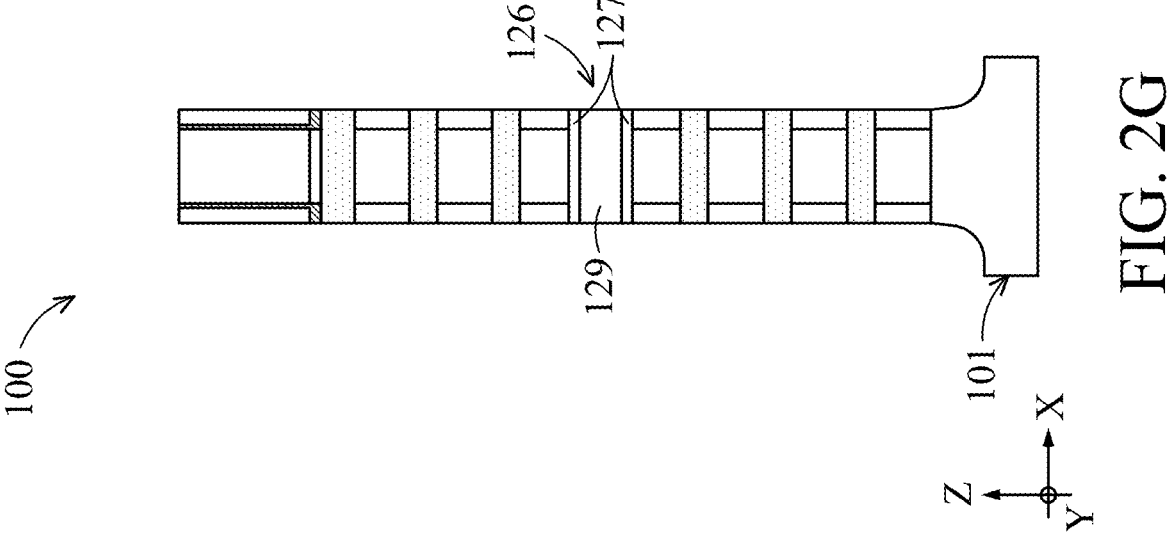

FIG. 2G is an X view of the integrated circuit 100, in accordance with some embodiments. In FIG. 2G, the dielectric layer 129 has been formed between the semiconductor layers 127. The dielectric layer 129 is formed by performing an etching process on the dielectric layer 172. The etching process can include an anisotropic etch that etches selectively in the downward direction. This etching process removes the dielectric layer 172 from all locations except between the semiconductor layers 127. Accordingly, the dielectric layer 129 is a remnant of the dielectric layer 172. The dielectric layer 129 and the semiconductor layers 127 may collectively correspond to a hybrid nanosheet that will help provide improved gate metal characteristics, as will be described in more detail below.

While FIG. 2G illustrates the dielectric layer 129 having substantially vertical sidewalls, in practice, the dielectric layer 129 may include concave sidewalls. This can be result of the anisotropic etching process. This may occur because an isotropic etching processes may not be perfectly aniso-tropic. For example, an anisotropic etching process may etch in the downward direction at a rate between 10 and 100 times greater than in lateral directions. Though compara-tively small, some etching in the lateral direction occurs, thereby generating concave recesses in the dielectric layer 129. The dielectric layer 129 can have various other con-figurations without departing from the scope of the present disclosure.

FIG. 2H is an X view of the integrated circuit 100, in accordance with some embodiments. In FIG. 2H, a layer of polymer material 174 has been deposited in the source/drain trenches 164. Alternatively, the polymer material 174 may be replaced by a non-polymer, dielectric material. After deposition of the polymer material 174, an etch-back pro-cess is performed to reduce the height of the polymer material 174 to a level below the lower semiconductor layer 127.

In FIG. 2H, a dielectric layer 176 has been deposited on the polymer material 174, and on sidewalls of the dielectric layer 129, the inner spacers 114, the nanostructures 106, and the sidewall spacers 131. In some embodiments, the dielec-tric layer 176 includes $Al_2O_3$. The dielectric layer 176 can be deposited by CVD, PVD, or ALD. Other materials and processes can be utilized for the dielectric layer 176 without departing from the scope of the present disclosure. After deposition of the dielectric layer 176, an anisotropic etching process is performed to remove the dielectric layer 176 from horizontal surfaces of the polymer material 174 and the dummy gate structure 156.

Figure 2J:
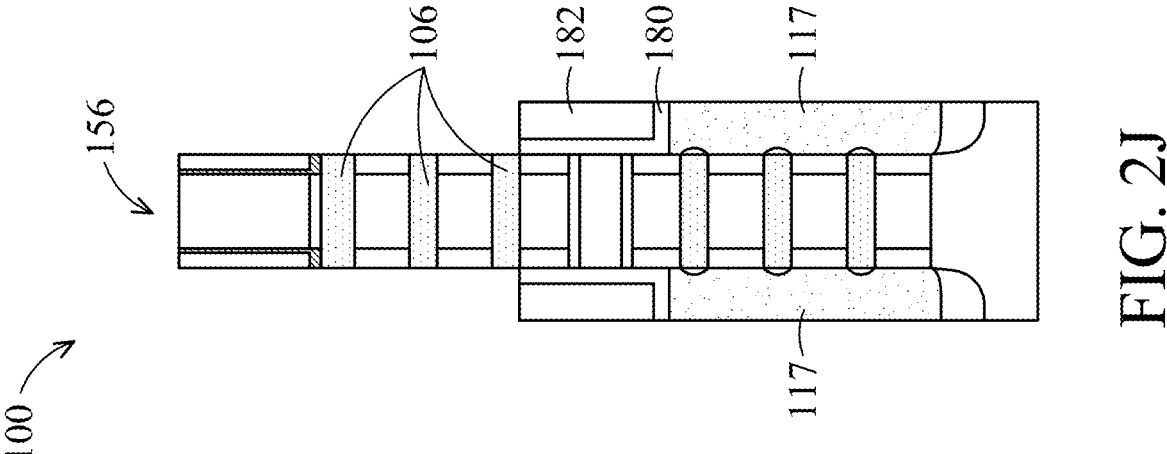
Figure 2I:
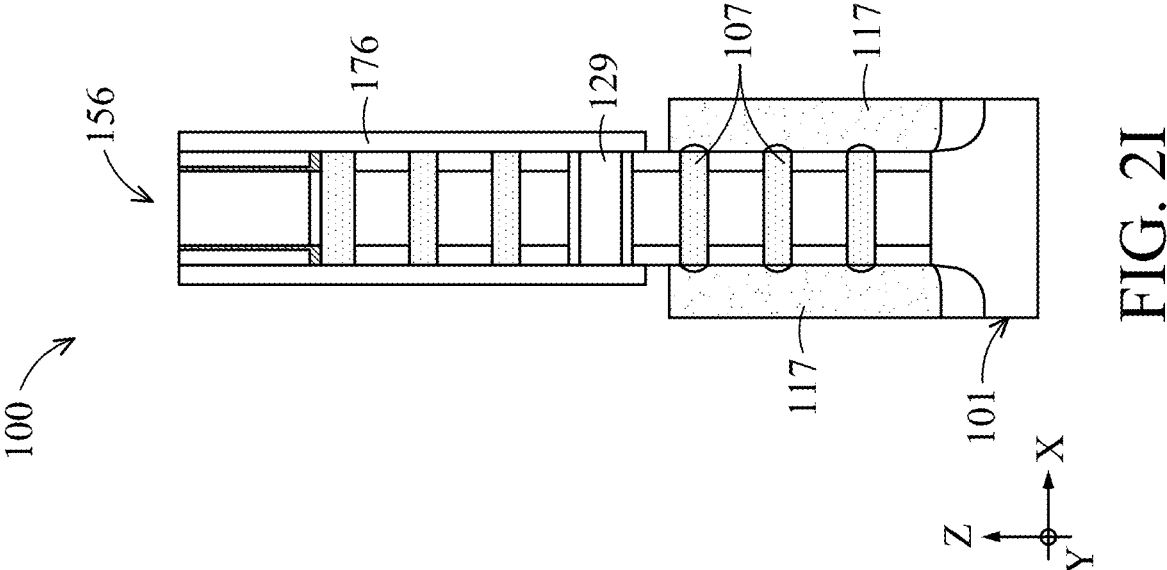

FIG. 2I is an X view of the integrated circuit 100, in accordance with some embodiments. In FIG. 2I, the polymer material 174 has been removed. Removal of the polymer layer 174 exposes the sidewalls of the semiconductor nano-structures 107 and the substrate 101. In FIG. 2I, source/drain regions 117 have been formed in the source/drain trenches 164 at the locations not covered by the dielectric layer 176. The source/drain regions 117 can be formed by an epitaxial growth from the semiconductor nanostructures 107 and from the substrate 101. The source/drain regions 117 include a semiconductor material. The semiconductor material can include a same semiconductor material as the semiconductor nanostructures 107. Alternatively, the semiconductor material of the source/drain regions 117 can be different than the semiconductor material of the semiconductor nanostructures 107. The source/drain regions 117 may be doped in situ with dopant atoms during the epitaxial growth process. In the example in which the lower transistor 105 is a P-type transistor, the source/drain regions 117 may be doped in situ with P-type dopant atoms. The P-type dopant atoms can include boron or other P-type dopant atoms.

FIG. 2J is an X view of the integrated circuit 100, in accordance with some embodiments. In FIG. 2J, the dielectric layer 176 has been removed. A dielectric layer 180 has been deposited. A polymer layer 182 has also been deposited. The dielectric layer 180 can include a same material as the dielectric layer 176. The polymer layer 182 can have a same material as the polymer material 174. An etch-back process has also been performed to reduce the height of the dielectric layer 180 and the polymer layer 182 to expose the sidewalls of the semiconductor nanostructures 106.

Figure 2L:
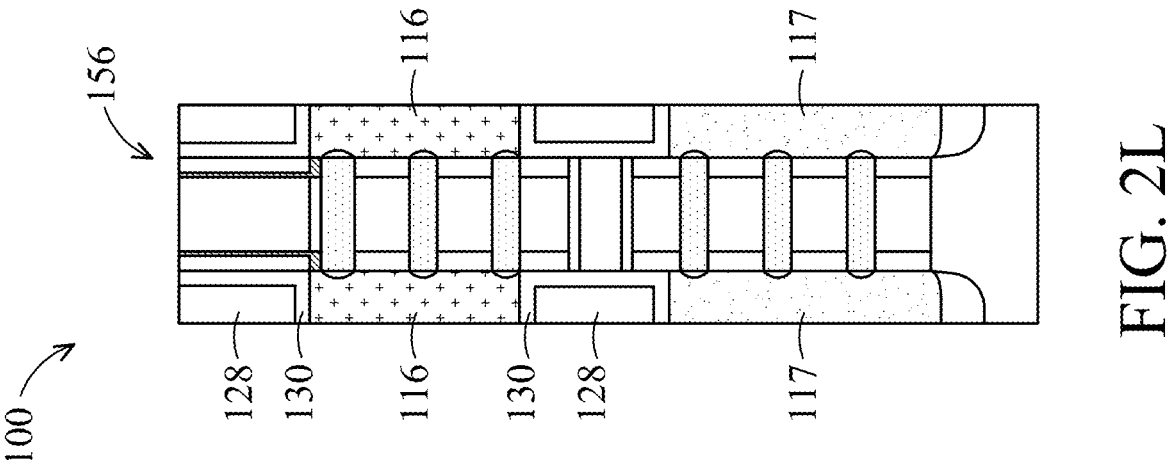
Figure 2K:
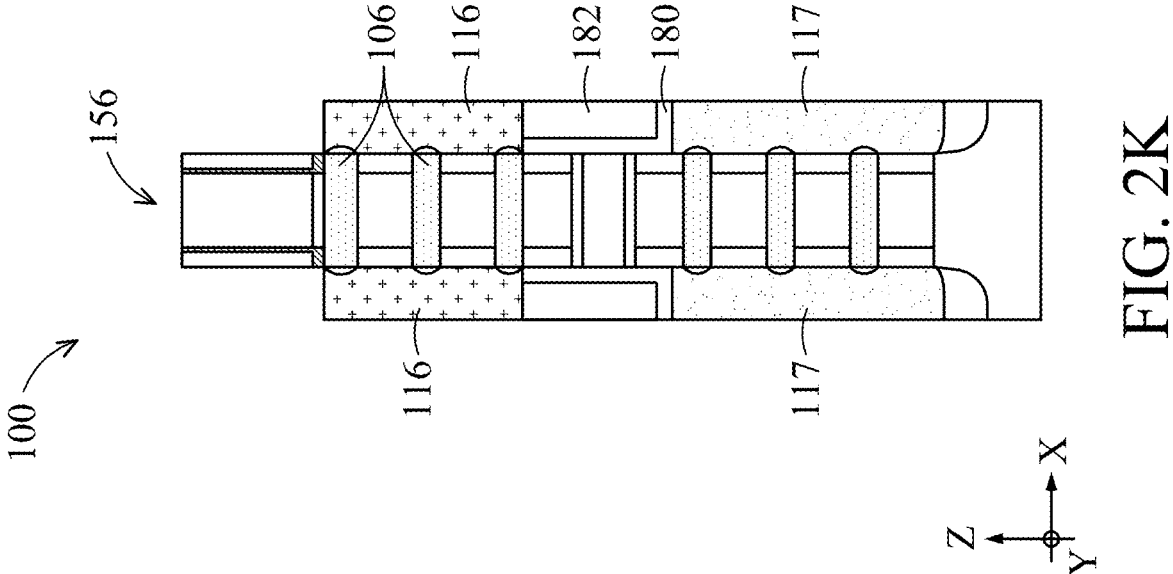

FIG. 2K is an X view of the integrated circuit 100, in accordance with some embodiments. In FIG. 2K, source/drain regions 116 have been formed in the source/drain trenches 164 above the dielectric layer 180 and the polymer layer 182. The source/drain regions 116 can be formed by an epitaxial growth from the semiconductor nanostructures 106. The source/drain regions 116 include a semiconductor material. The semiconductor material can include a same semiconductor material as the semiconductor nanostructures 106. Alternatively, the semiconductor material of the source/drain regions 116 can be different than the semiconductor material of the semiconductor nanostructures 106. The source/drain regions 116 may be doped in situ with dopant atoms during the epitaxial growth process. In the example in which the upper transistor 104 is an N-type transistor, the source/drain regions 116 may be doped in situ with N-type dopant atoms. The N-type dopant atoms can include phosphorus or other N-type dopant atoms.

FIG. 2L is an X view of the integrated circuit 100, in accordance with some embodiments. In FIG. 2L, the polymer layer 182 and the dielectric layer 180 has been removed. A dielectric layer 130 has been deposited with a conformal deposition process. The dielectric layer 130 is deposited on the exposed sidewalls of the inner spacers 114, the semiconductor layers 127, and the dielectric layer 129 between the source/drain regions 116 and the source/drain regions 117. The dielectric layer 130 is also deposited on the top surface of the source/drain regions 117, the bottom, side, and top surfaces of the source/drain regions 116, and on the sidewall spacers 131 of the dummy gate structure 156. The dielectric layer 130 can be deposited by CVD, ALD, or other suitable processes. The dielectric layer 130 may include a contact-etching stop-layer (CESL). The dielectric layer 130 may include one or more of silicon oxide, silicon nitride, silicon oxynitride, silicon carbonitride, silicon oxycarbonitride, fluorine-doped silicate glass (FSG), a low-K dielectric material or other dielectric materials.

An interlevel dielectric layer 128 has been deposited covering the dielectric layer 130. The interlevel dielectric layer 128 can include one or more of silicon oxide, silicon nitride, silicon oxynitride, silicon carbonitride, silicon oxycarbonitride, fluorine-doped silicate glass (FSG), a low-K dielectric material or other dielectric materials. The interlevel dielectric layer can be deposited by CVD, PVD, or ALD. Other materials and dimensions can be utilized for the dielectric layers 128 and 130 without departing from the scope of the present disclosure.

Figure 2M:
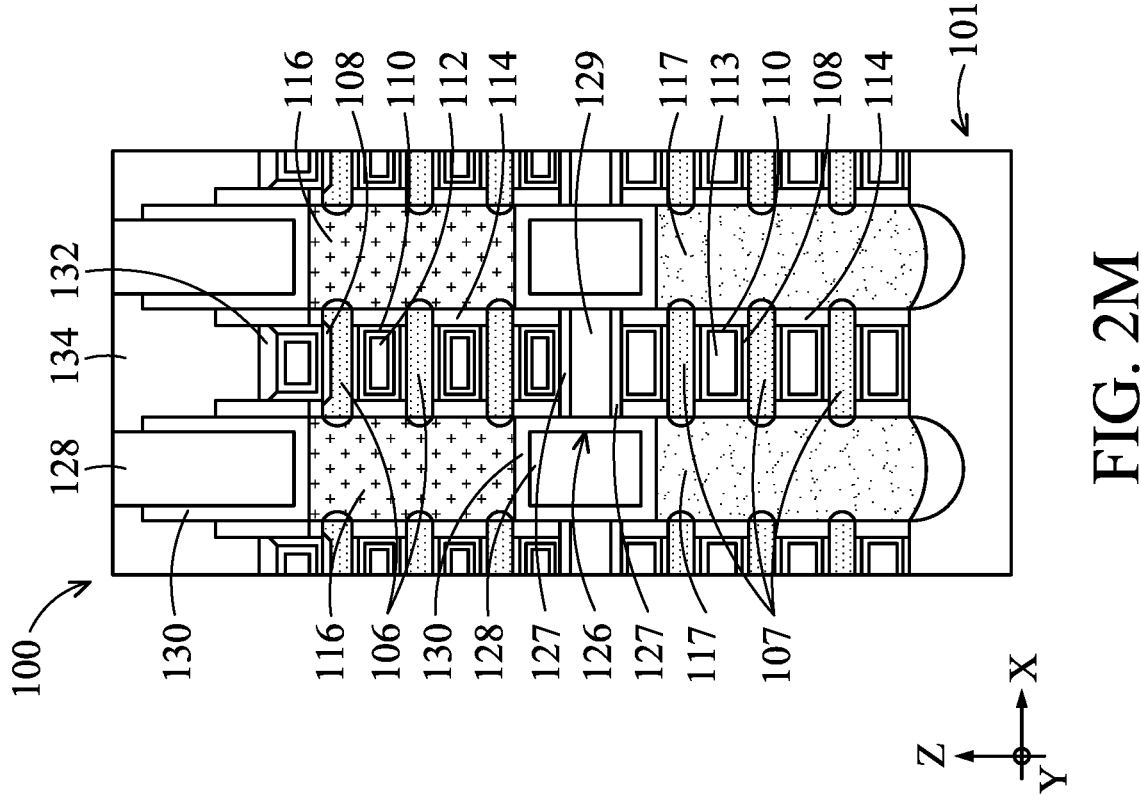

FIG. 2M is an X view of the integrated circuit 100, in accordance with some embodiments. The X view of FIG. 2M is laterally expanded with respect to FIG. 2L, thereby showing portions of laterally adjacent transistors. The dummy gate structure 156 has been removed. After removal of the dummy gate structure 156, the sacrificial semiconductor nanostructures 165 are removed with an etching process that selectively removes the sacrificial semiconductor nanostructures 165 with respect to the semiconductor nanostructures 106/107.

After removal of the sacrificial semiconductor nanostructures 165, a gap remains where the sacrificial semiconductor nanostructures 165 were. The semiconductor nanostructures 106/107 are exposed. The interfacial gate dielectric layer 108 and the high-K gate dielectric layer 110 are then deposited surrounding the semiconductor nanostructures 106/107. The interfacial gate dielectric layer 108 may include silicon oxide of a thickness between 2 Å and 10 Å. The high-K gate dielectric layer 110 is deposited on the interfacial gate dielectric layer 108 and may include hafnium oxide. The high-K dielectric layer may have a thickness between 5 Å and 20 Å. The materials of the gate dielectric layers 108 and 110 may be deposited by ALD, CVD, or PVD. Other structures, materials, thicknesses, and deposition processes may be utilized for the gate dielectric layer without departing from the scope of the present closure.

After deposition of the interfacial gate dielectric layer 108 and the high-K gate dielectric layer 110 around the semiconductor nanostructures 106/107, a gate metal 113 is deposited. The gate metal 113 may be deposited by PVD, CVD, ALD, or other suitable processes. The material or materials of the gate metal 113 are selected to provide a desired work function with respect to the semiconductor nanostructures 107 of the P-type transistor 105. In one example, the gate metal 113 includes titanium aluminum. However, other conductive materials can be utilized for the gate metal 113 without departing from the scope of the present disclosure.

When the gate metal 113 is initially deposited, the gate metal 113 surrounds the semiconductor nanostructures 106 and the semiconductor nanostructures 107. However, the gate metal 113 has a material that provides a desired work function for the lower transistor 105 and the gate metal 113 may not provide a desired work function for the upper transistor 104. Accordingly, an etch-back process is performed. The etch-back process removes the gate metal 113 to a level well below the lowest semiconductor nanostructure 106. In some embodiments, the etch-back process removes the gate metal 113 to a level that is about the vertical middle of the dielectric layer 129.

Because the dielectric layer 129 is present, the etch-back process can have a duration that reliably removes all of the gate metal 113 from directly between the dielectric layer 129 and the lowest semiconductor nanostructure 106, without removing the gate metal 113 from between the highest semiconductor nanostructure 107 and the dielectric layer 129. The result is that the gate metal 113 cannot interfere with the work function of the upper transistor 104.

After the etch-back process of the gate metal 113, a gate metal 112 is deposited. The gate metal 112 can be deposited using ALD, PVD, CVD, or other suitable deposition processes. In one example, the gate metal 112 includes titanium nitride. Alternatively, the gate metal 112 can include any other suitable conductive material. The gate metal 112 surrounds the semiconductor nanostructures 106. In particular, the gate metal 112 is in contact with the high-K gate dielectric 110 around the semiconductor nanostructures 106.

The material of the gate metal 112 is selected to provide a desired work function for the transistor 104.

After deposition of the gate metal 112, an etch-back process is performed to reduce the height of the gate metal 112 above the top semiconductor nanostructure 106. After the etch-back process of the gate metal 112, a gate cap metal 132 is deposited on the gate metal 112. The gate cap metal 132 can include tungsten, fluorine-free tungsten, or other suitable conductive materials. The gate cap metal 132 can be deposited by PVD, CVD, ALD, or other suitable deposition processes. The gate cap metal 132 may have a vertical thickness between 1 nm and 10 nm. Other dimensions can be utilized without departing from the scope of the present disclosure.

After deposition of the gate cap metal 132, a dielectric layer 134 is deposited. The dielectric layer 134 can include silicon oxide, silicon nitride, silicon oxynitride, silicon carbonitride, silicon oxycarbonitride, fluorine-doped silicate glass (FSG), a low-K dielectric material or other dielectric materials. The dielectric layer 134 can be deposited by PVD, CVD, ALD, or other suitable deposition processes.

Figures 3A, 3B:
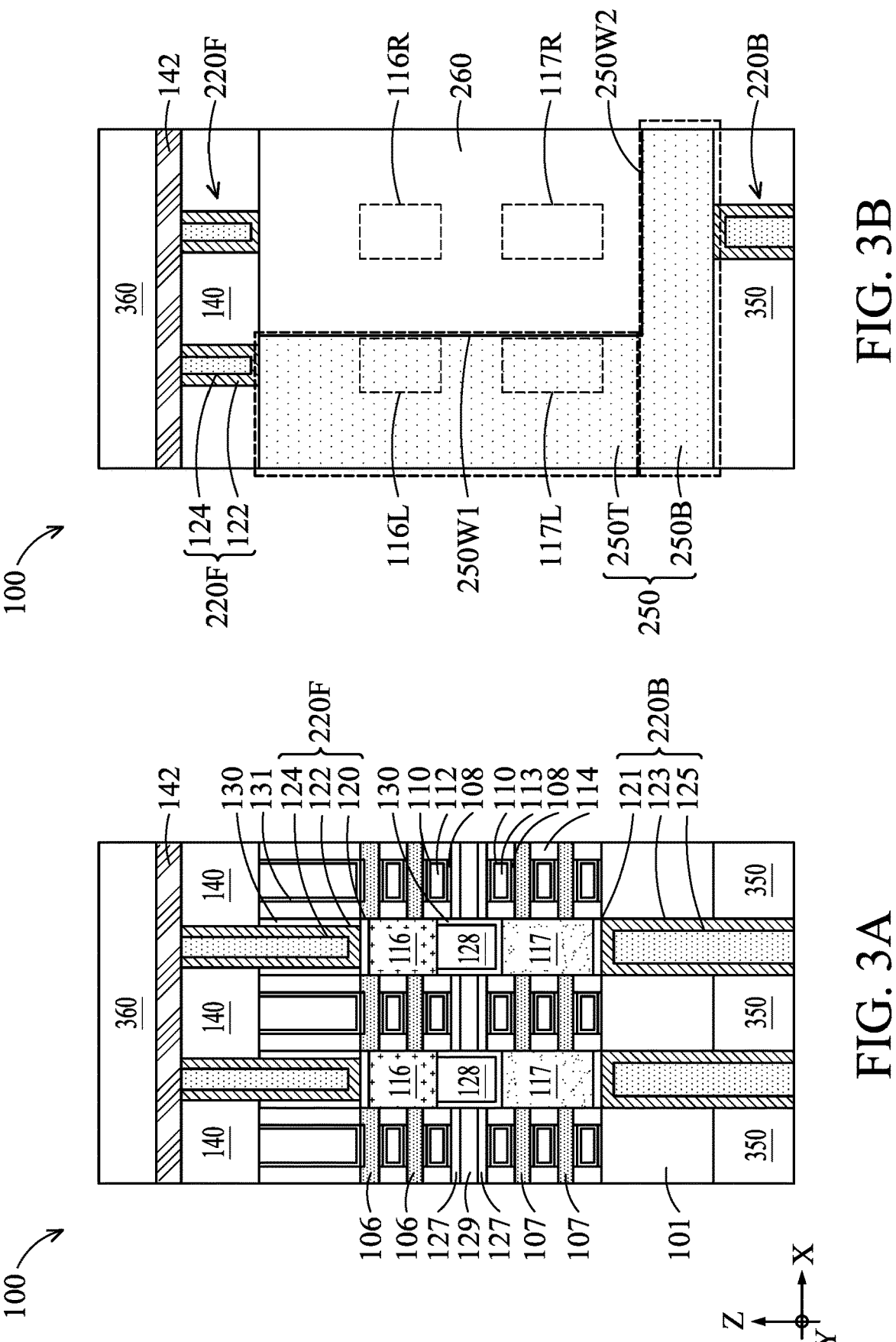
FIGS. 3A-16 are cross-sectional views of an integrated circuit at various stages of processing, in accordance with some embodiments.
Figure 3C:
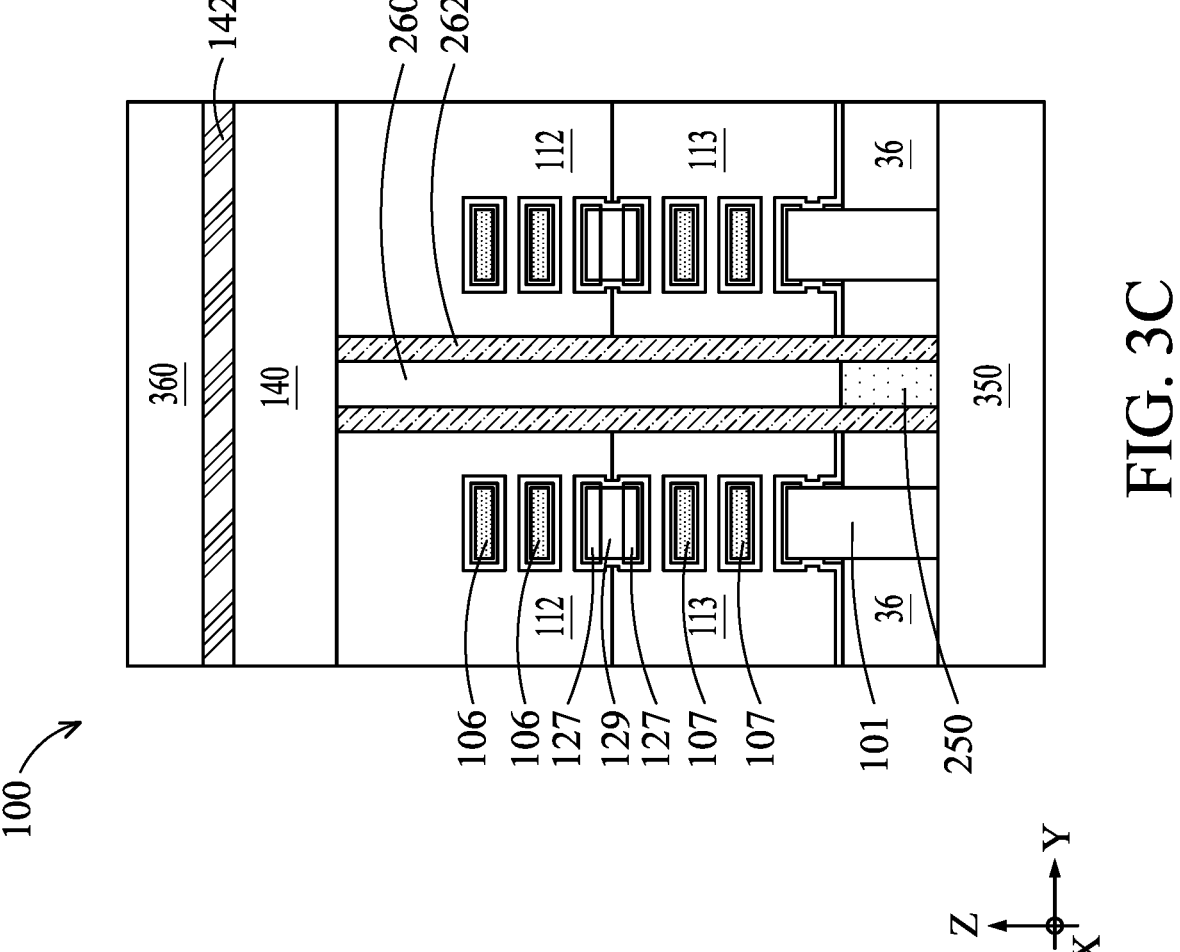
Figures 3D, 3E:
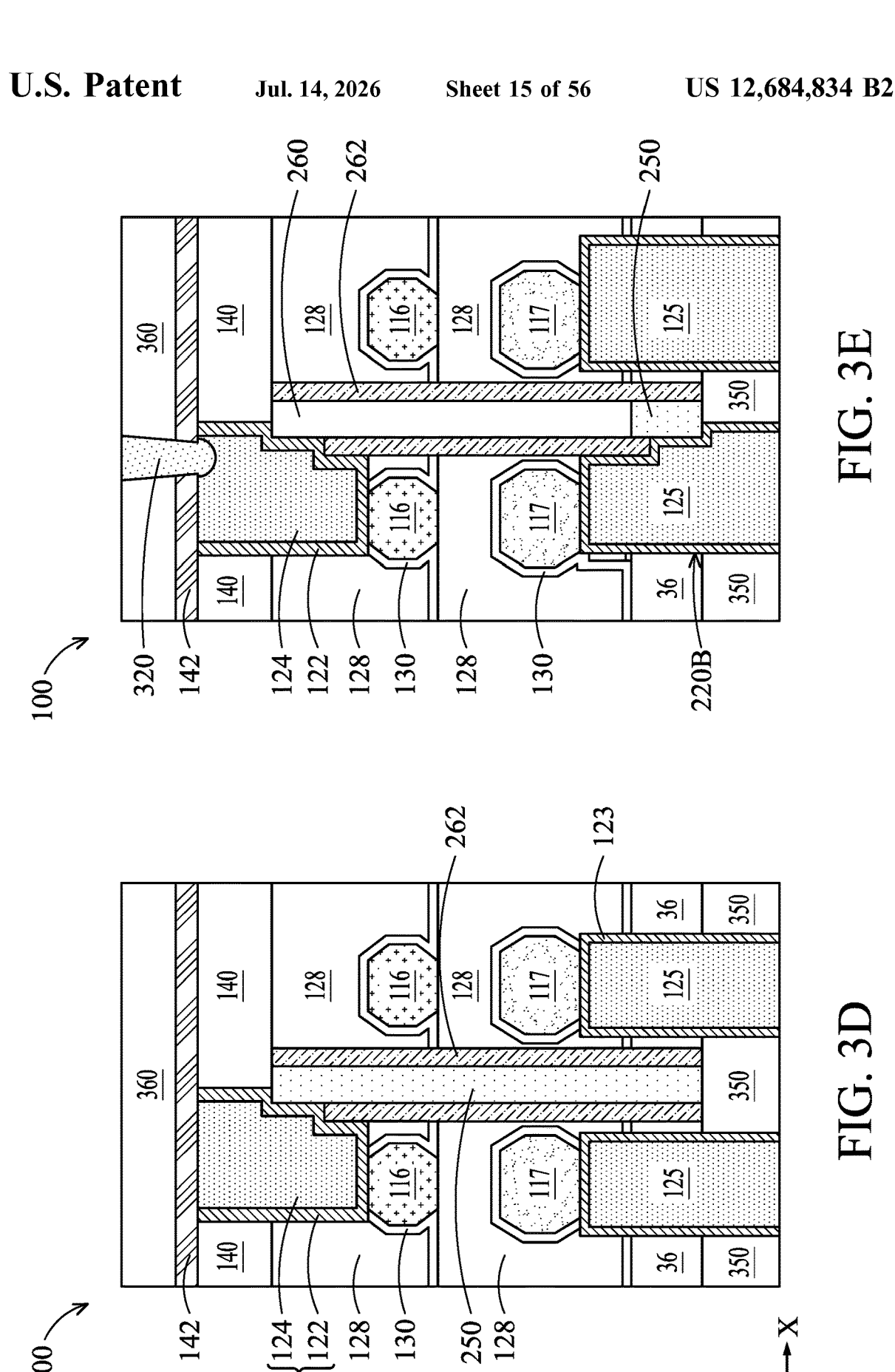

FIGS. 3A-3E are diagrammatic cross-sectional side views of the integrated circuit 100 including a conductive TSL 250 in accordance with various embodiments. FIGS. 4A-16 illustrate intermediate views of the integrated circuits 100, 100A during formation of frontside source/drain contacts 220F, backside source/drain contacts 220B and the conductive TSL 250 in accordance with various embodiments. FIG. 3A is a diagrammatic cross-sectional side view of the integrated circuit 100 along the line A-A of FIG. 1A. FIG. 3B is a diagrammatic cross-sectional side view of the integrated circuit 100 along the line B-B of FIG. 1A. FIG. 3C is a diagrammatic cross-sectional side view of the integrated circuit 100 along the line C-C of FIG. 1A. FIG. 3D is a diagrammatic cross-sectional side view of the integrated circuit 100 along the line D-D of FIG. 1A. FIG. 3E is a diagrammatic cross-sectional side view of the integrated circuit 100 along the line E-E of FIG. 1A.

Figure 16:
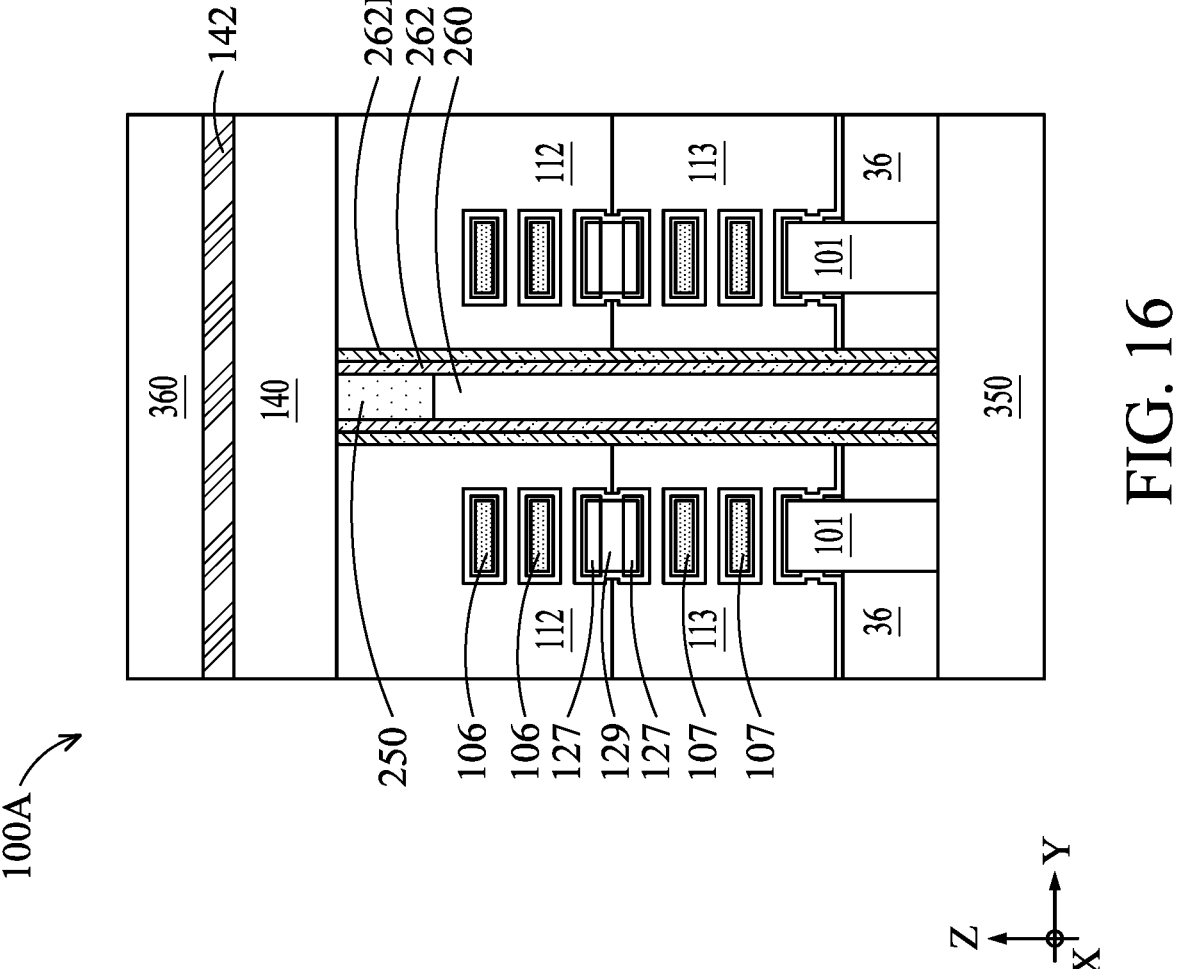
Figure 17:
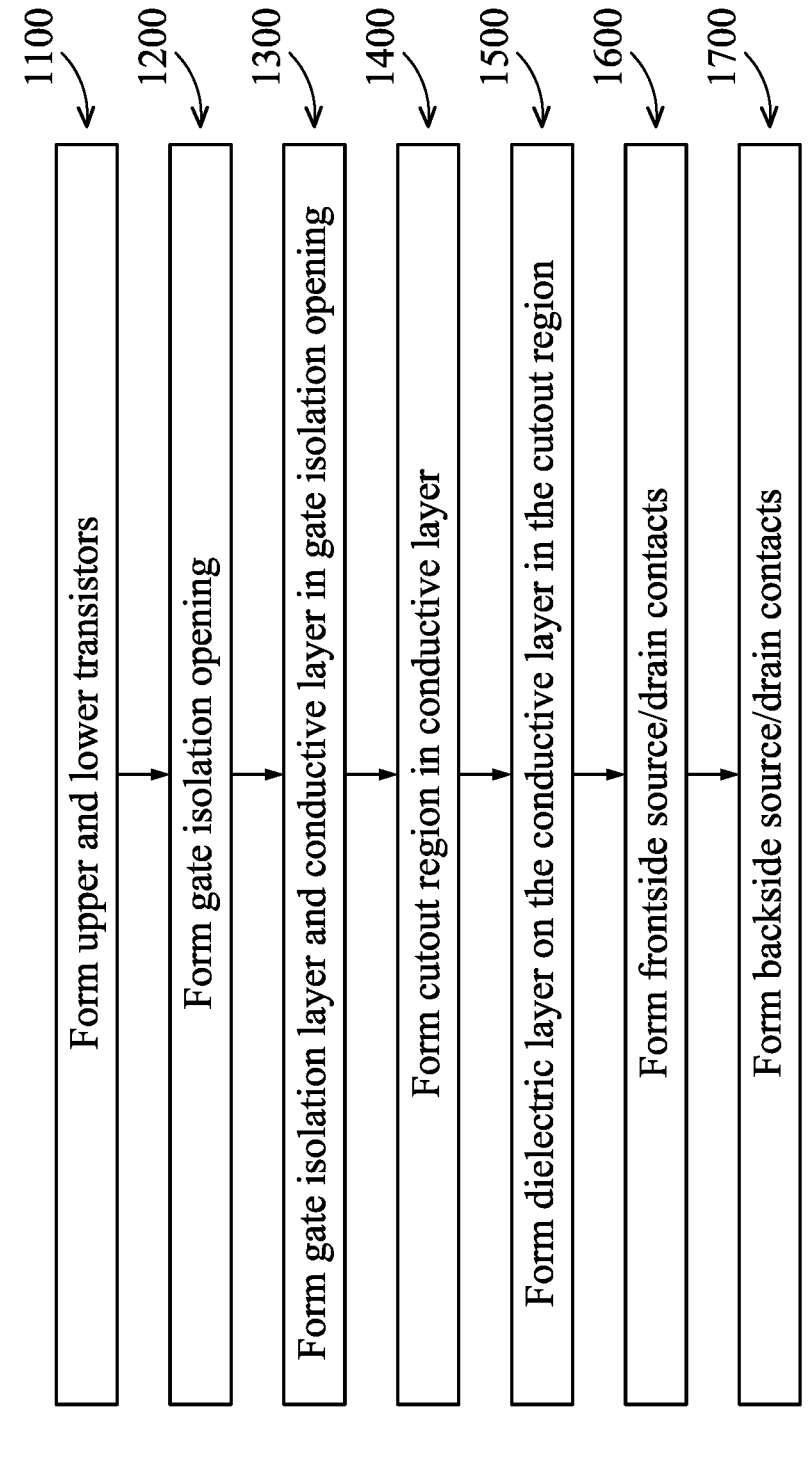
FIGS. 17 and 18 are flow diagrams of processes for forming an integrated circuit, in accordance with some embodiments.
Figure 18:
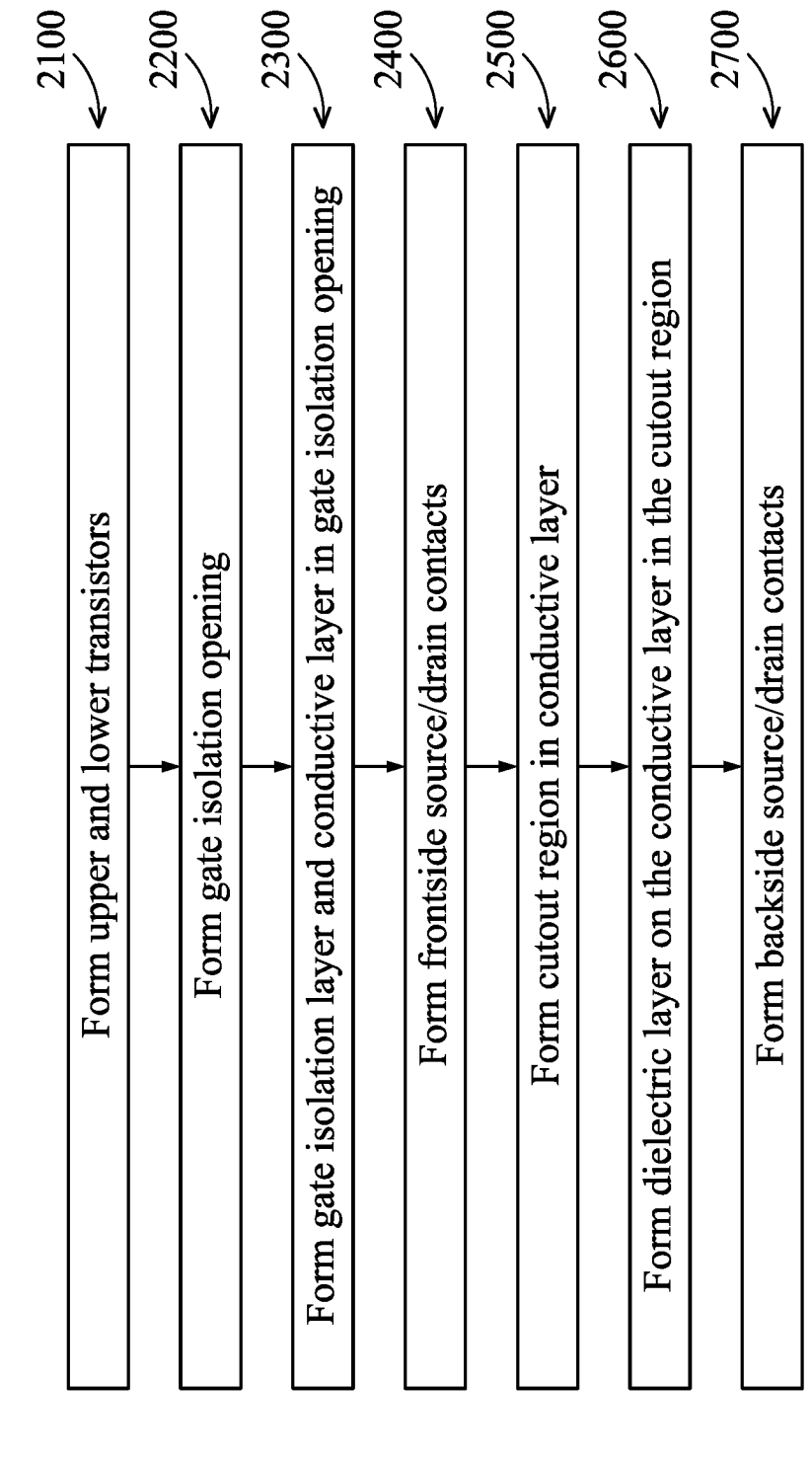

FIGS. 17 and 18 illustrate flowcharts of methods of forming an integrated circuit in accordance with various embodiments. The method of FIG. 17 may be used to form the integrated circuit 100, and the method of FIG. 18 may be used to form the integrated circuit 100A, but neither is limited to the structures shown in FIGS. 3A-16. In some embodiments, the methods 1000, 2000 for forming the semiconductor structures include a number of operations. The methods 1000, 2000 for forming the semiconductor structures will be further described according to one or more embodiments. It should be noted that the operations of the methods 1000, 2000 may be rearranged or otherwise modified within the scope of the various aspects. It should further be noted that additional processes may be provided before, during, and after the methods 1000, 2000, and that some other processes may be only briefly described herein.

Referring to FIG. 3A, the frontside source/drain contacts 220F include the silicide 120, a liner or barrier layer 122 and a metal layer 124. The liner layer 122 and the metal layer 124 extend through an interlayer dielectric (ILD) layer 140 and between neighboring gate structures 112 to contact the source/drain regions 116. For example, the liner layer 122 may contact the silicide 120, and the metal layer 124 may contact the liner layer 122, as shown.

The backside source/drain contacts 220B include the silicide 121, a liner or barrier layer 123 and a metal layer 125. The liner layer 123 and the metal layer 125 extend through a backside ILD layer 350 and optionally through the substrate 101 to contact the source/drain regions 117. For example, the liner layer 123 may contact the silicide 121, and the metal layer 125 may contact the liner layer 123, as shown. In some embodiments, the substrate 101 is not present, and a dielectric layer may be present between the backside ILD layer 350 and the source/drain regions 117, the inner spacers 114, and the interfacial dielectrics 108.

Referring to FIG. 3B, the conductive TSL 250 electrically couples one or more of the frontside source/drain contacts 220F to one or more of the backside source/drain contacts 220B. In the example illustrated in FIG. 3B, the conductive TSL 250 extends from a frontside source/drain contact 220F coupled to a source/drain region 116 of an upper transistor 104 to a backside source/drain contact 220B coupled to a source/drain region 117 of a lower transistor 105.

Further views of the conductive TSL 250 are illustrated in FIGS. 3D and 3E. The frontside source/drain contact 220F coupled to the conductive TSL 250 may be in contact with an upper surface of the conductive TSL 250, and may be optionally in contact with a sidewall of the conductive TSL 250. The backside source/drain contact 220B coupled to the conductive TSL 250 may be in contact with a lower surface of the conductive TSL 250, and may be optionally in contact with a sidewall of the conductive TSL 250.

Referring again to FIG. 3B, the conductive TSL 250 includes a lower portion 250B and an upper portion 250T. The lower portion 250B and the upper portion 250T may be a continuous structure. In some embodiments, a visible interface is present between the lower portion 250B and the upper portion 250T, for example, when the lower portion 250B and the upper portion 250T are formed in separate process operations. The lower portion 250B is wider than the upper portion 250T in the X-axis direction. As such, the conductive TSL 250 may be said to be "L-shaped." The conductive TSL 250 overlaps a first source/drain region 116L and a first source/drain region 117L in the Y-axis direction, and does not substantially overlap a second source/drain region 116R and a second source/drain region 117R in the Y-axis direction, as shown in phantom in FIG. 3B. The lower portion 250B of the conductive TSL 250 extends to be below the second source/drain regions 116R, 117R, albeit offset in the Y-axis direction, so as to connect to the backside source/drain contact 220B.

A dielectric layer 260 is on the conductive TSL 250. The dielectric layer 260 and the conductive TSL 250 may be collectively referred to as an "interconnect structure." The dielectric layer 260 may be in contact with the upper surface of the lower portion 250B, and may be in contact with a sidewall of the upper portion 250T. The dielectric layer 260 overlaps the second source/drain regions 116R, 117R, which is advantageous for reducing parasitic capacitance between the conductive TSL 250 and the second source/drain regions 116R, 117R. The dielectric layer 260 overlaps gate metals 112, 113 of one or more of the first and second transistors 104, 105, which is advantageous for reducing parasitic capacitance between the conductive TSL 250 and the gate metals 112, 113. The dielectric layer 260 may be or include $SiO_2$, a nitride (e.g., SiN), a low-k dielectric, or the like.

The dielectric layer 260 may be adjacent the conductive TSL 250 at a sidewall 250W1 and an upper surface 250W2 of the conductive TSL 250. The sidewall 250W1 may extend in the X-axis direction to be substantially coplanar with sidewalls of the source/drain regions 116, 117, as shown. In some embodiments, the sidewall 250W1 is between sidewalls of the first source/drain regions 116L, 117L and the second source/drain regions 116R, 117R. In some embodiments, the sidewall 250W1 is between the sidewalls of the source/drain region 116R, such that the upper portion 250T only partially overlaps the source/drain regions 116R, 117R. In some embodiments, the sidewall 250W1 is substantially coplanar with a vertical sidewall of the liner layer 122 or with a vertical sidewall of the conductive layer 124. A wider upper portion 250T may reduce resistance of the conductive TSL 250, and a narrower upper portion 250T may reduce parasitic capacitances of the conductive TSL 250. The wider upper portion 250T may improve landing of the frontside source/drain contact 220F on the upper portion 250T. For example, when the sidewall 250W1 does not extend past the vertical sidewalls of the conductive layer 124 and the liner layer 122, the frontside source/drain contact 220F may extend into the dielectric layer 260 due to an overlay shift during a photolithography operation used to form an opening in the ILD 140 in which the frontside source/drain contact 220F is formed.

The upper surface 250W2 is generally below the upper surface of the substrate 101, so that the lower portion 250B does not substantially overlap the source/drain regions 117 and the gate metals 113. Vertical distance between the upper surface 250W2 and the upper surface of the substrate 101 may be in a range of about 0 nm to about 100 nm, though other vertical distances greater than 100 nm are within the contemplated scope of the embodiments. A larger height of the lower portion 250B reduces resistance of the conductive TSL 250. In some embodiments, width of the dielectric layer 260 is in a range of about 0 nm to about 100 nm, and height of the dielectric layer 260 is in a range of about 0 nm to about 150 nm, though widths greater than 100 nm and heights greater than 150 nm are also within the contemplated scope of the embodiments.

Formation of the conductive TSL 250 and the frontside and backside source/drain contacts 220F, 220B along with a gate isolation structure 262 is illustrated in FIGS. 4A-16.

In FIGS. 4A-4E, upper and lower transistors have been formed, corresponding to operations 1100, 2100 of FIGS. 17 and 18, and an opening 45 is formed corresponding to operations 1200, 2200 of FIGS. 17 and 18. Forming the opening 45 may include forming a first mask 400 over the gate metals 112, the high-K gate dielectric layers 110, sidewall spacers 131 and dielectric caps 128C. The first mask 400 may include a first mask layer 400A and a second mask layer 400B. One or both of the first and second mask layers 400A, 400B may be a hard mask layer, such as an inorganic dielectric material layer. A photoresist layer 410, which may be a multilayer, is formed over the first mask 400. An opening may be formed in the photoresist layer 410, and the first mask 400 may be patterned (e.g., etched) through the opening in the photoresist layer 410 to expose the underlying structure.

FIGS. 4A and 4C-4E illustrate first sacrificial layer 102 that is beneath the substrate 101, and second sacrificial layer 103 that is beneath the first sacrificial layer 102. The first sacrificial layer 102 may be a semiconductor layer, such as a silicon germanium layer, in accordance with various embodiments. The second sacrificial layer 103 may be a silicon layer, such as an undoped silicon layer, in some embodiments.

Figure 4B:
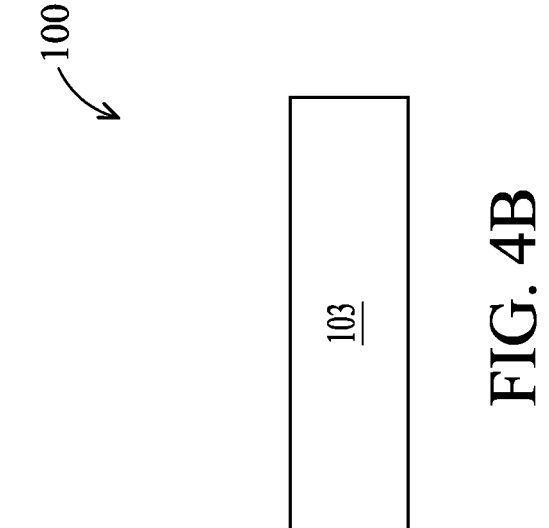
Figure 4A:
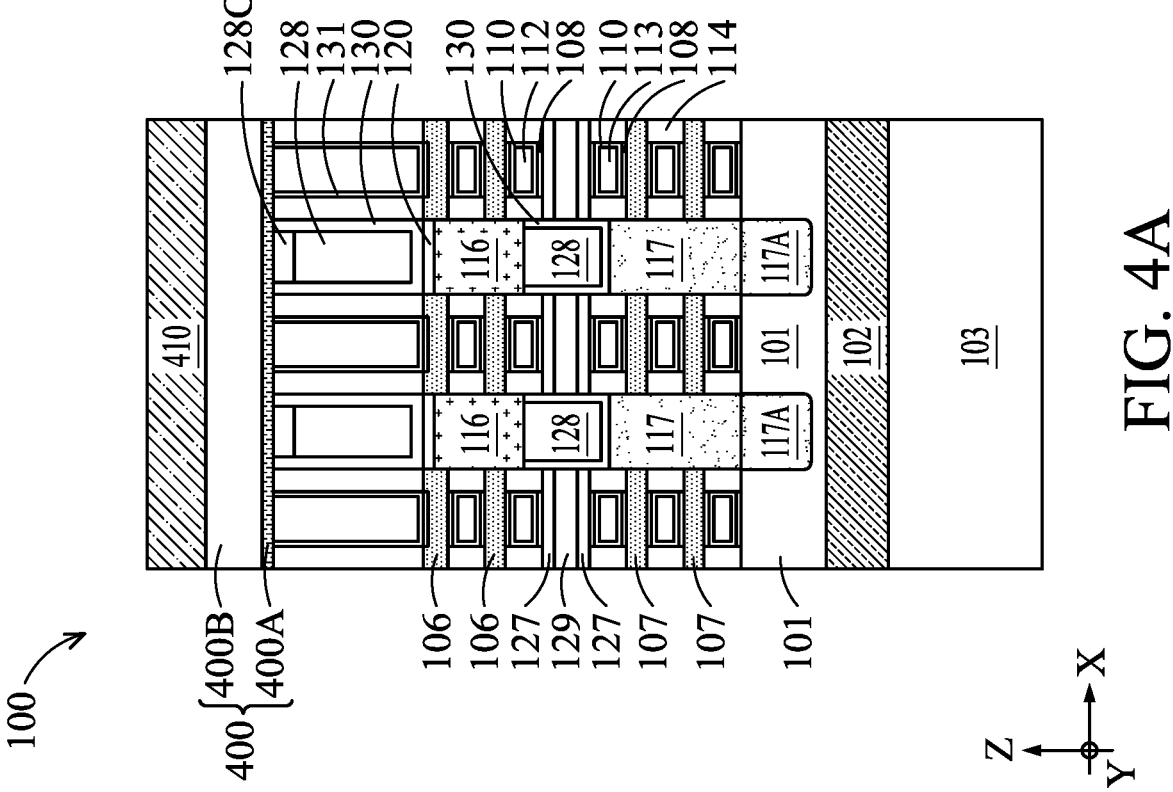
Figure 4C:
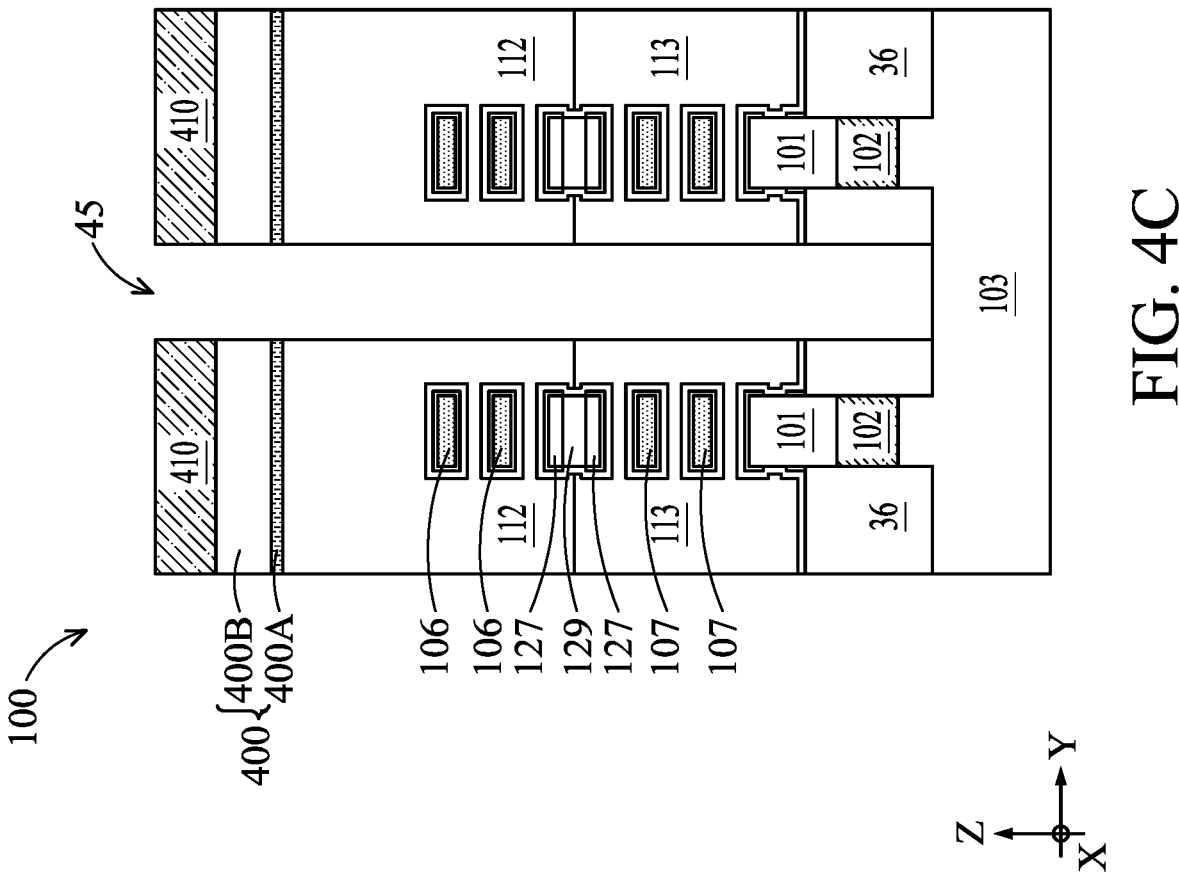

Following formation of the opening 45 in the first mask 400, the opening 45 may be extended downward until the second sacrificial layer 103 is reached. Extending the opening 45 may include a plurality of removal operations. For example, one or more anisotropic etching operations may be performed to remove materials of the gate metals 112, 113, the high-K gate dielectric layers 110, the interfacial gate dielectric layers 108, the nanostructures 106, 107 and the isolation structure 126, as shown in FIG. 4C. The same or additional anisotropic etching operations may be performed to remove materials of the dielectric layers 128, 130, the dielectric cap 128C, and isolation structures 36 (e.g., shallow trench isolation or "STI" regions 36), as shown in FIGS. 4D and 4E.

Figures 4D, 4E:
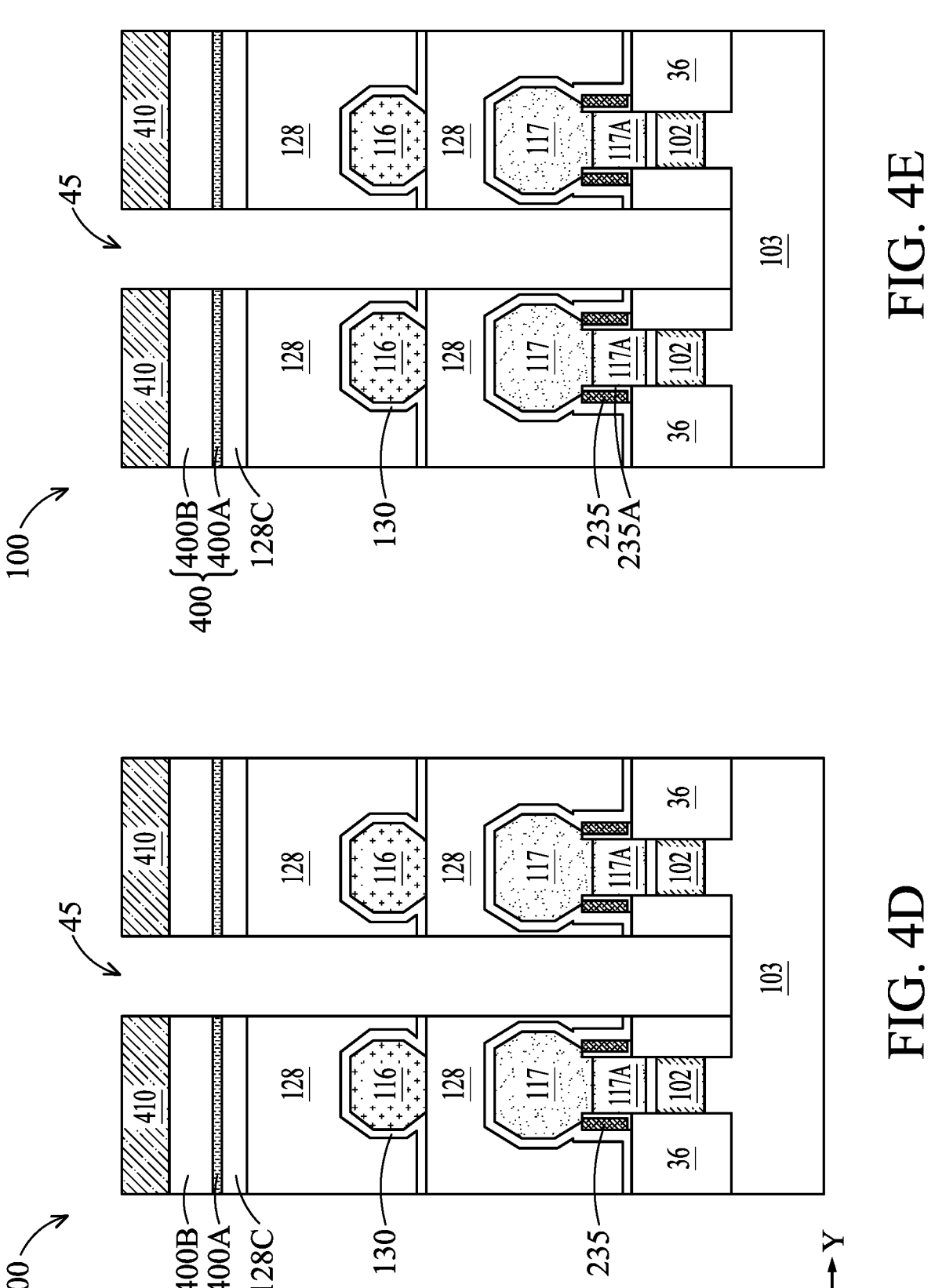

In FIGS. 4D and 4E, when etching the dielectric layers 128, width of the opening 45 in the Y-axis direction may be such that the dielectric layers 130 remain on sidewalls of the source/drain regions 116, 117. In some embodiments, the opening 45 may expose one or more portions of the dielectric layers 130 on the sidewalls of the source/drain regions 116, 117. FIGS. 4D and 4E show fin spacers 235 and a liner layer 235A that may be present between the fin spacers 235 and the source/drain regions 117. FIGS. 4A, 4D and 4E illustrate semiconductor portions 117A that underlie the source/drain regions 117. In some embodiments, the semiconductor portions 117A are sacrificial material structures that are replaced by backside source/drain contacts 220B in subsequent operations. The semiconductor portions 117A are undoped silicon, in some embodiments.

Figure 5B:
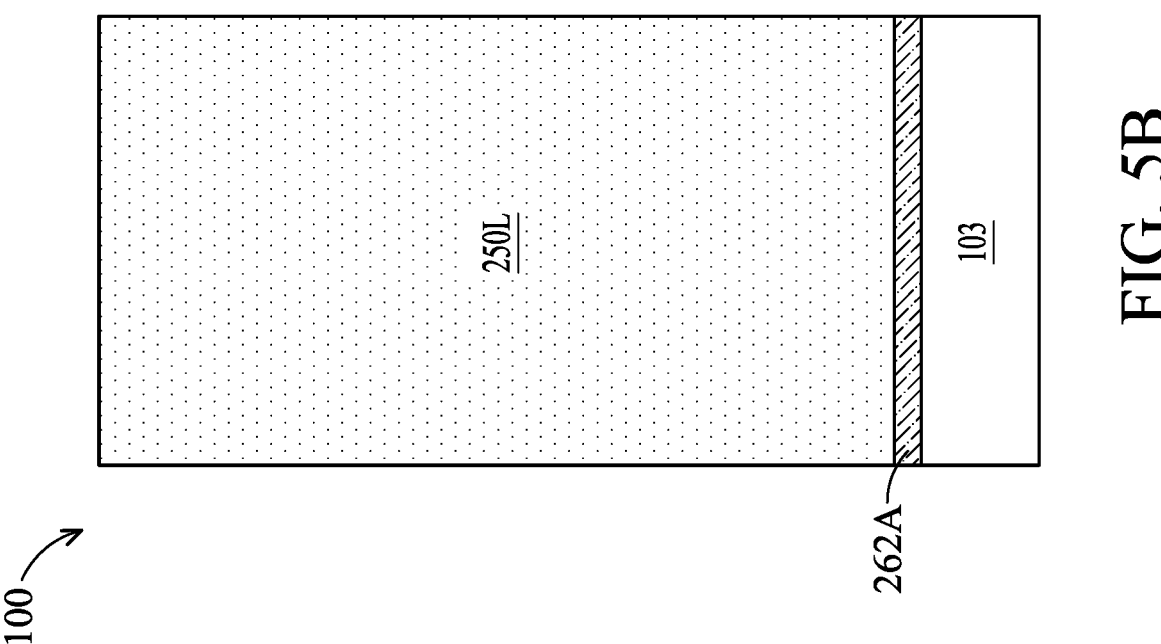
Figure 5A:
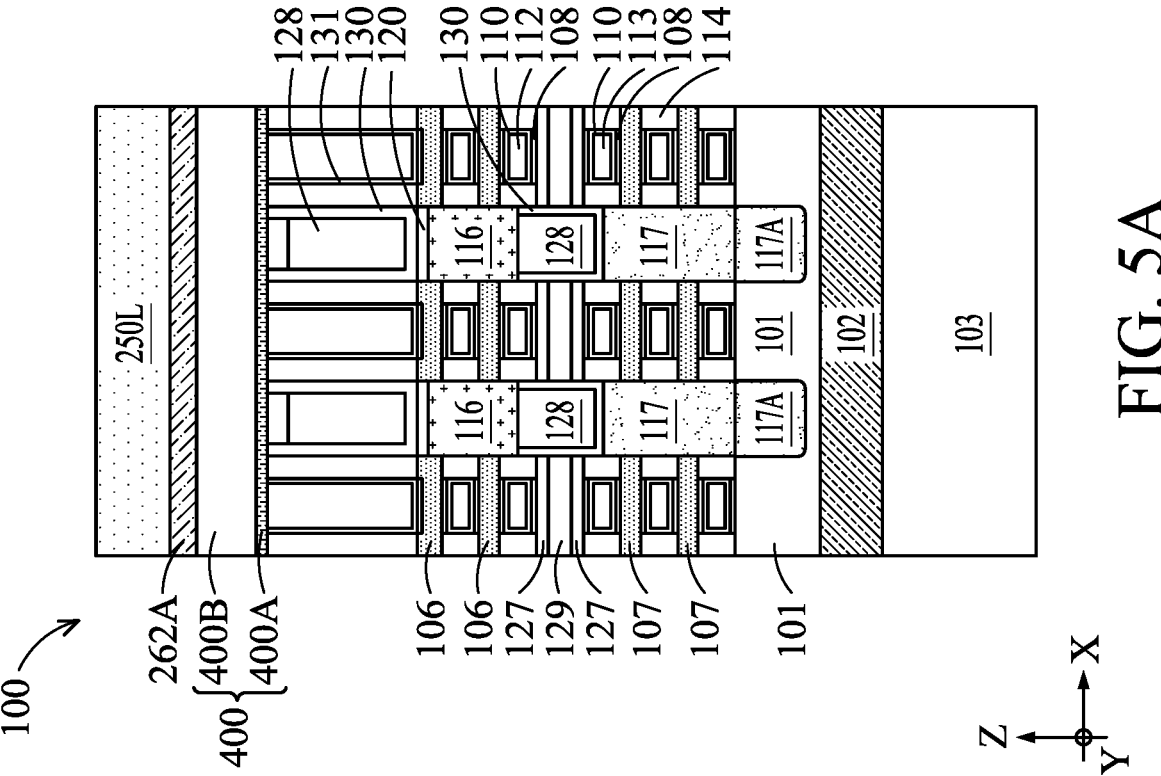
Figure 5C:
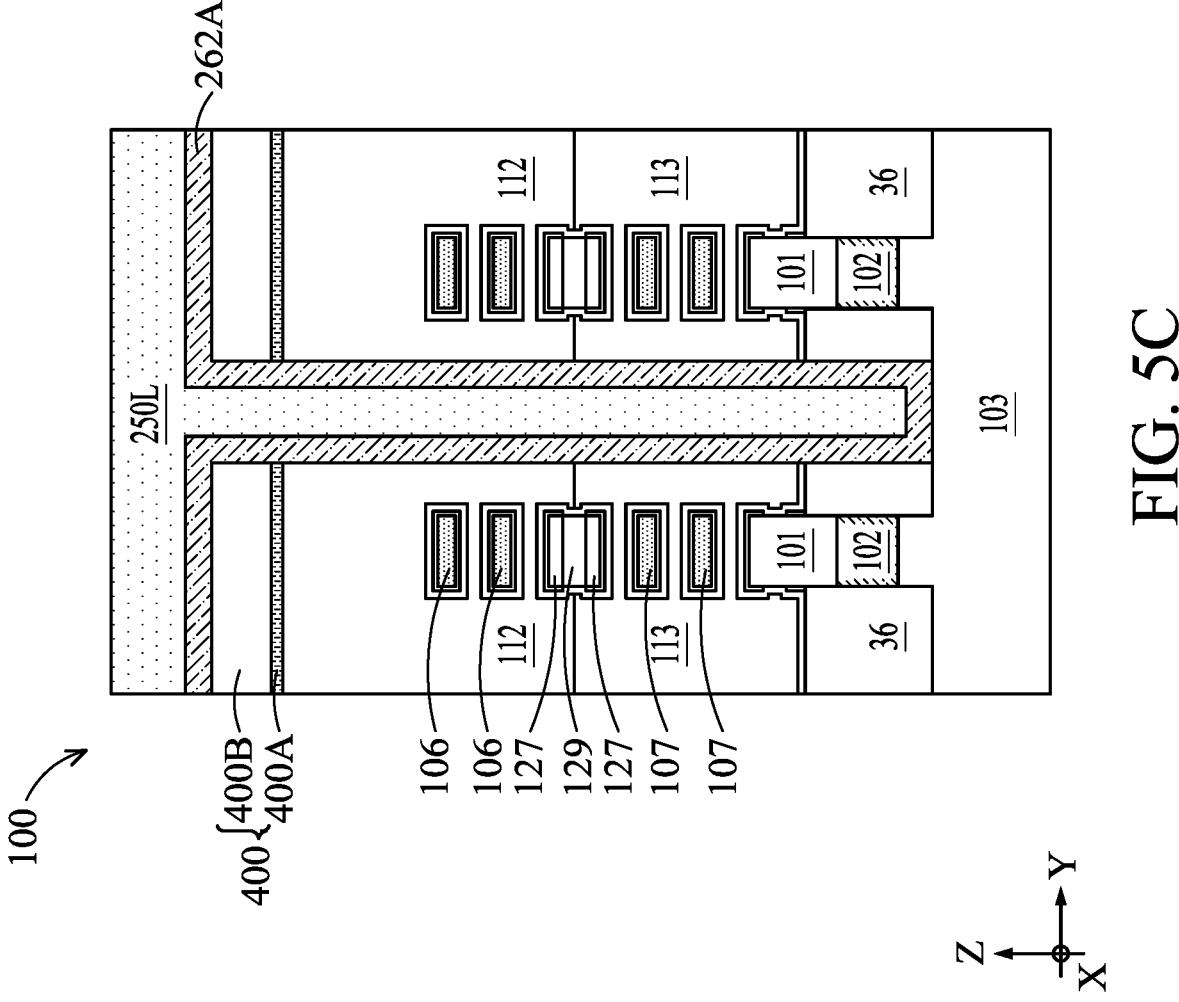
Figures 5D, 5E:
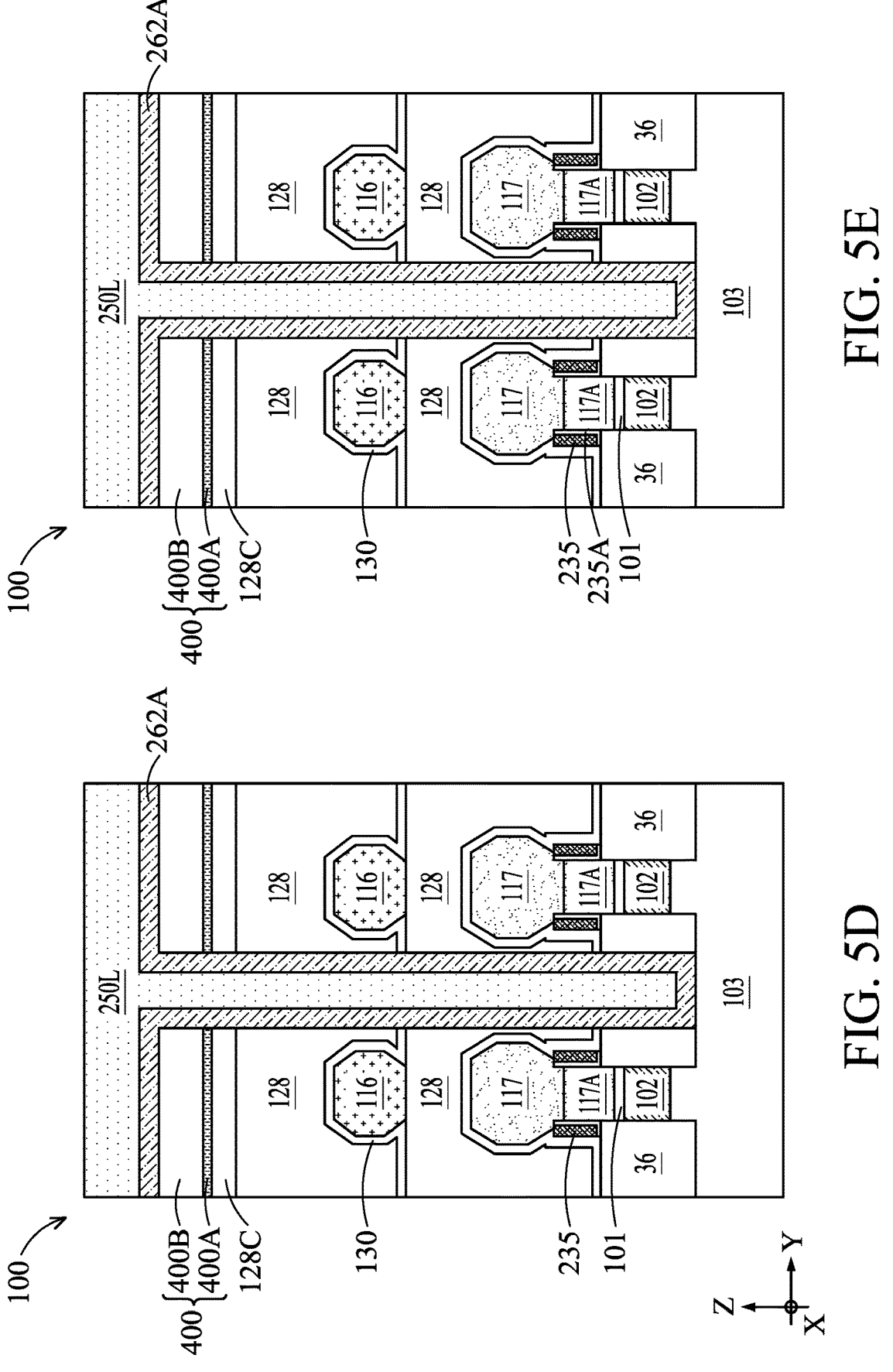

In FIGS. 5A-5E, following formation of the opening 45, a gate isolation layer 262A may be formed in the opening 45, then a conductive layer 250L may be formed in the opening 45, as illustrated in FIG. 5C, and corresponding to operations 1300, 2300 of FIGS. 17 and 18. In some embodiments, the gate isolation layer 262A is or includes a dielectric material, such as SiN, SiO, SiCN, SiON, SiOCN, combinations thereof, or the like. In some embodiments, the gate isolation layer 262A is a low-K dielectric layer. The gate isolation layer 262A may be deposited by a suitable deposition operation, such as a PVD, CVD, ALD, or the like. The gate isolation layer 262A may be a conformal layer that has thickness in a range of about 5 nm to about 30 nm. The gate isolation layer 262A may be adjacent or in contact with sidewalls exposed by the opening 45, such as sidewalls of the gate metals 112, 113, the isolation regions 36 and the dielectric layers 128. The gate isolation layer 262A may be on or in contact with an upper surface of the second sacrificial layer 103.

Following formation of the gate isolation layer 262A, the conductive layer 250L is formed in remaining portions of the opening 45. The conductive layer 250L may be or include one or more of W, Co, Cu, Ru, or the like, and may be formed by a PVD, CVD, ALD, or other suitable deposition process. Width of the conductive layer 250L in the Y-axis direction may be in a range of about 5 nm to about 100 nm.

Figures 5F, 5G:
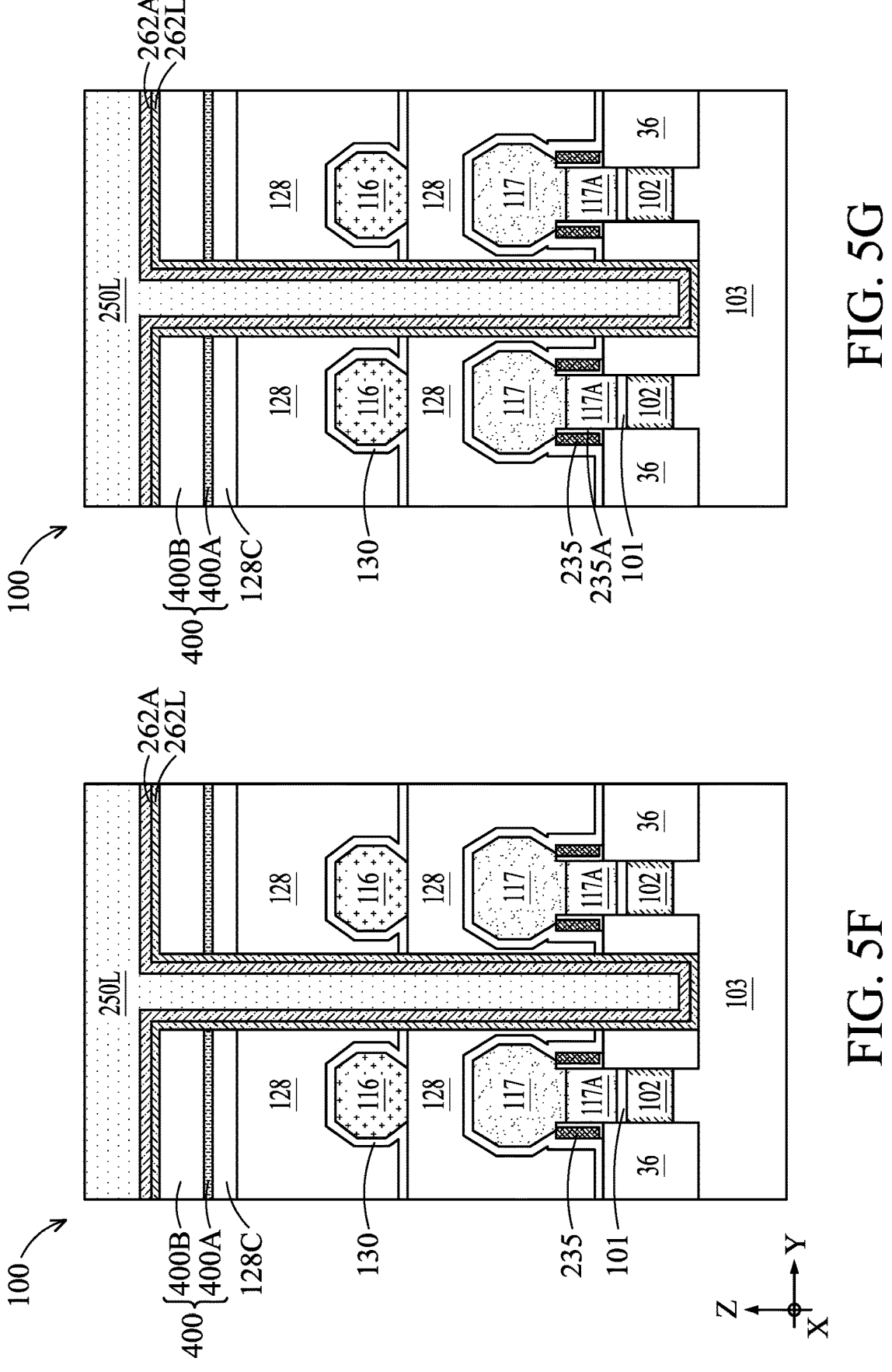
Figure 6B:
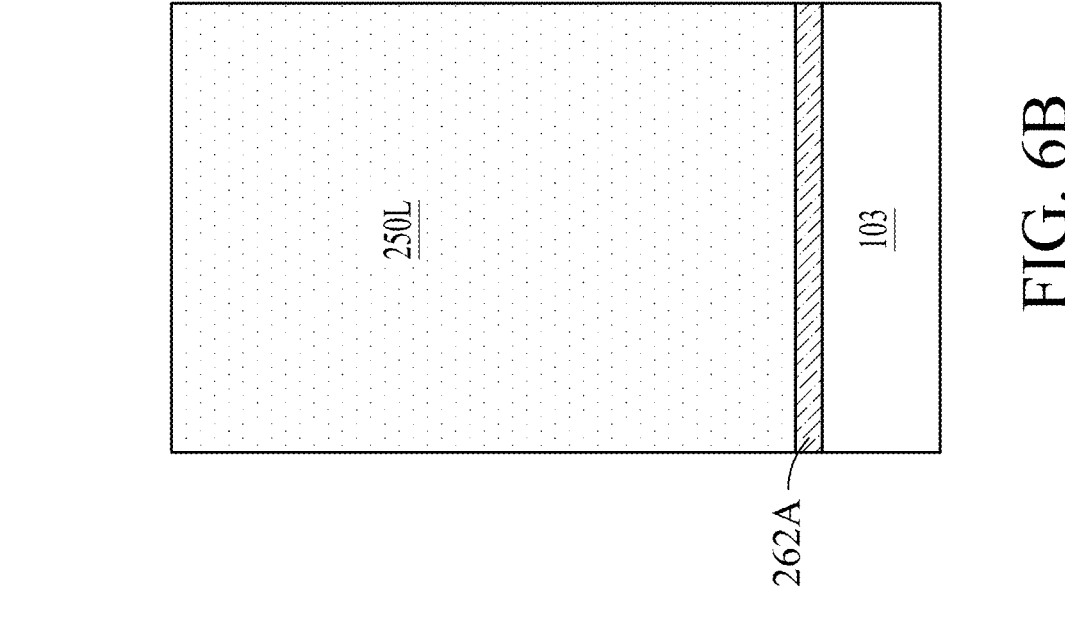
Figure 6A:
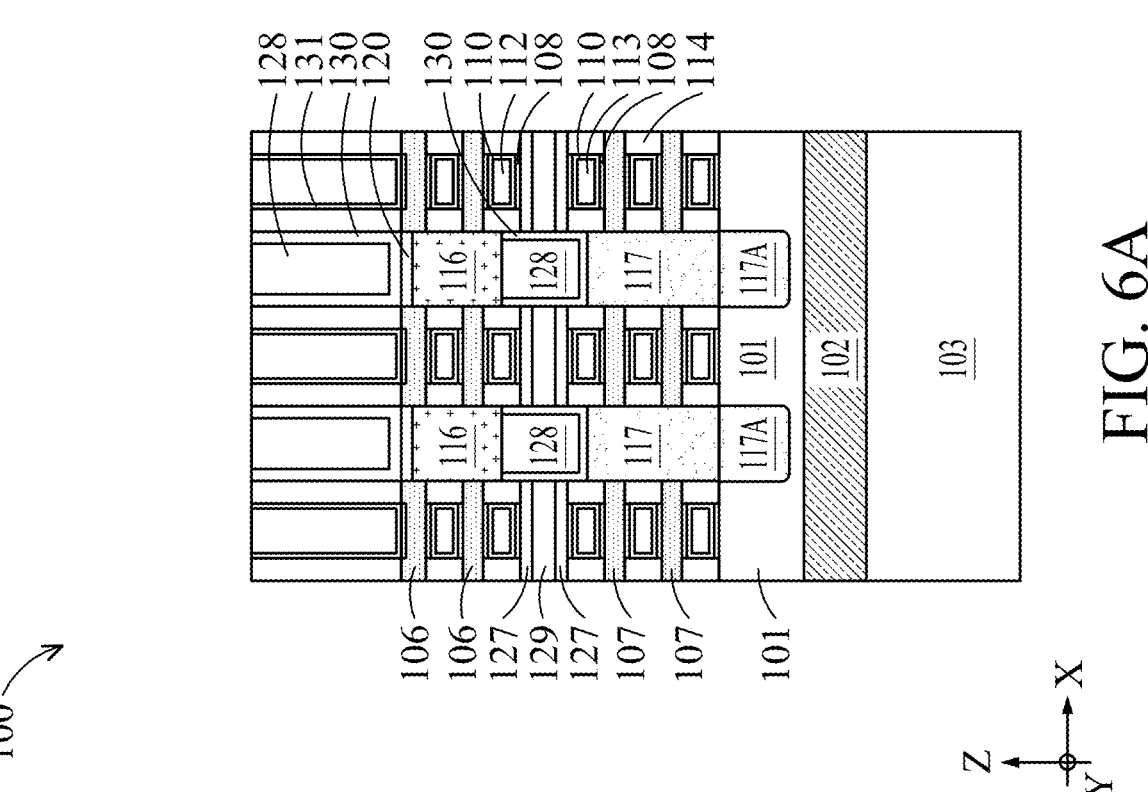
Figure 6C:
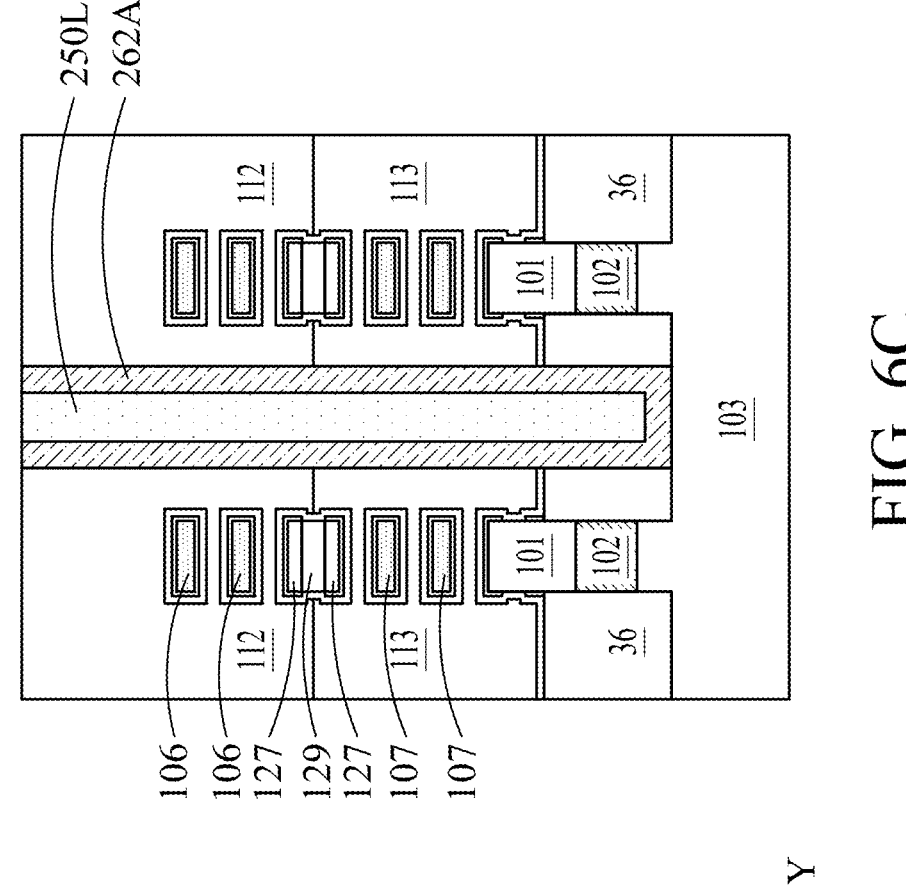
Figure 6E:
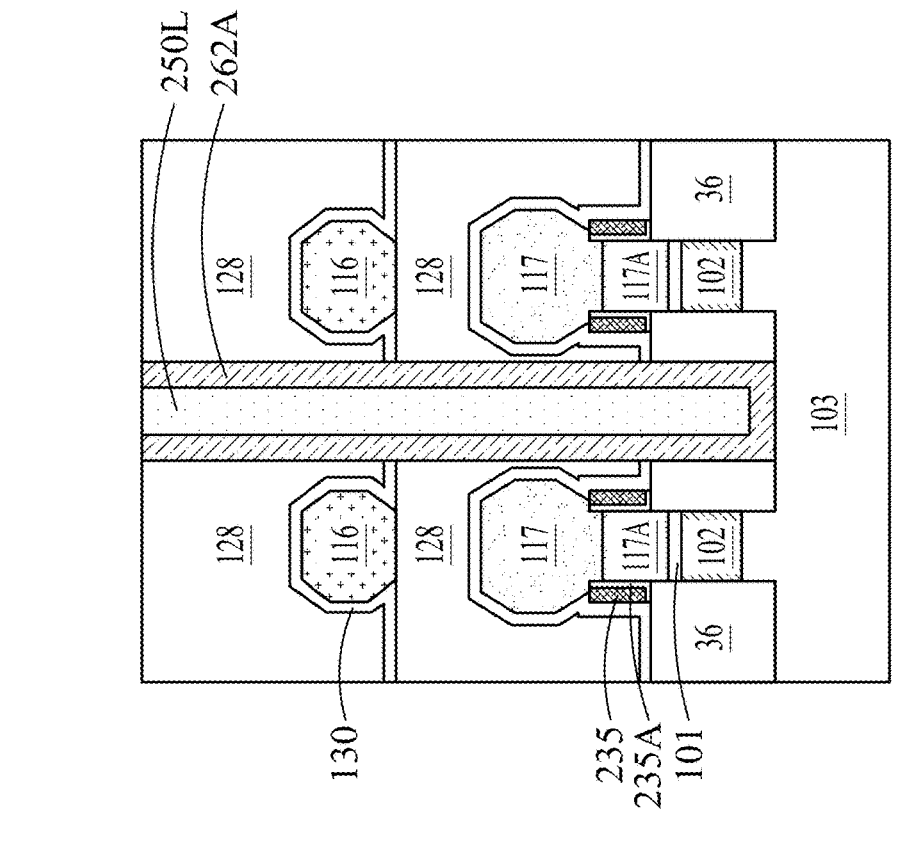
Figure 6D:
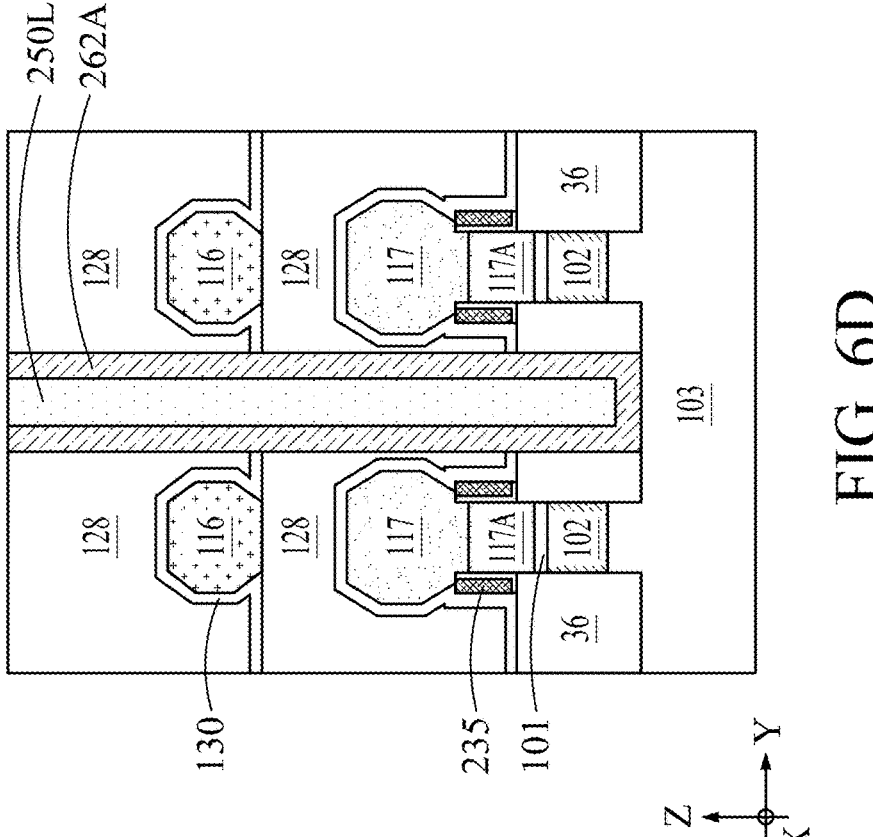
Figure 7B:
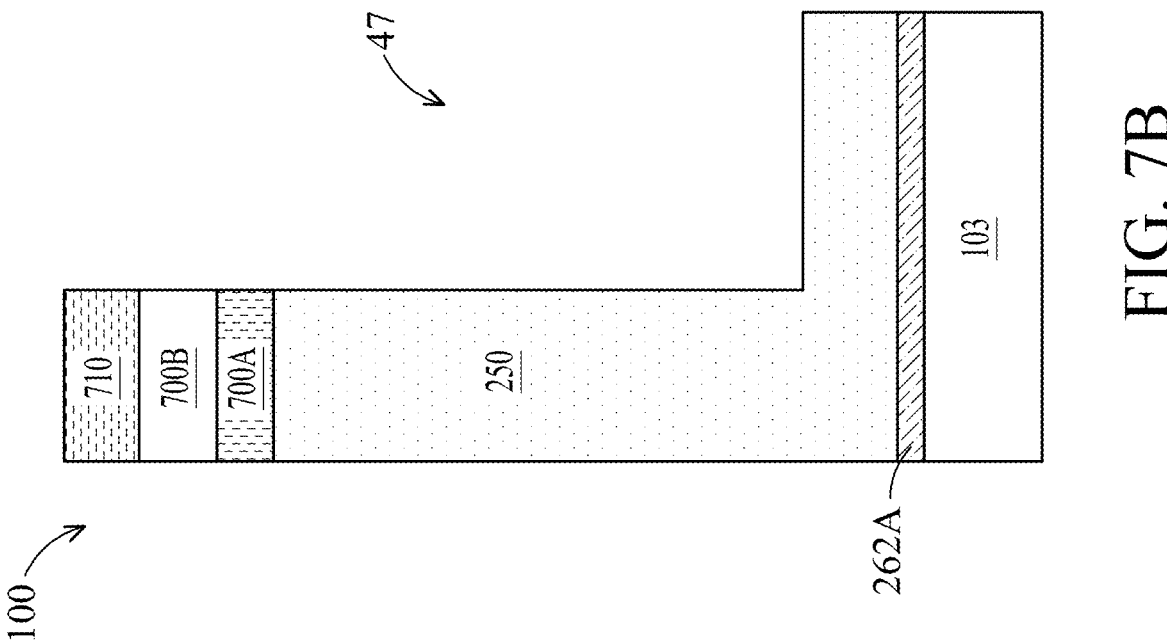
Figure 7A:
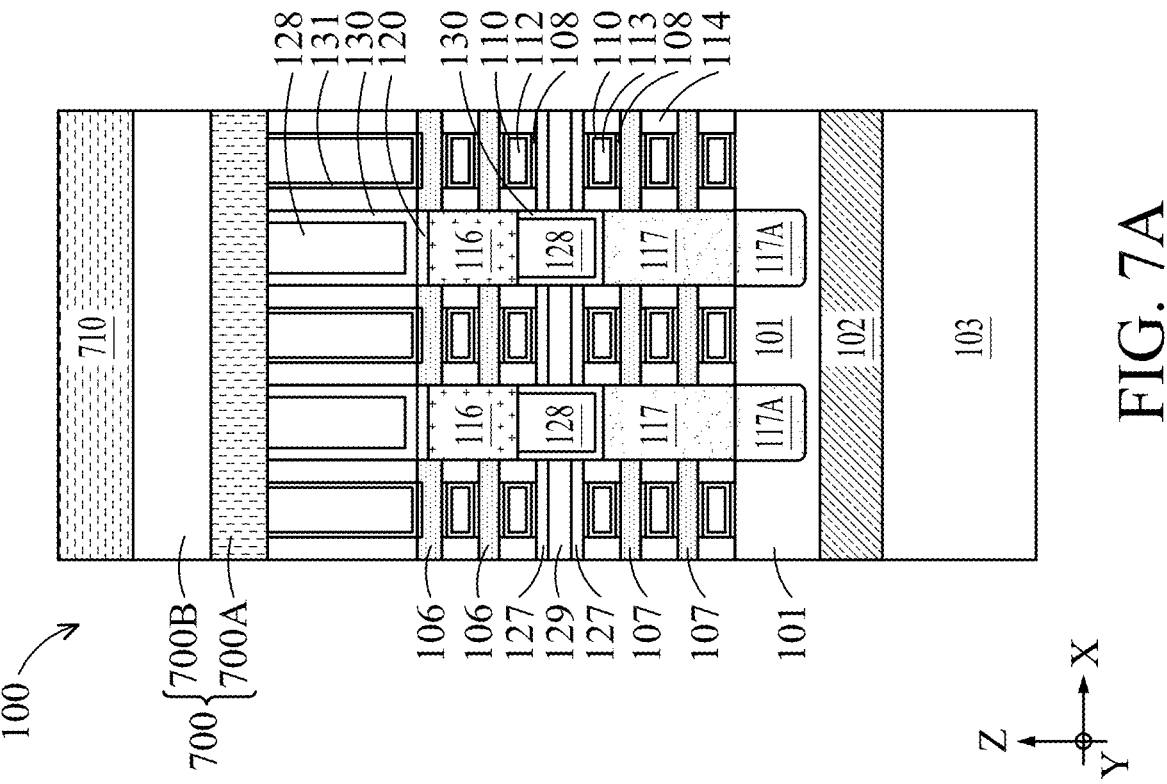
Figure 7C:
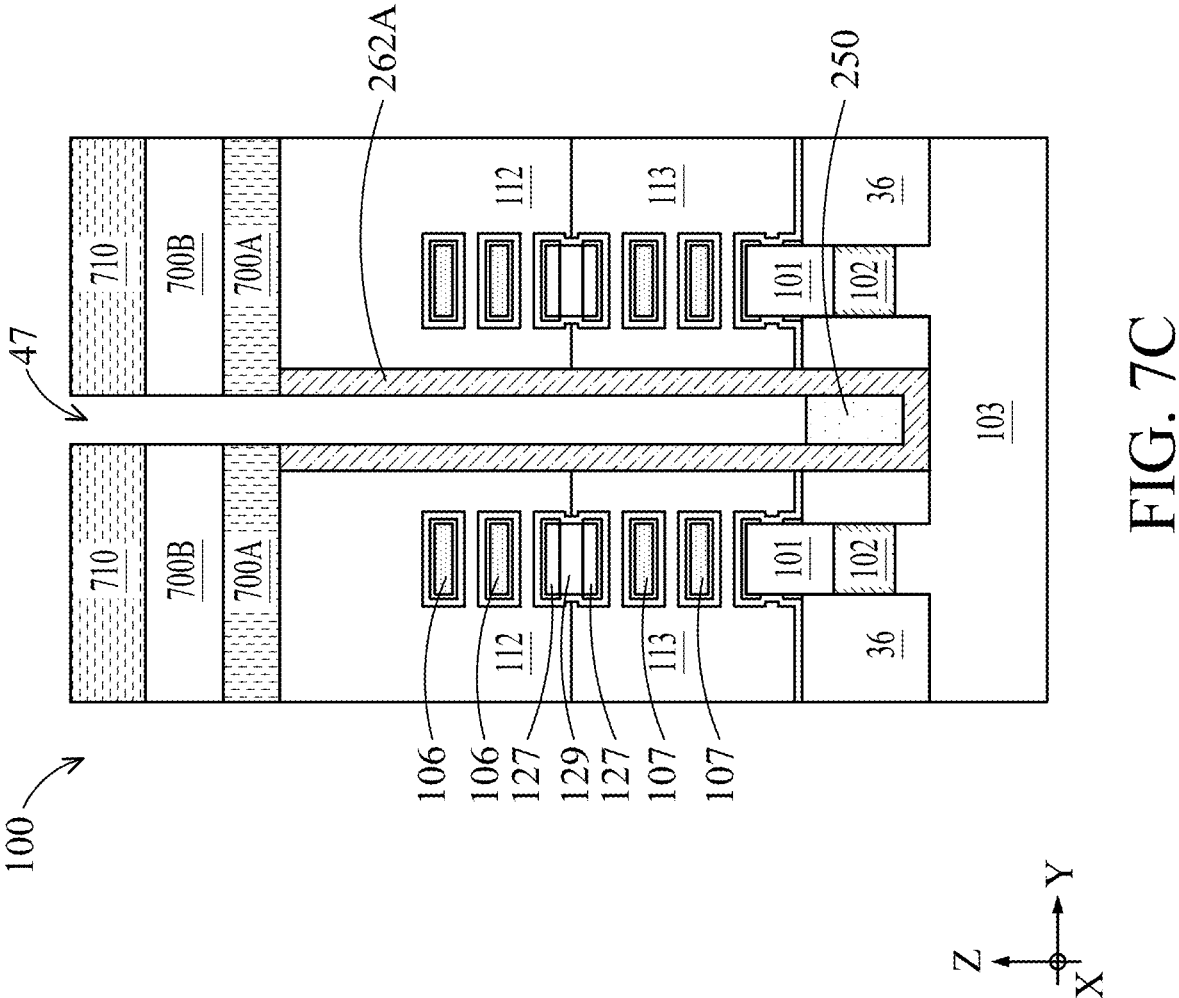
Figure 7E:
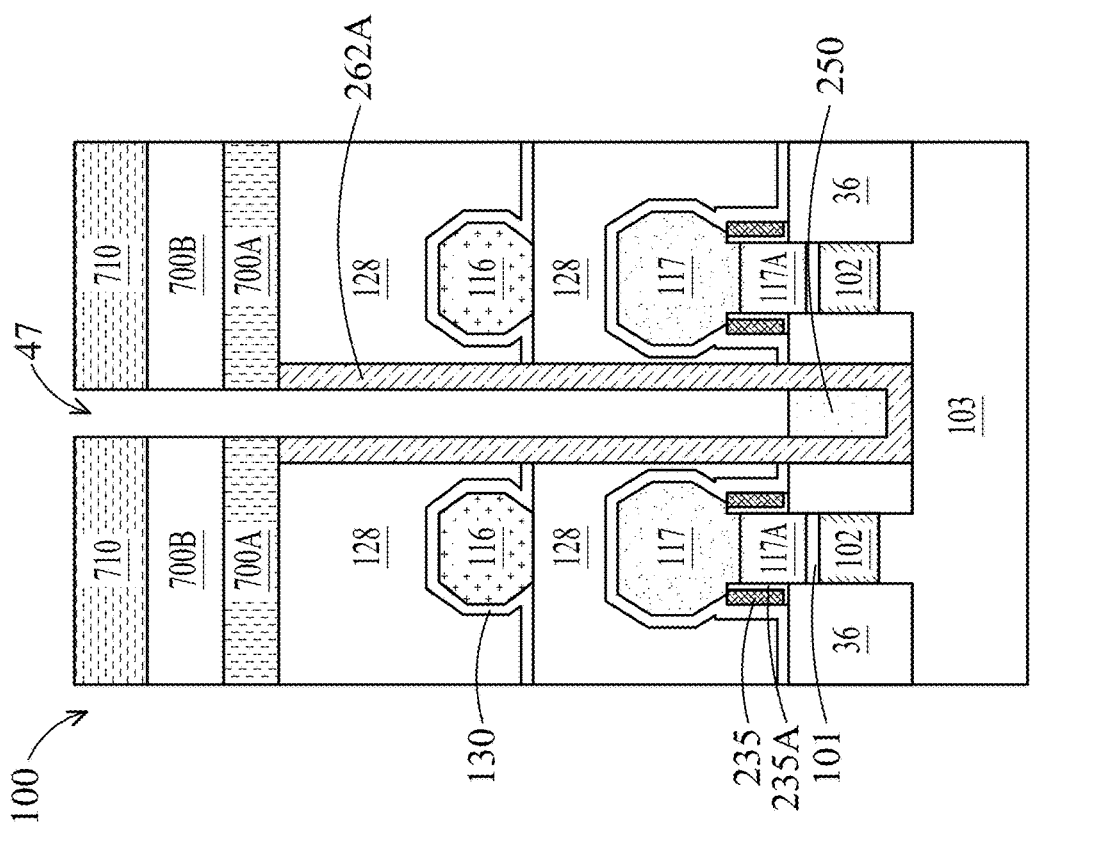
Figure 7D:
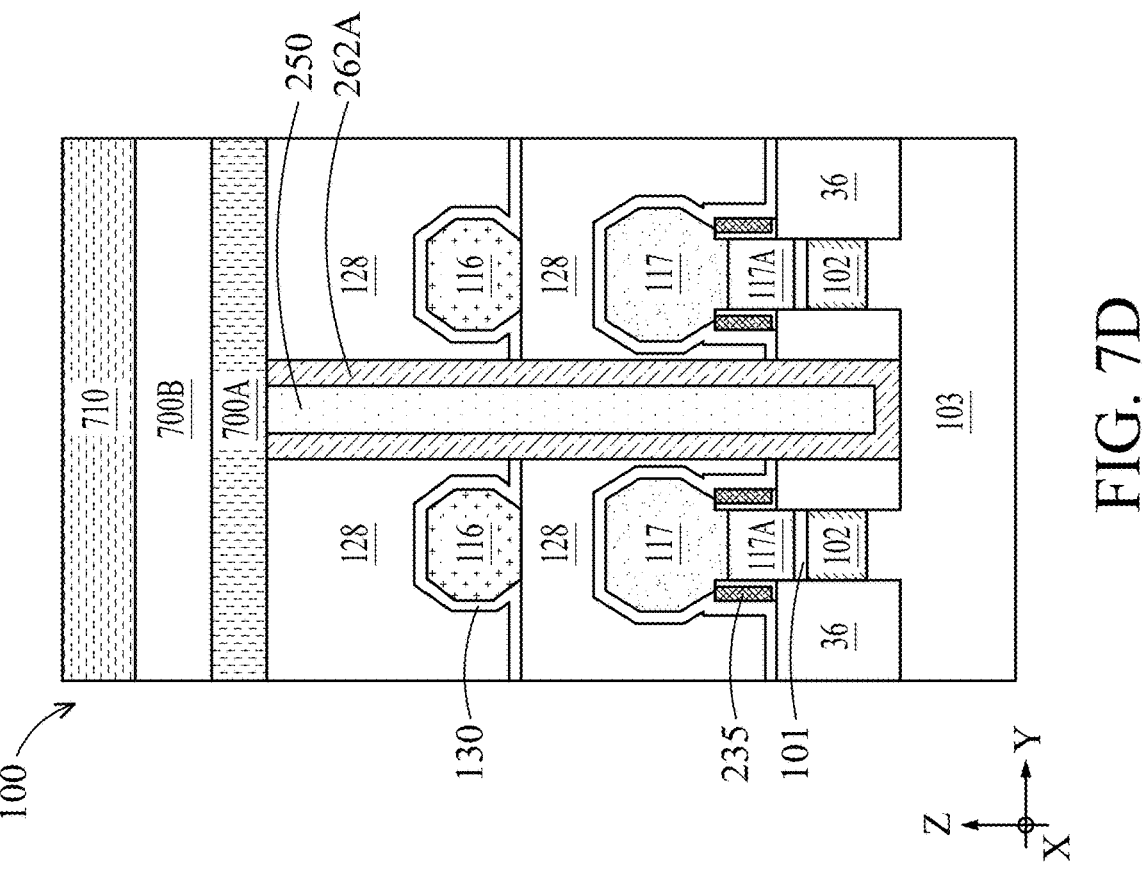
Figure 8B:
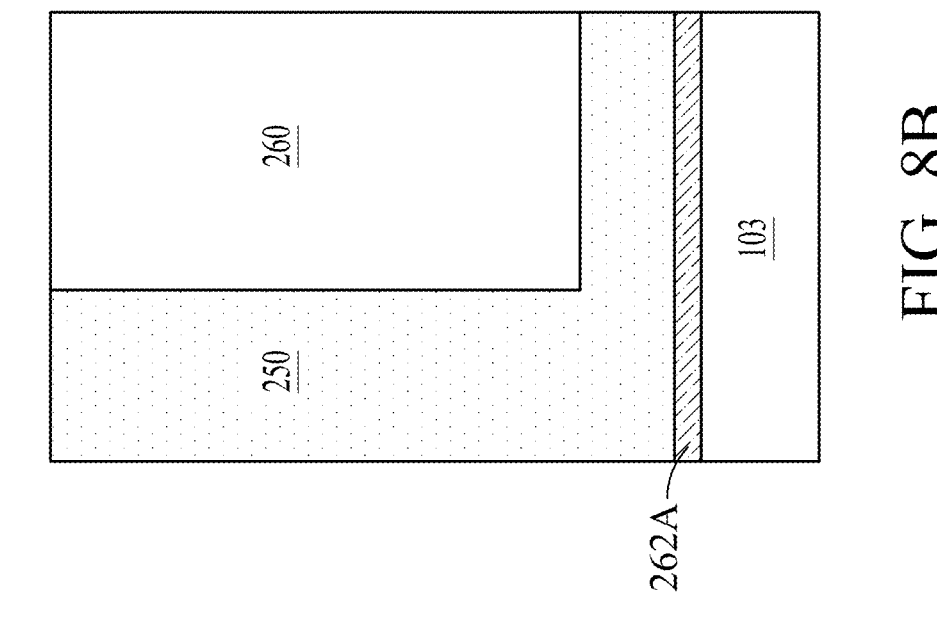
Figure 8A:
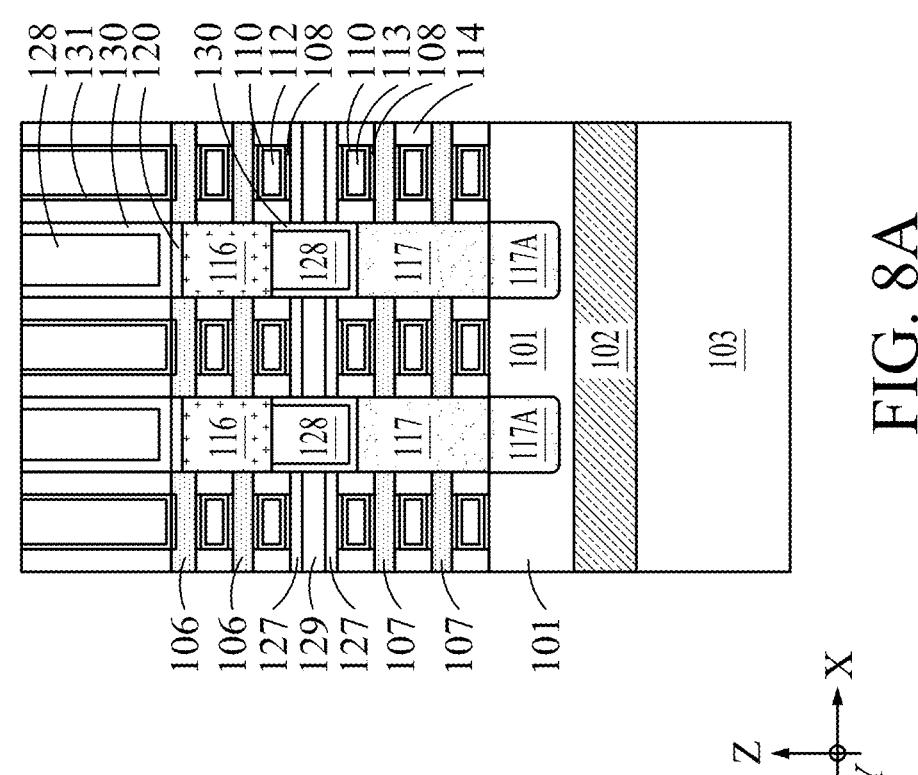
Figure 8C:
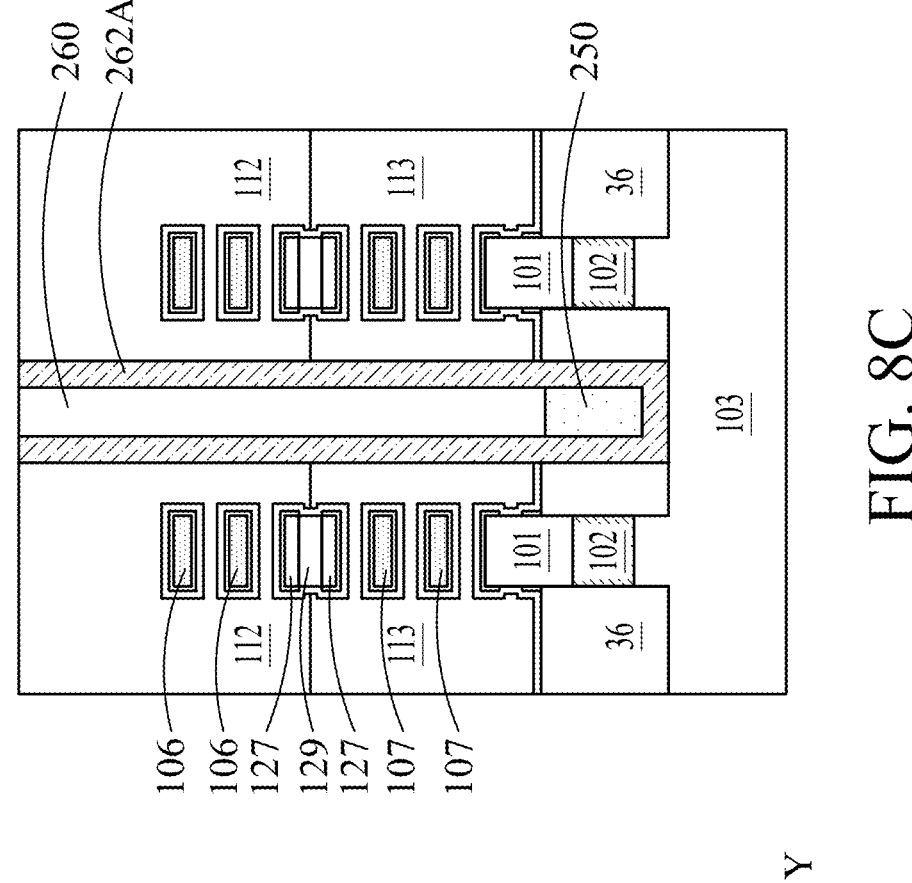
Figure 8C:
Figure 8C:
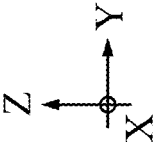
Figures 8D, 8E:
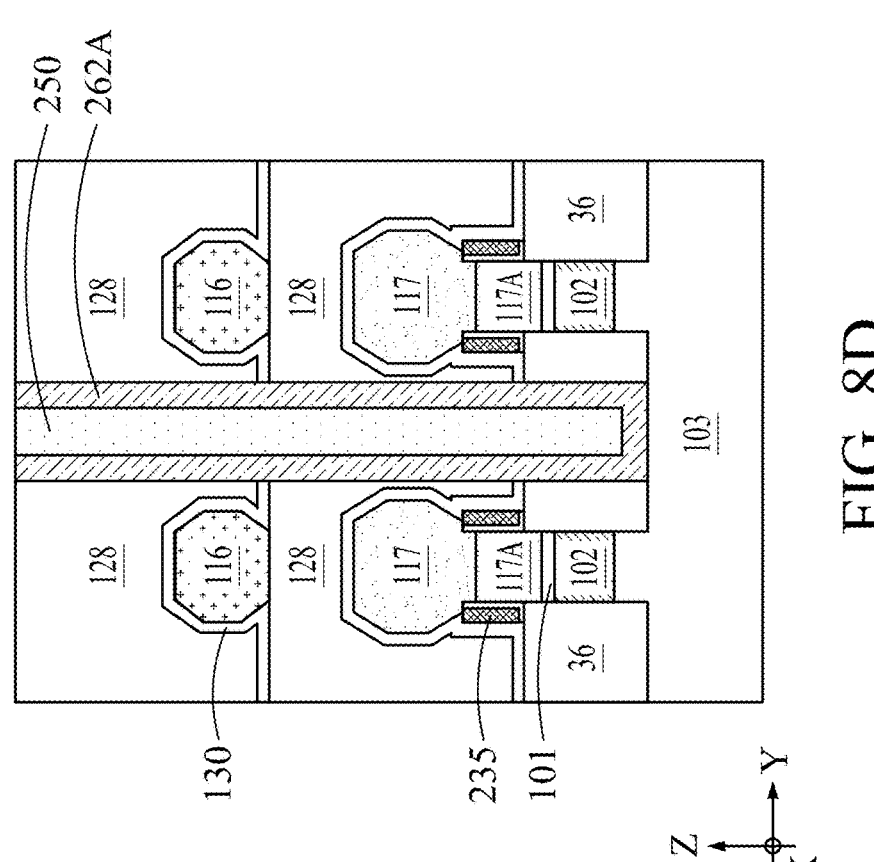

As shown in FIGS. 5F and 5G, in some embodiments, an optional liner layer 262L may be formed prior to forming the gate isolation layer 262A. The liner layer 262L may be or include a low-k dielectric, such as SiLK, porous dielectric, or the like, and can be advantageous for reducing capacitance due to the gate isolation structure 262. The liner layer 262L may be formed by a PVD, CVD, ALD, or other suitable deposition operation. Following formation of the liner layer 262L, the gate isolation layer 262A may be formed on the liner layer 262L. In embodiments including the liner layer 262L, thickness of the gate isolation layer 262A may be thinner, such as in a range of about 3 nm to about 15 nm, though thicknesses greater than 15 nm are also in the considered scope of the embodiments. Generally, the liner layer 262L has lower dielectric constant than the gate isolation layer 262A. In some embodiments, the gate isolation layer 262A is a low-K dielectric layer, and the liner layer 262L has higher dielectric constant than the gate isolation layer 262A.

In FIGS. 6A-6E, a suitable removal process, such as a CMP, grinding, etch, or other similar process is performed to remove material above the dielectric layer 128, including excess material of the gate isolation layer 262A, excess material of the conductive layer 250L, the first mask 400 and the dielectric caps 128C. The gate metal 112 and sidewall spacers 131 may also be recessed slightly by the removal process. Following the removal process, upper surfaces of the gate isolation layer 262A, the conductive layer 250L, the gate metal 112, the sidewall spacers 131, the dielectric layers 128, 130 may be substantially coplanar.

In FIGS. 7A-7E, an opening 47 is formed in the conductive layer 250L, which forms the conductive TSL 250, corresponding to operation 1400 of FIG. 17. Forming the opening 47 may include forming a second mask 700 and a photoresist 710 over the second mask 700. The second mask 700 may include a first mask layer 700A and a second mask layer 700B. One or more of the first and second mask layers 700A, 700B may be a hard mask layer. The opening 47 may be formed by patterning the photoresist 710 to expose the second mask 700, then etching exposed portions of the second mask 700 to expose a portion of the conductive layer 250L. The portion of the conductive layer 250L is then etched through the second mask 700 to form the opening 47. The etching may be any suitable etching operation that is selective to the material of the conductive layer 250L without substantially attacking material of the gate isolation structure 262. The opening 47 may have width in a range of about 0 nm to about 100 nm, and height in a range of about 0 nm to about 150 nm. The opening 47 may be referred to as a "cutout region" of the conductive TSL 250.

Formation of the conductive TSL 250 in the above embodiments includes forming the conductive layer 250L to the top of the metal gate isolation structure 262, then removing a portion thereof to form the cutout region, which is replaced by the dielectric layer 260 formed therein. In some embodiments, the cutout region may be formed without replacing a portion of the conductive layer 250L with the dielectric layer 260. For example, a lower portion of the conductive TSL 250 may be formed in a first operation. The lower portion may have height that is less than that of a first opening in which the conductive TSL 250 is to be formed. Then, in a second operation, the dielectric layer 260 may be formed in remaining space of the first opening over the lower portion of the conductive TSL 250. Following formation of the dielectric layer 260, the dielectric layer 260 may be patterned to form a second opening exposing the lower portion of the conductive TSL 250, after which an upper portion of the conductive TSL 250 that is narrower than the lower portion may be deposited in the second opening. A CMP may be performed to remove excess material of the upper portion above the second opening.

In FIGS. 8A-8E, following formation of the opening 47, the second mask 700 and photoresist 710 may be removed, and the dielectric layer 260 may be formed in the opening 47, as shown, corresponding to operation 1500 of FIG. 17. The dielectric layer 260 may inherit the shape of the opening 47. The dielectric layer 260 may have width in a range of about 0 nm to about 100 nm, and height in a range of about 0 nm to about 150 nm. Formation of the dielectric layer 260 may include PVD, CVD, ALD, or another suitable deposition operation. Following deposition of the dielectric layer 260, excess material of the dielectric layer 260 above the upper surface of the conductive TSL 250 may be removed by a suitable operation, such as a CMP. The dielectric layer 260 may be said to be in the cutout region of the conductive TSL 250.

In FIGS. 9A-9E, following formation of the dielectric layer 260, the frontside source/drain contacts 220F may be formed, corresponding to operation 1600 of FIG. 17. Forming the frontside source/drain contacts 220F may include forming the ILD 140, patterning the ILD 140 to form openings that expose the source/drain regions 116, then forming the frontside source/drain contacts 220F in the openings. For example, the liner layer 122 may be formed by depositing a material thereof in the openings on the source/drain regions 116. Following deposition of the liner layer 122, the conductive layer 124 may be formed in the openings on the liner layer 122. A suitable annealing operation may be performed to form the silicides 120, which follows formation of the liner layer 122, and may be before or after formation of the conductive layer 124. The silicide 120 can include titanium silicide, aluminum silicide, nickel silicide, tungsten silicide, or other suitable silicides. The frontside source/drain contacts 220F may also include the conductive or liner layer 122 positioned on the silicide 120. The conductive layer 122 can include titanium nitride, tantalum nitride, titanium, tantalum, or other suitable conductive materials. The frontside source/drain contacts 220F may also include the conductive layer 124 on the conductive layer 122. The conductive layer 124 can include a conductive material such as tungsten, cobalt, ruthenium, titanium, aluminum, tantalum, or other suitable conductive materials. Other materials and configurations can be utilized for the frontside source/drain contacts 220F without departing from the scope of the present disclosure. After formation of the frontside source/drain contacts 220F, a chemical mechanical planarization (CMP) process may be performed.

Following formation of the frontside source/drain contacts 220F, an etch stop layer 142 and a second ILD 360 may be formed over the frontside source/drain contacts 220F. In subsequent operations, metallization features, such as vias, wires or traces may be formed in the second ILD 360 to contact the frontside source/drain contacts 220F to form electrical connections between the source/drain regions 116 and other transistors of the integrated circuit 100. For example, as shown in FIG. 9E, a source/drain via 320 is formed through the second ILD 360 and the etch stop layer 142, to land on the conductive layer 124 of the frontside source/drain contact 220F.

Figures 9A, 9B:
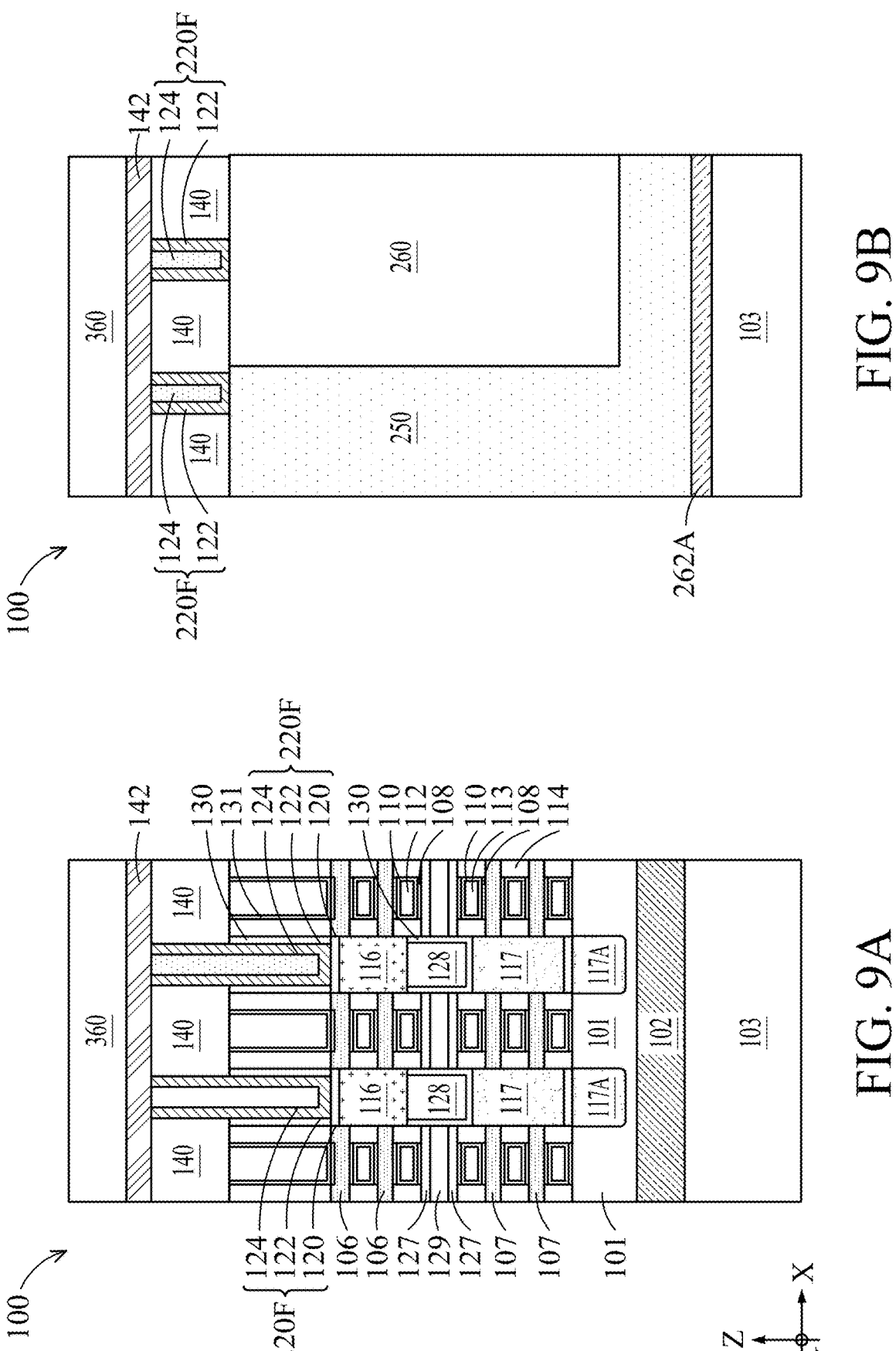
Figure 9C:
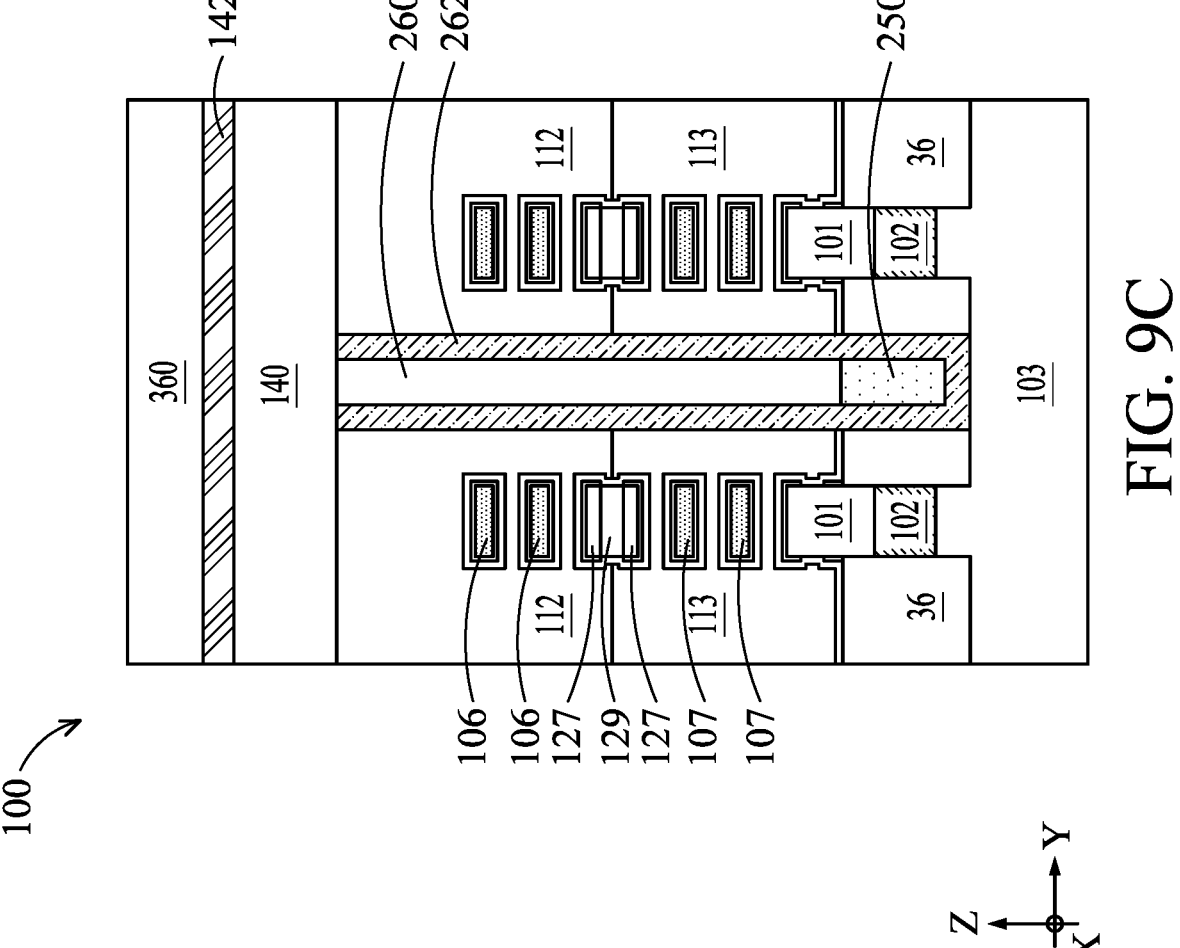
Figure 9E:
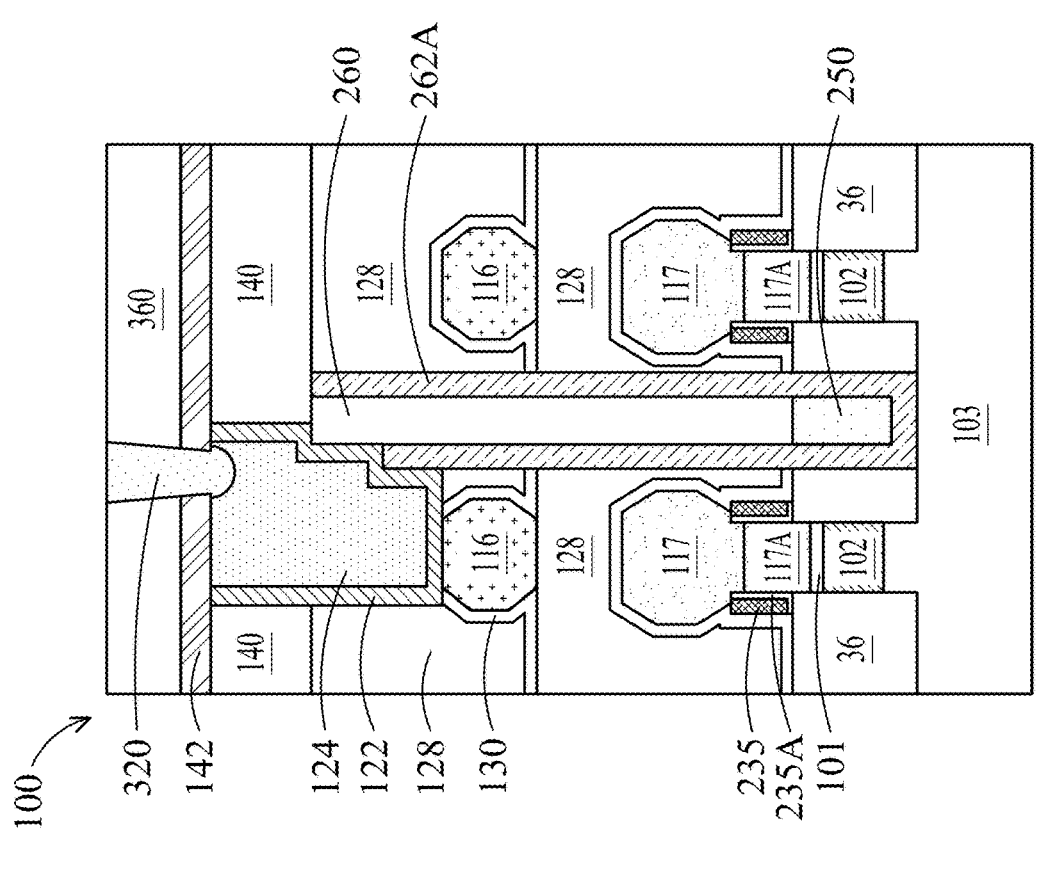
Figure 9D:
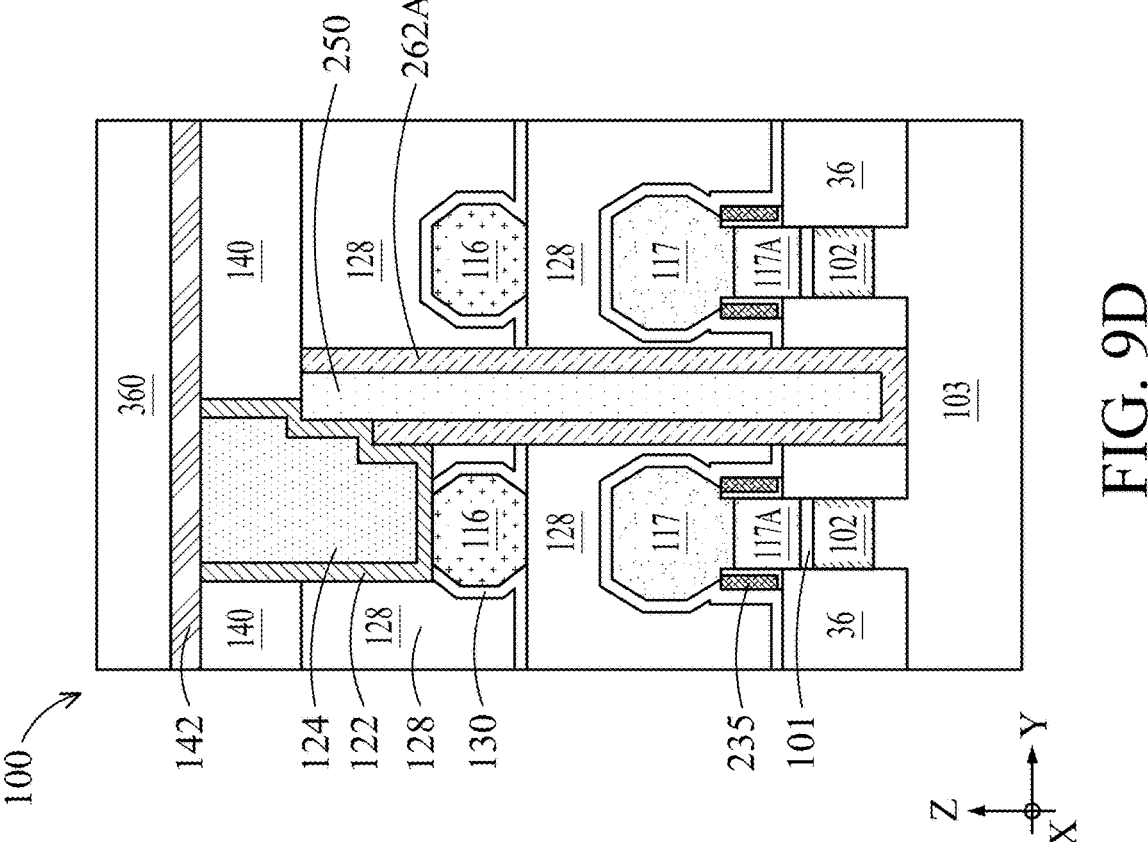

FIGS. 9D and 9E illustrate the frontside source/drain contacts 220F in the YZ plane. The silicides 120 are omitted from view in FIGS. 9D and 9E. As shown, the frontside source/drain contacts 220F land on the source/drain regions 116, the gate isolation layer 262A and one of the conductive TSL 250 (FIG. 9D) or the dielectric layer 260 (FIG. 9E). In FIG. 9E, because the frontside source/drain contact 220F can land on the dielectric layer 260, the frontside source/drain contact 220F may be larger, lowering resistance, and overlay accuracy between the frontside source/drain contact 220F and the source/drain region 116 may be relaxed, leading to better yield.

The source/drain contacts 118 may include silicide 120. The silicide 120 is formed at the top of the source/drain regions 116.

Figures 9F, 9G:
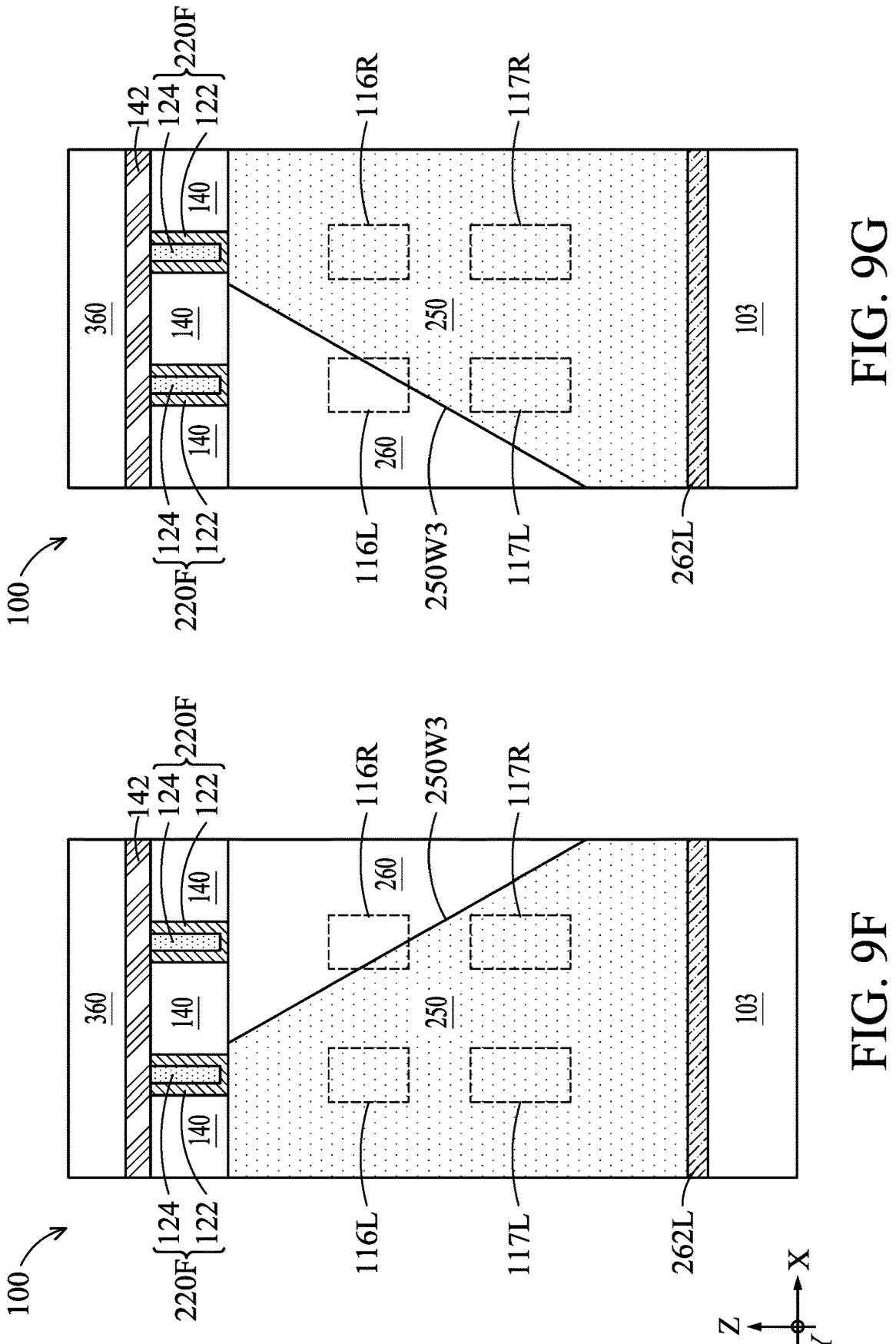

FIGS. 9F and 9G illustrate the conductive TSL 250 having a different shape than that shown in FIG. 9B. In some embodiments, the conductive TSL 250 is formed having a tapered sidewall 250W3. The conductive TSL 250 has pentagonal shape with five sides. As shown, of the four source/drain regions 116L, 116R, 117L, 117R corresponding to the two adjacent CFETs, the conductive TSL 250 may fully overlap two or three of the source/drain regions (e.g., the source/drain regions 116L, 117L, 117R of FIG. 9F), and may partially overlap or not overlap one or two of the source/drain regions (e.g., the source/drain region 116R of FIG. 9F). The pentagonal shape illustrated in FIGS. 9F and 9G reduces resistance of the conductive TSL 250 while maintaining some reduction in the parasitic capacitance between the conductive TSL 250 and the source/drain regions 116R, 117R.

It should be understood that other shapes or profiles in the XZ plane for the conductive TSL 250 are included in various embodiments. For example, the conductive TSL 250 may have a curved sidewall instead of the tapered sidewall 250W3. The curved sidewall may allow for the first source/drain region 116R to be completely not overlapped by the conductive TSL 250 while increasing volume of the conductive TSL 250, which reduces resistance thereof.

In FIGS. 10A-10E, backside source/drain contacts 220B are formed, corresponding to operation 1700 of FIG. 17. Forming the backside source/drain contacts 220B may include flipping the integrated circuit 100 so that the bottom of the substrate 101 and the sacrificial layers 102, 103 are exposed. Prior to forming the backside source/drain contacts 220B, the sacrificial layers 103, 102 may be removed, for example by grinding or etching, then a third ILD 350 may be formed by depositing a dielectric material on the backside of the substrate 101. The third ILD 350 may include one or more of silicon oxide, silicon nitride, silicon oxynitride, silicon carbonitride, silicon oxycarbonitride, fluorine-doped silicate glass (FSG), a low-K dielectric material or other dielectric materials. The third ILD 350 can be deposited by CVD, PVD, or ALD. A CMP process may then be performed. Following formation of the third ILD 350, openings may be formed in the third ILD 350 and the substrate 101 to expose the bottom surfaces of the source/drain regions 117 and the conductive TSL 250.

Figures 10A, 10B:
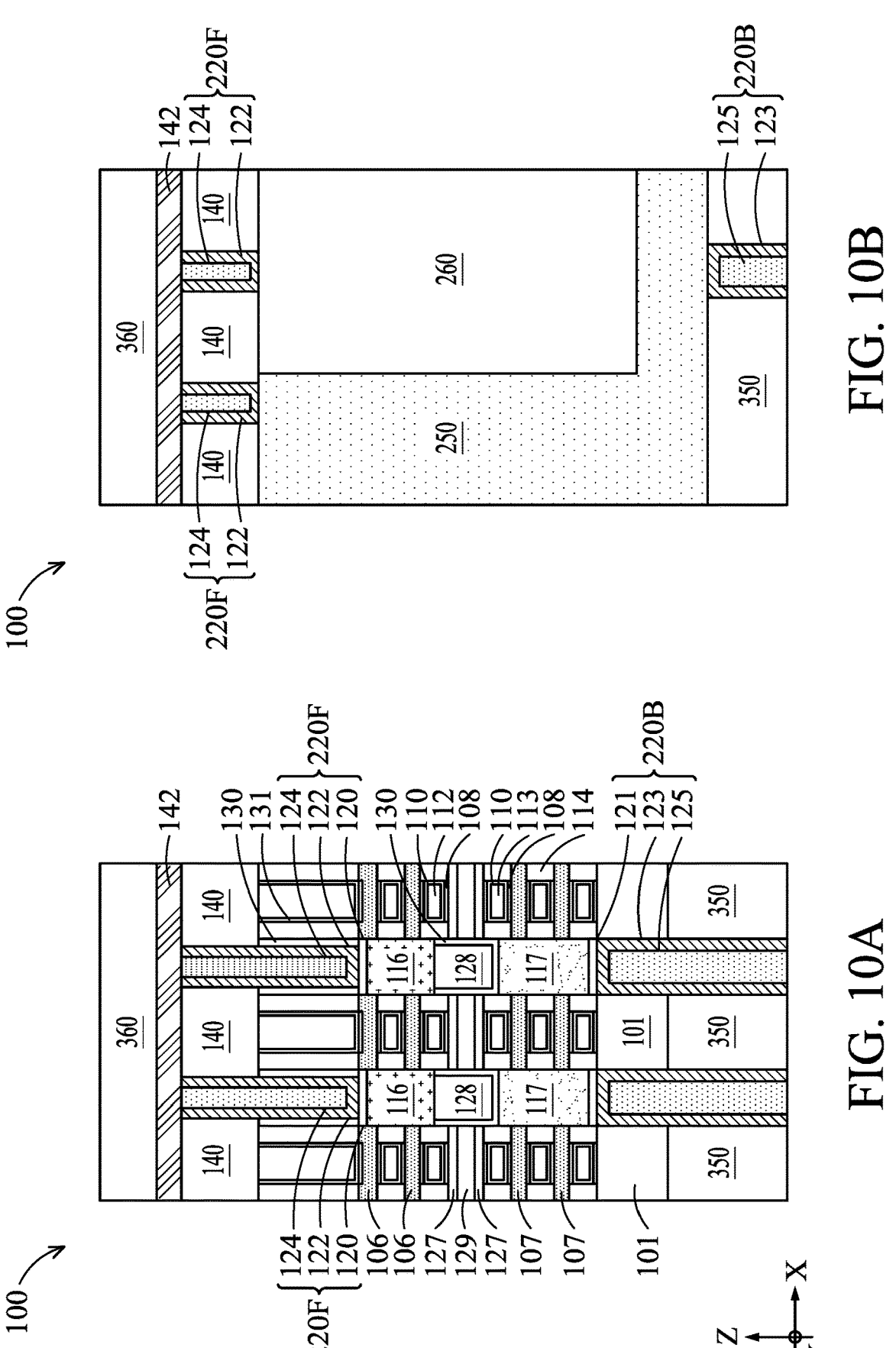
Figure 10C:
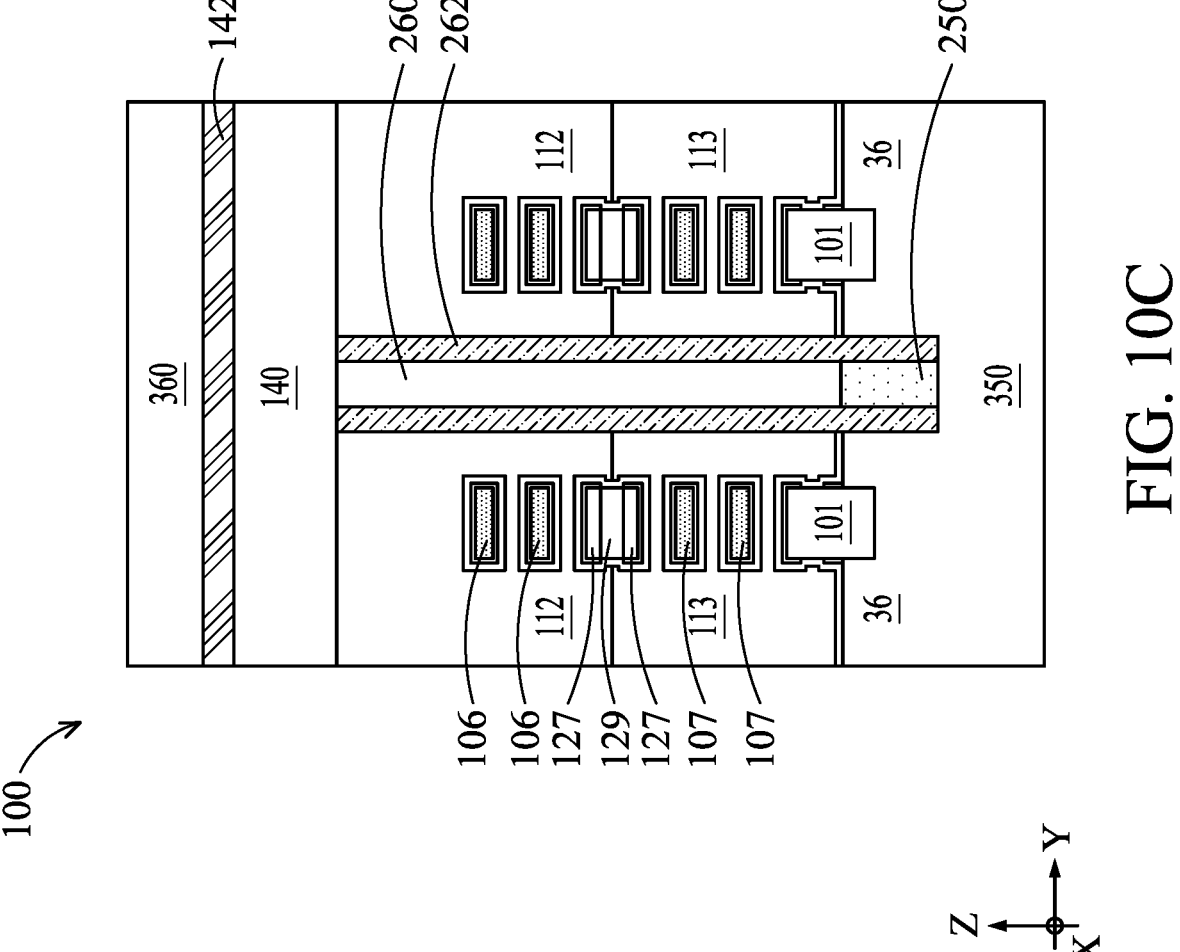
Figures 10D, 10E:
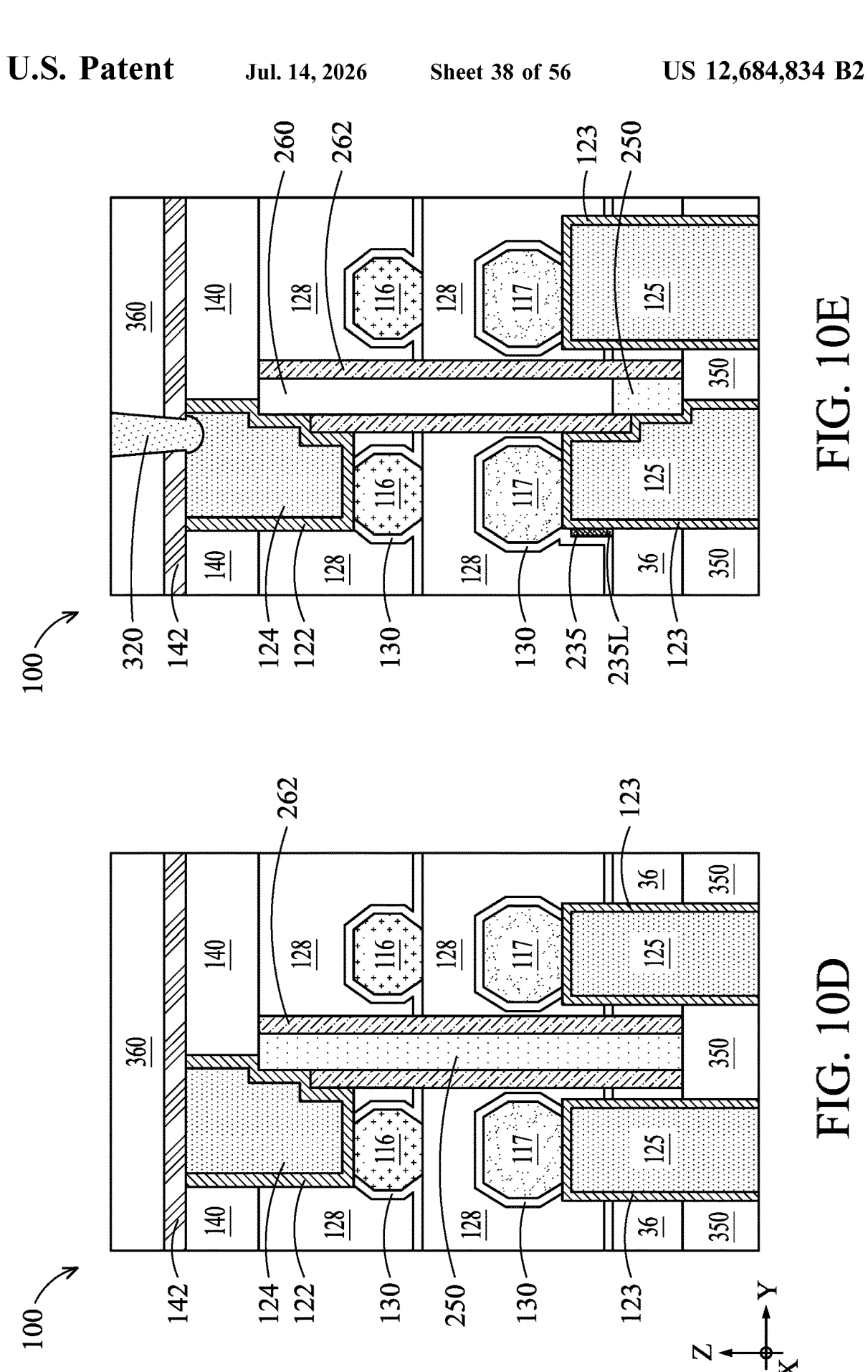

Then, the liner layer 123 and the conductive layer 125 may be deposited in the openings to contact the source/drain regions 117 and the conductive TSL 250. As shown in FIG. 10E, a backside source/drain contact 220B contacting the conductive TSL 250 may land on the conductive TSL 250, the gate isolation structure 262 and the source/drain region 117. For example, the backside source/drain contact 220B may be in contact with the bottom surface of the conductive TSL 250 and with a sidewall of the conductive TSL 250. Other backside source/drain contacts 220B that do not contact the conductive TSL 250 may be separated from the conductive TSL 250 by the isolation regions 36, the dielectric layer 128 and the gate isolation structure 262.

The backside source/drain contacts 220B may include silicide 121, which is omitted from view in FIGS. 10D and 10E. The silicide 121 is formed at the bottom of the source/drain regions 117. The silicide 121 can include titanium silicide, aluminum silicide, nickel silicide, tungsten silicide, or other suitable silicides. The backside source/drain contacts 220B may also include a conductive or liner layer 123 positioned on the silicide 121. The conductive layer can include titanium nitride, tantalum nitride, titanium, tantalum, or other suitable conductive materials. The backside source/drain contacts 220B may also include a conductive layer 125 on the conductive layer 123. The conductive layer 125 can include a conductive material such as tungsten, cobalt, ruthenium, titanium, aluminum, tantalum, or other suitable conductive materials. Other materials and configurations can be utilized for the backside source/drain contacts 220B without departing from the scope of the present disclosure. After formation of the backside source/drain contacts 220B, a CMP process may be performed.

FIGS. 11A-14E illustrate formation of the conductive TSL 250 having inverted shape in the integrated circuit 100A in accordance with various embodiments.

Figures 11A, 11B:
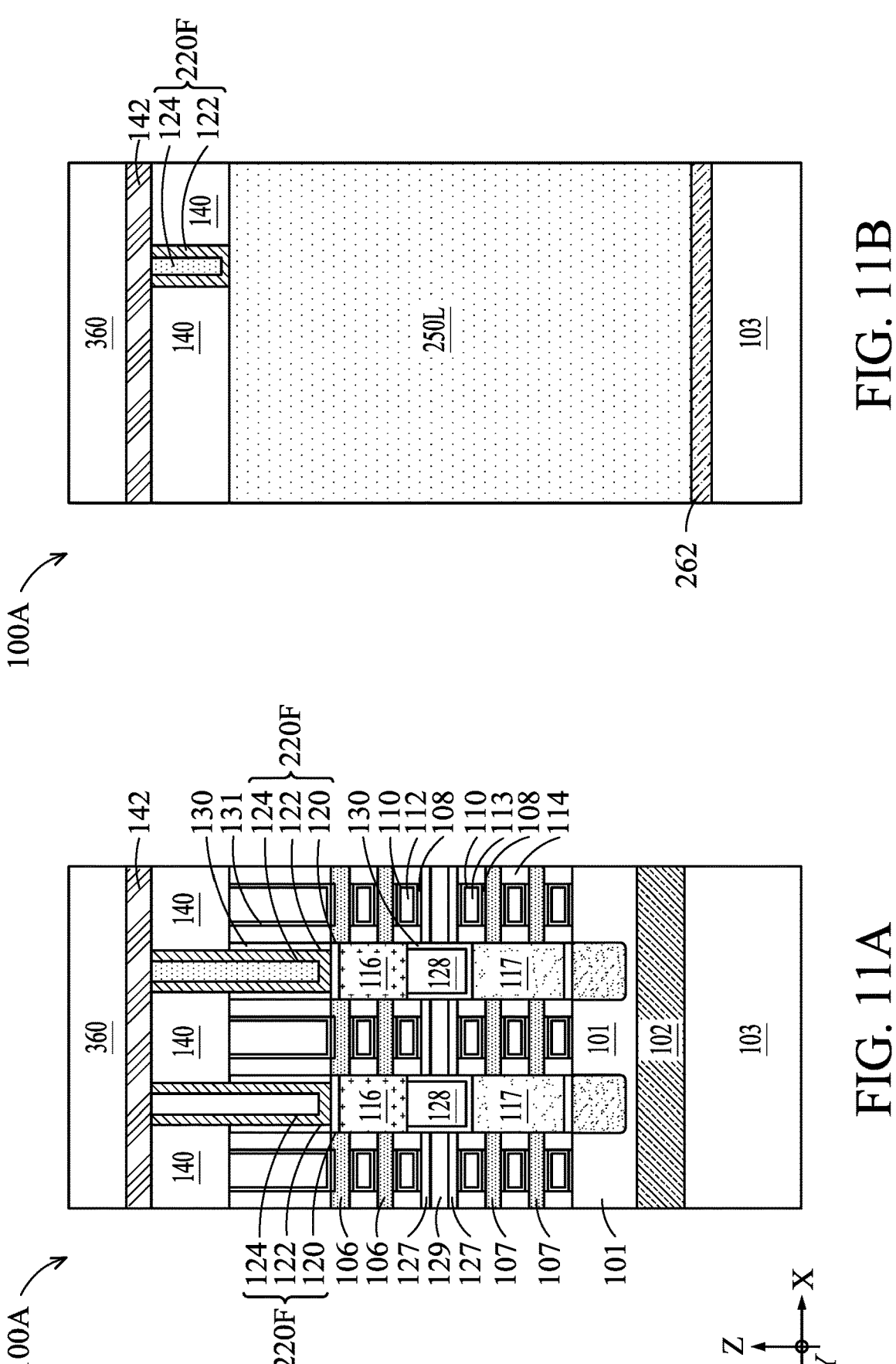
Figure 11C:
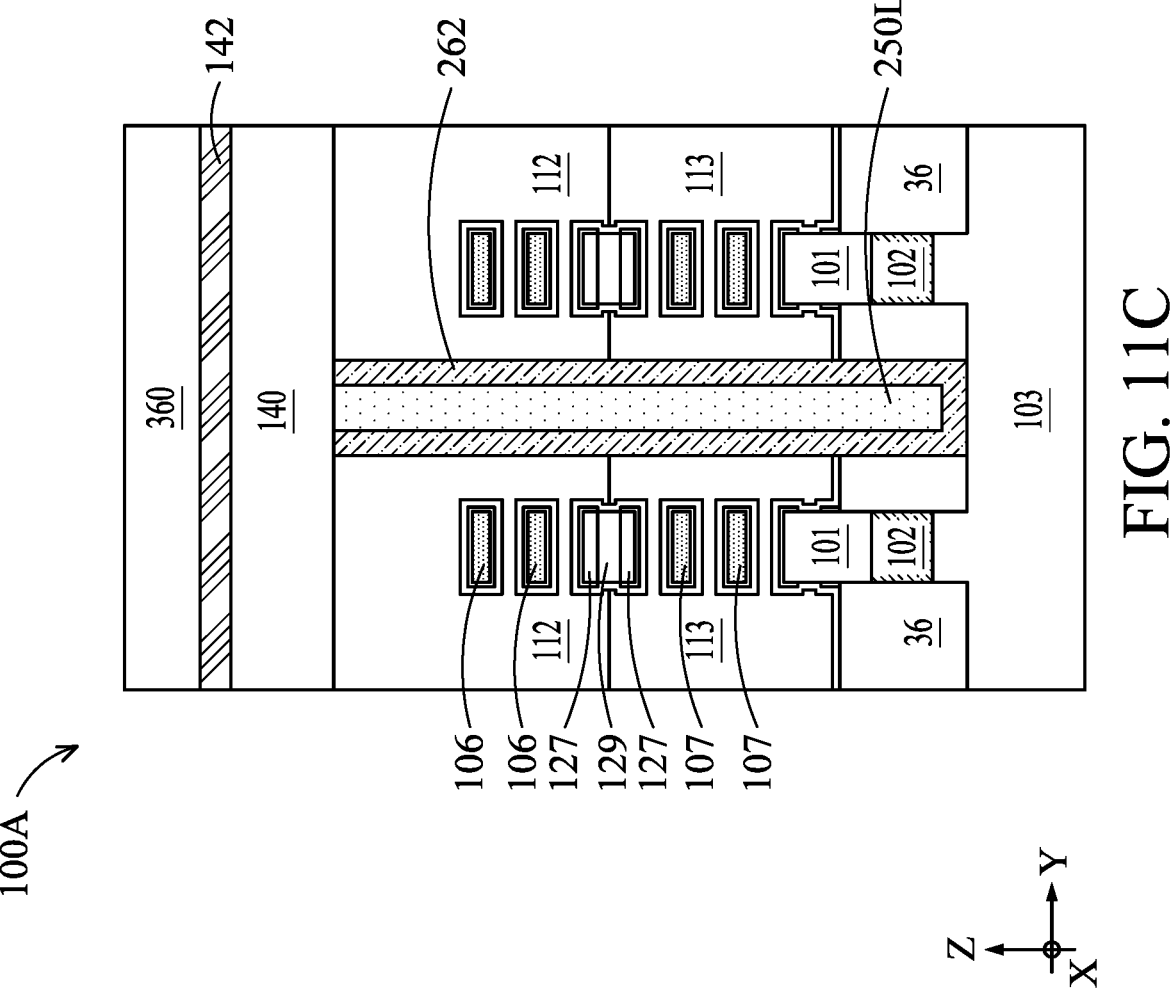
Figures 11D, 11E:
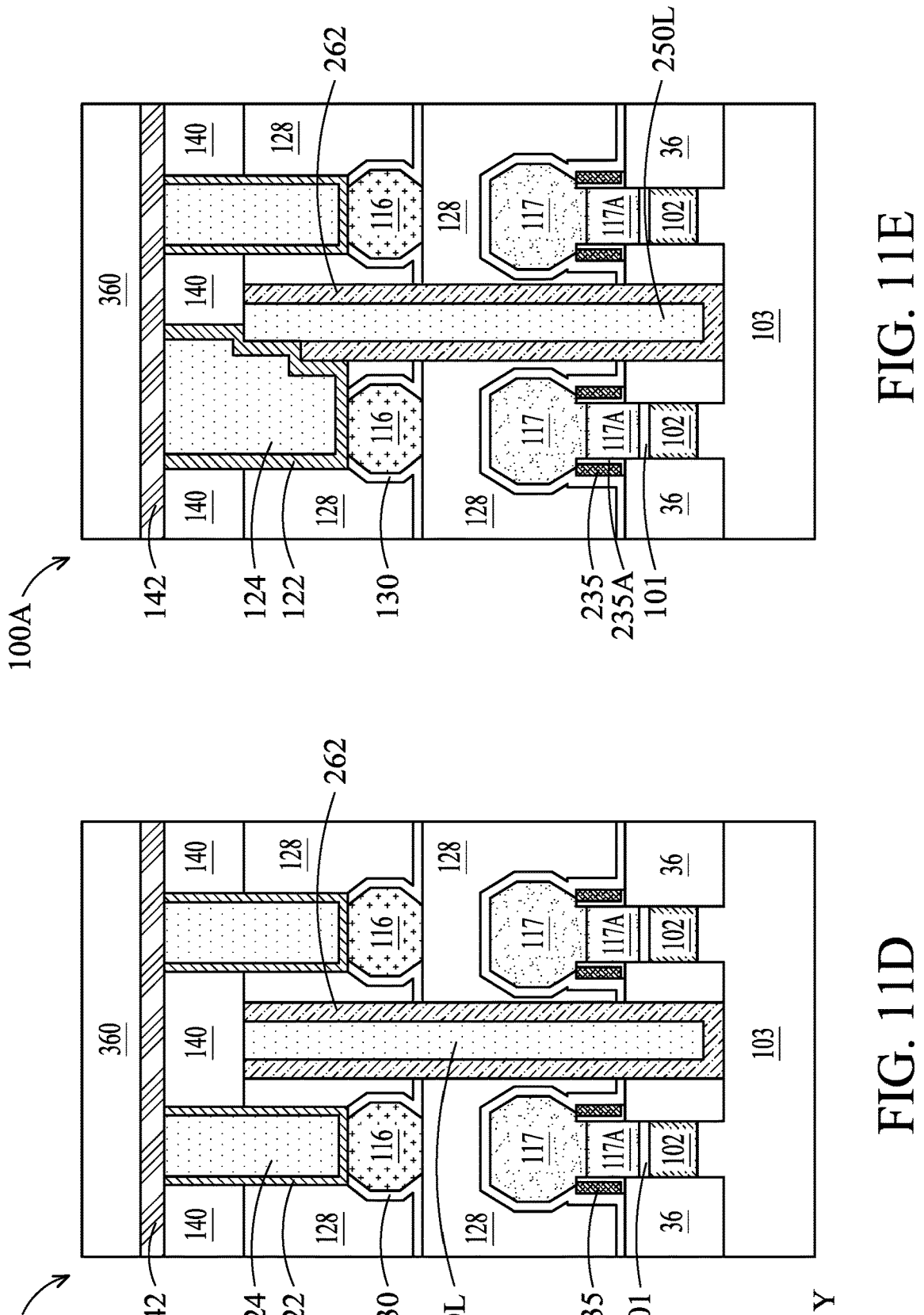

In FIGS. 11A-11E, following the operations shown in FIGS. 6A-6E, frontside source/drain contacts 220F are formed similar to described with reference to FIGS. 9A-9E, but prior to forming the opening 47 in the conductive layer 250L, corresponding to operation 2400 of FIG. 18. As shown in FIGS. 11B and 11E, one or more of the frontside source/drain contacts 220F may land on the conductive layer 250L and a source/drain region 116. Detailed operations of forming the frontside source/drain contacts 220F are described with reference to FIGS. 9A-9E.

In FIGS. 12A-12G, following formation of the frontside source/drain contacts 220F, the integrated circuit 100A may be flipped, and the second sacrificial layer 103 may be removed to expose the first sacrificial layer 102. A fourth mask 800 and photoresist 810 may be formed on the first sacrificial layer 102, then the fourth mask 800 may be patterned using the photoresist 810 to form opening 53. The fourth mask 800 may be a hard mask, and may include a first mask layer 800A and a second mask layer 800B. The opening 53 may be extended into the conductive layer 250L to form the conductive TSL 250 having the inverted-L shape shown in FIG. 12B, corresponding to operation 2500 of FIG. 18.

Figures 12A, 12B:
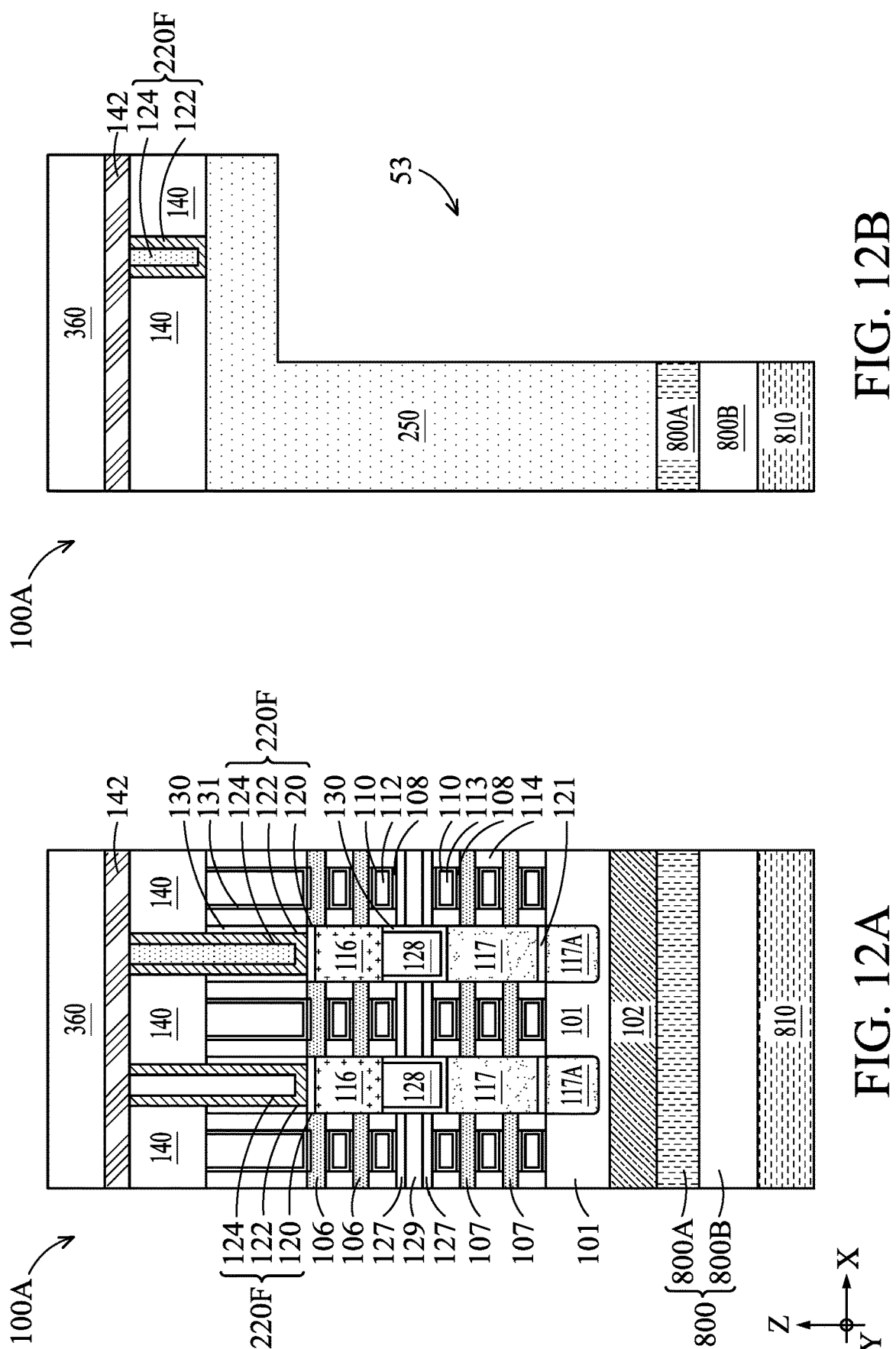
Figure 12C:
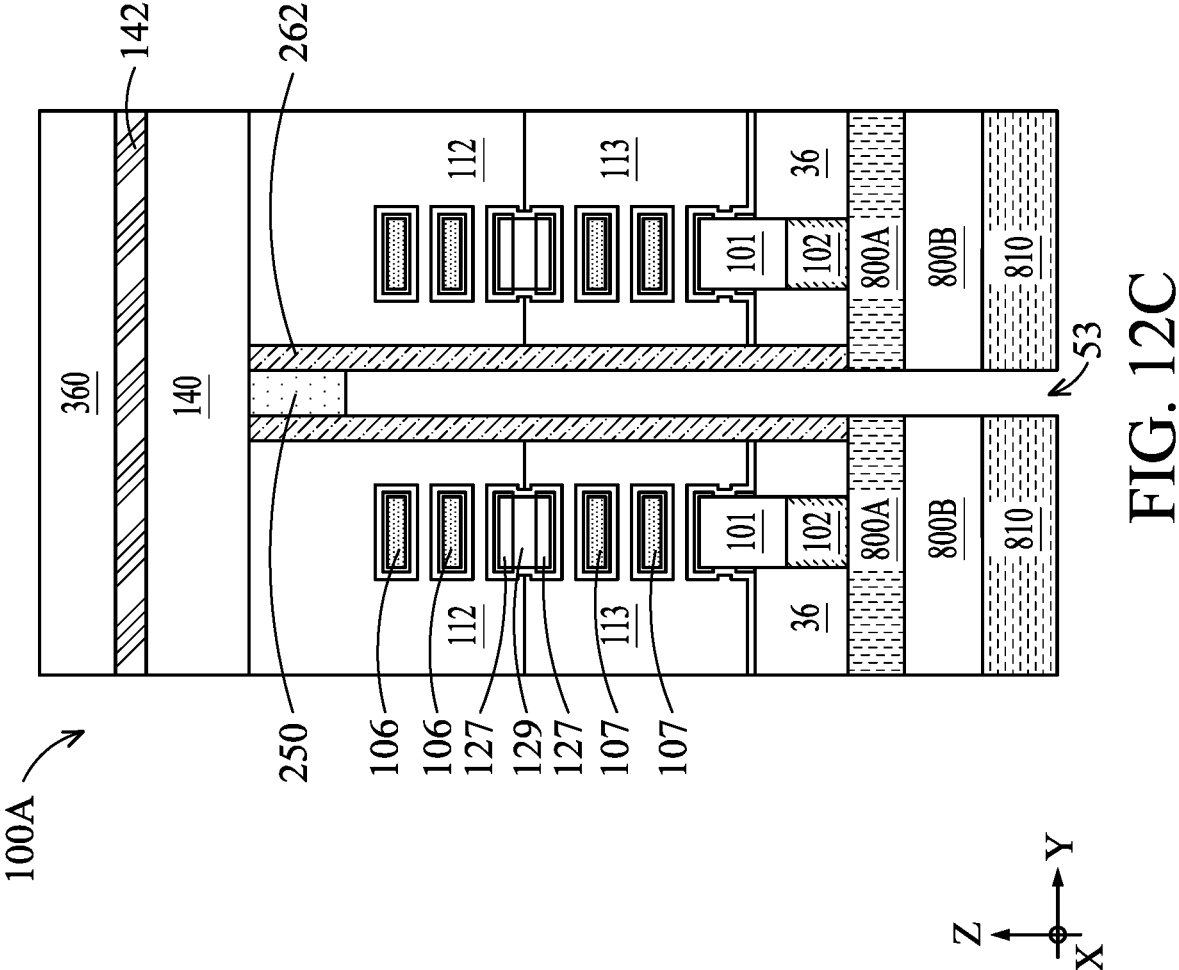
Figures 12D, 12E:
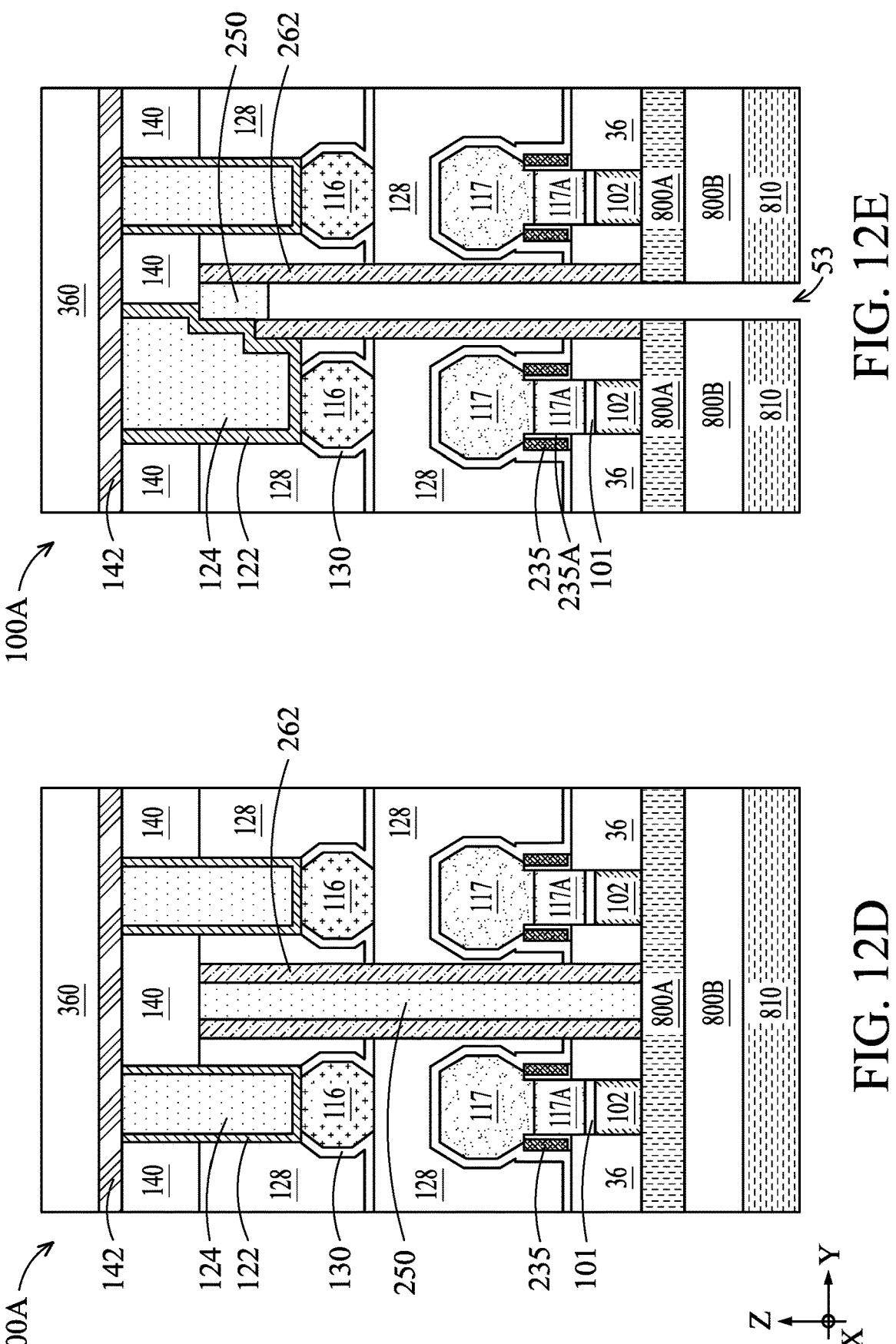
Figure 12G:
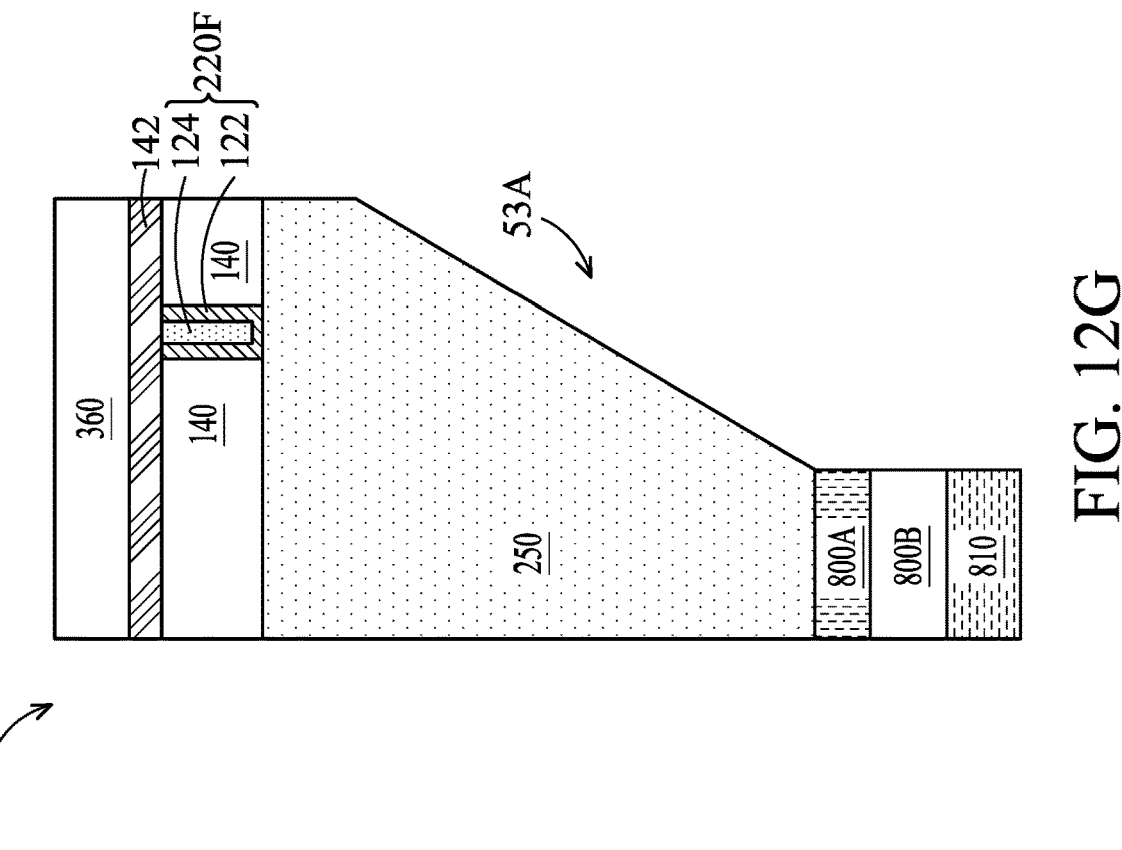
Figure 12F:
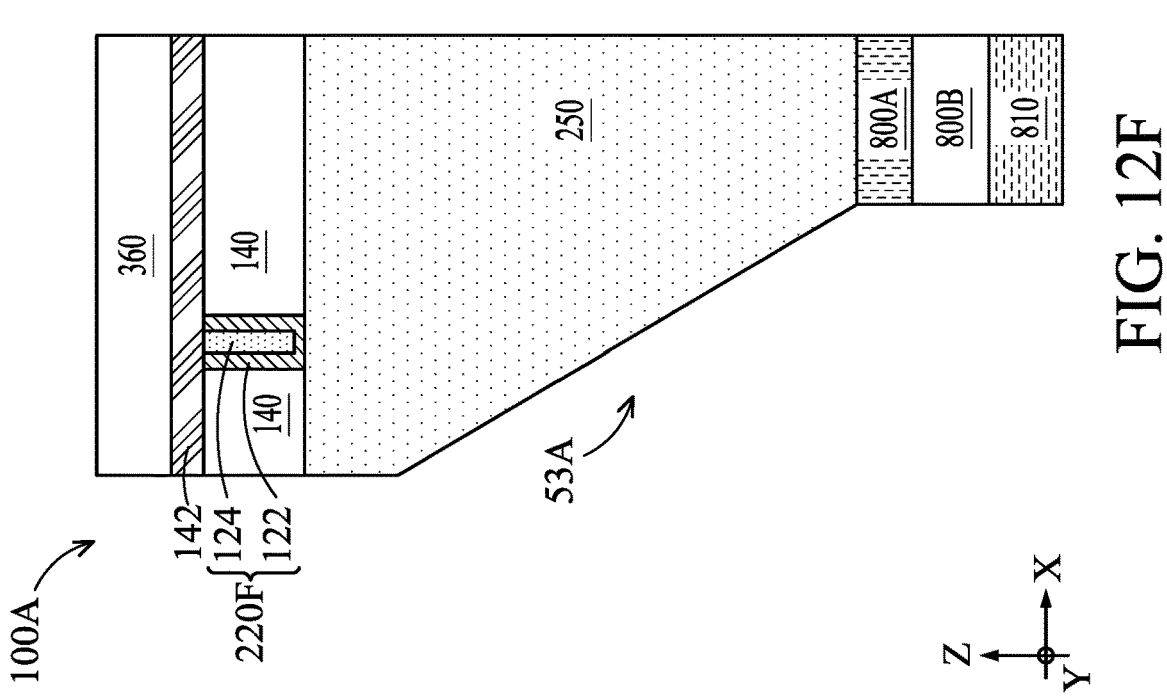

In FIGS. 12F and 12G, in some embodiments, an opening 53A is formed instead of the opening 53. The opening 53A forms the tapered sidewall 250W3, as shown. Formation of the openings 53, 53A is similar to that described with reference to FIGS. 7A-7E.

Figures 13A, 13B:
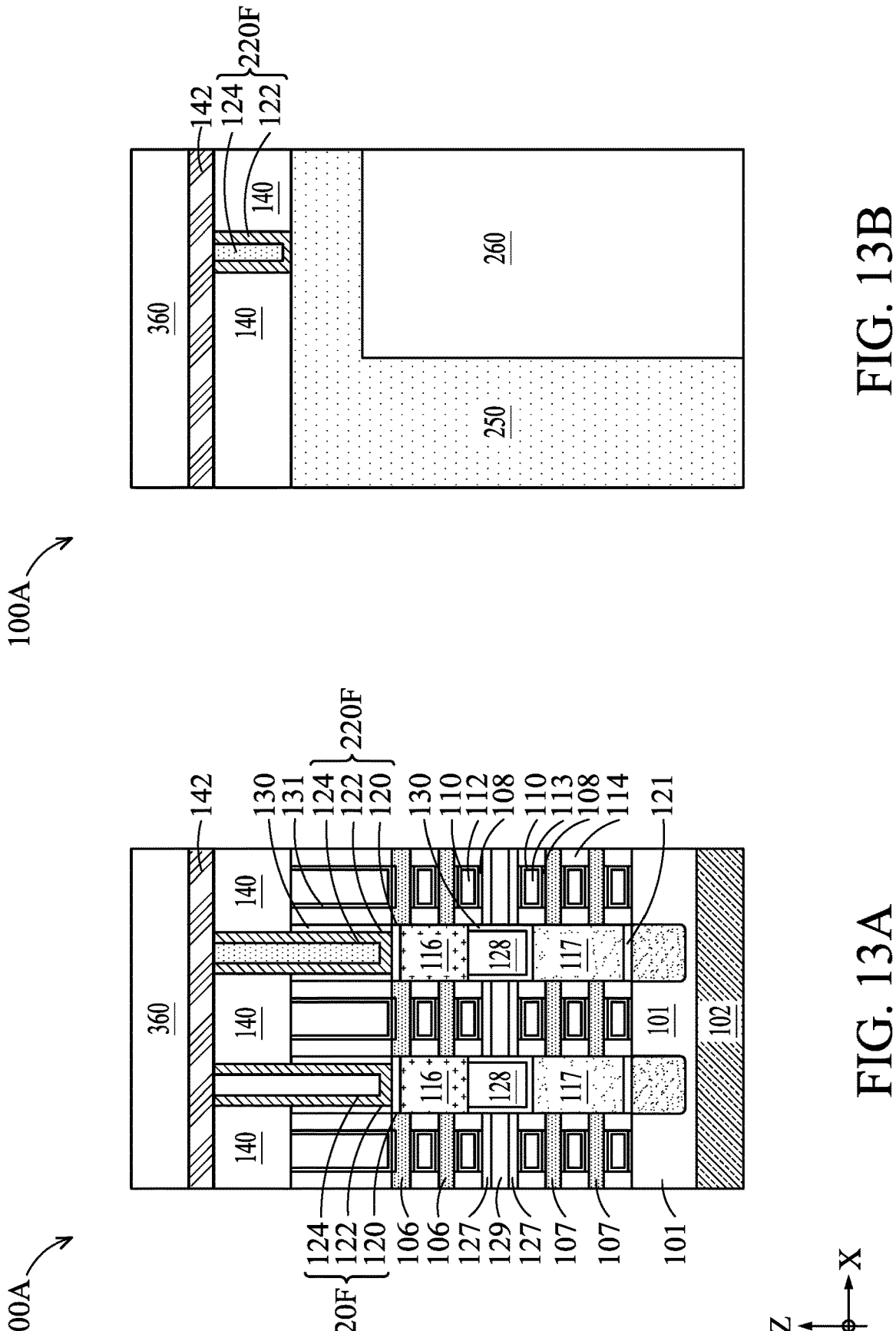
Figure 13C:
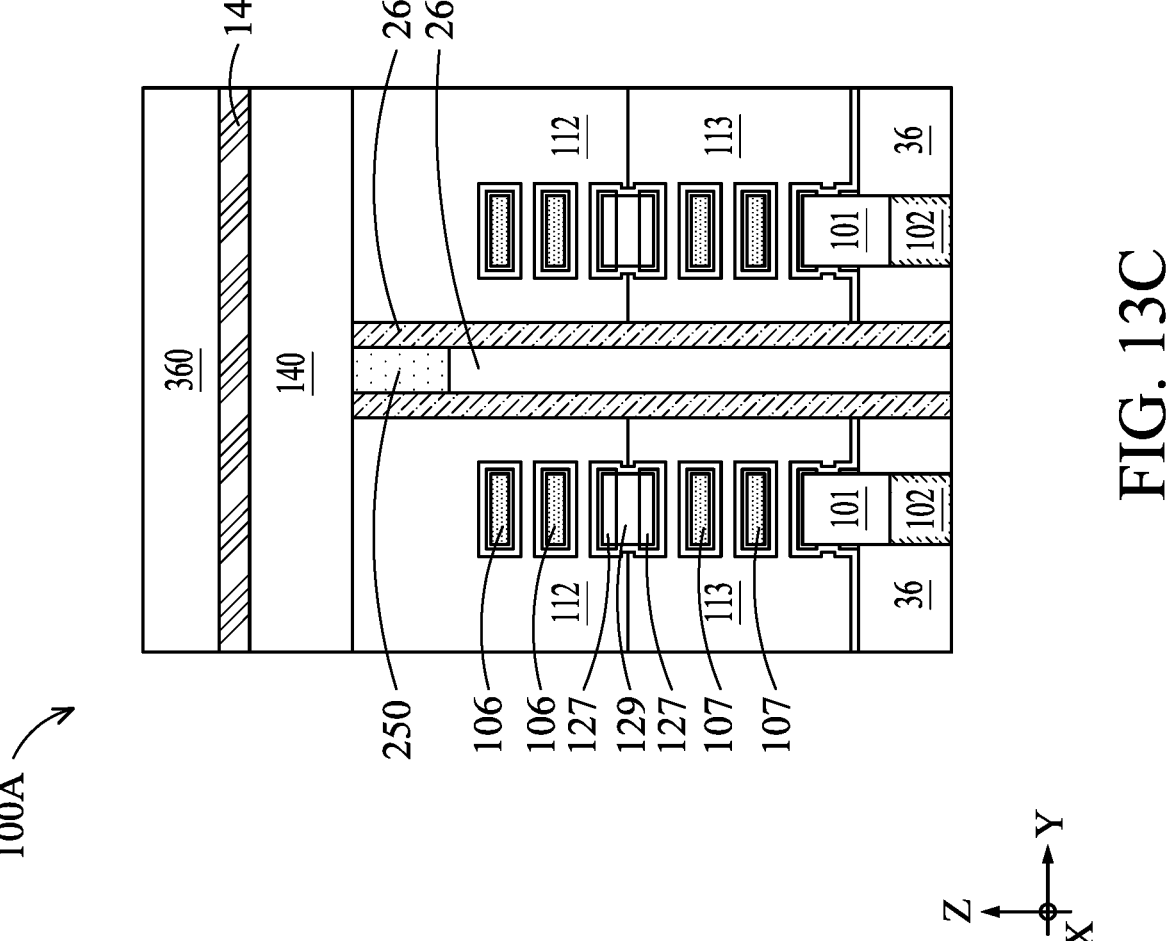
Figure 13E:
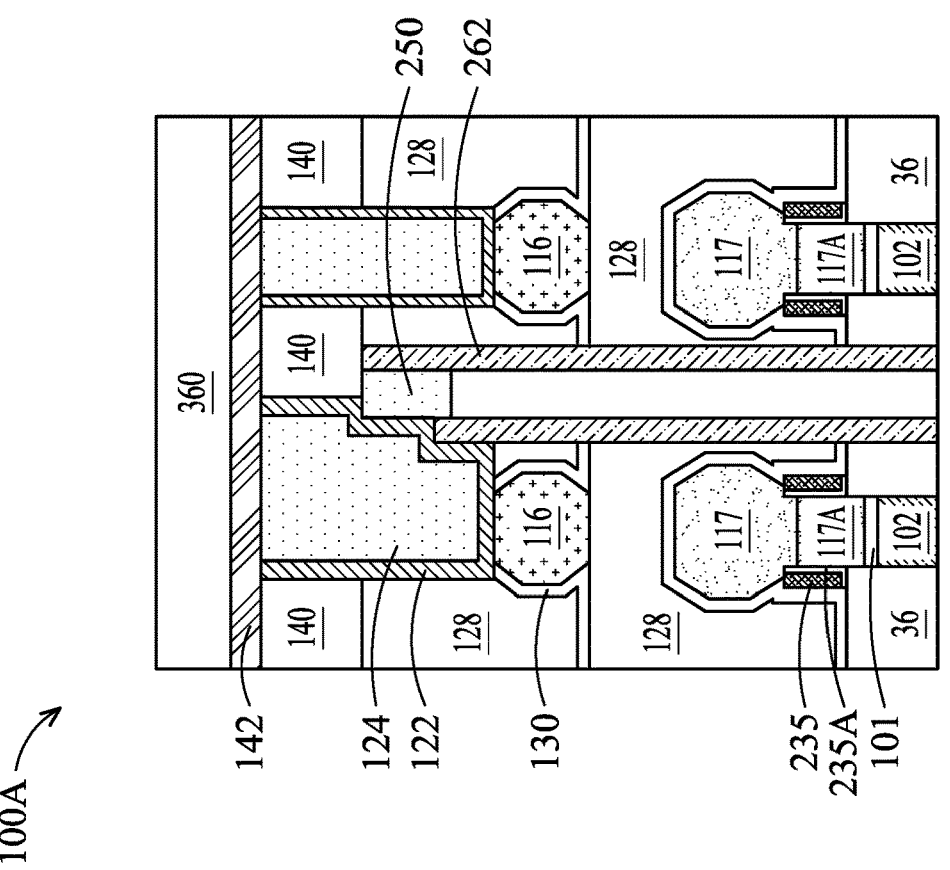
Figure 13D:
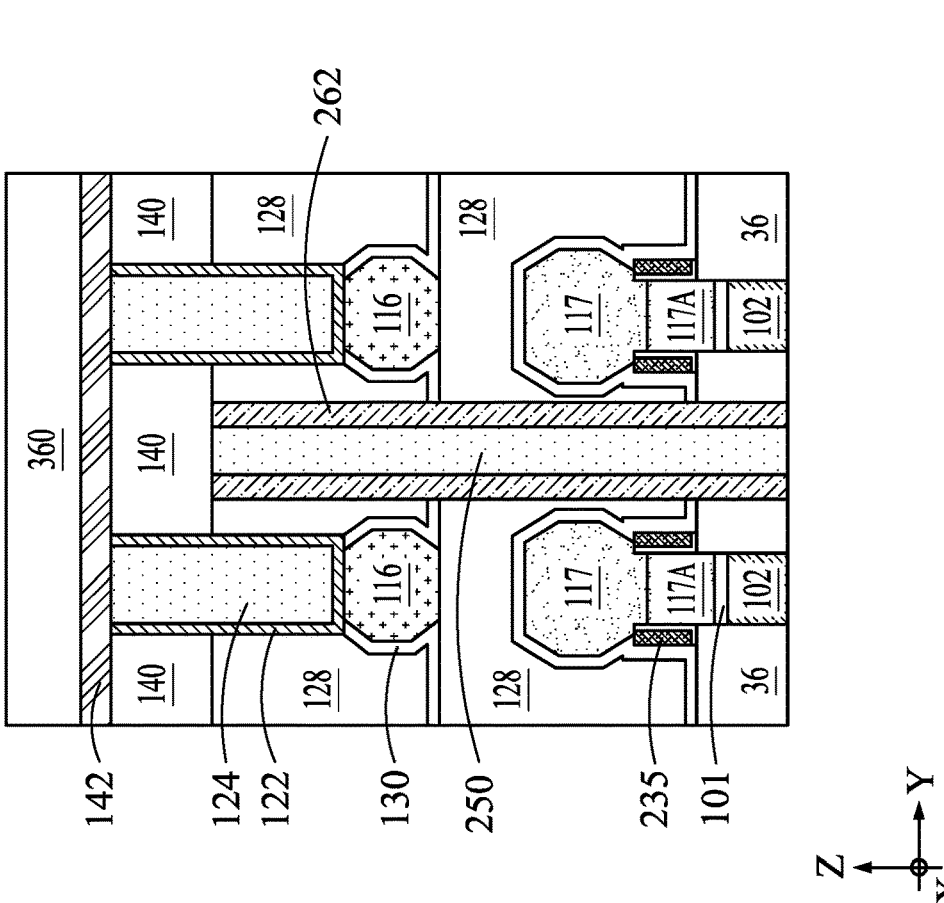
Figure 13G:
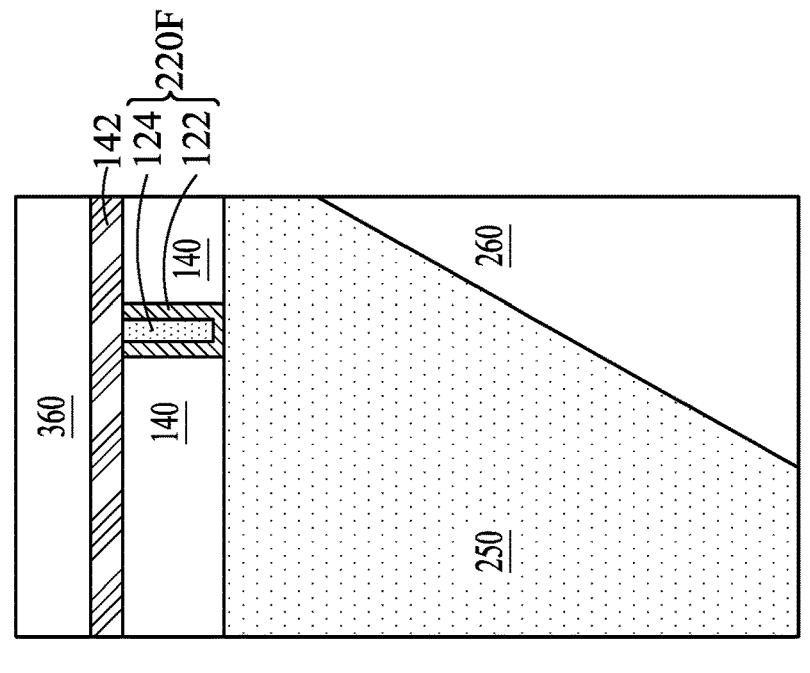
Figure 13G:
Figure 13F:
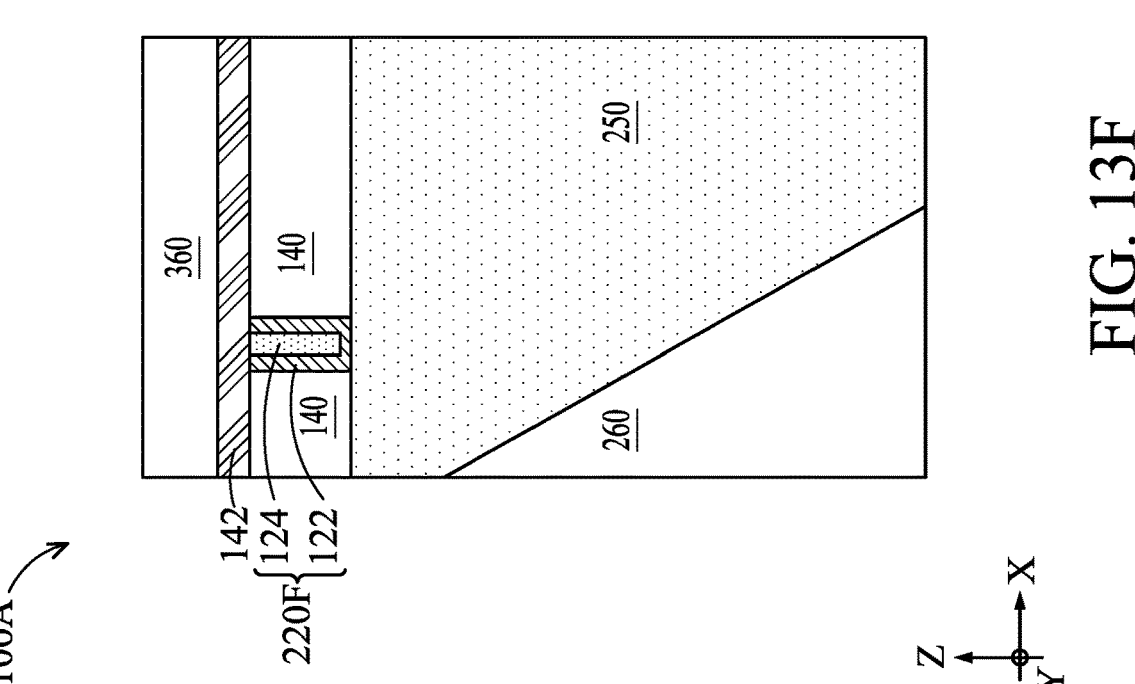
Figures 14A, 14B:
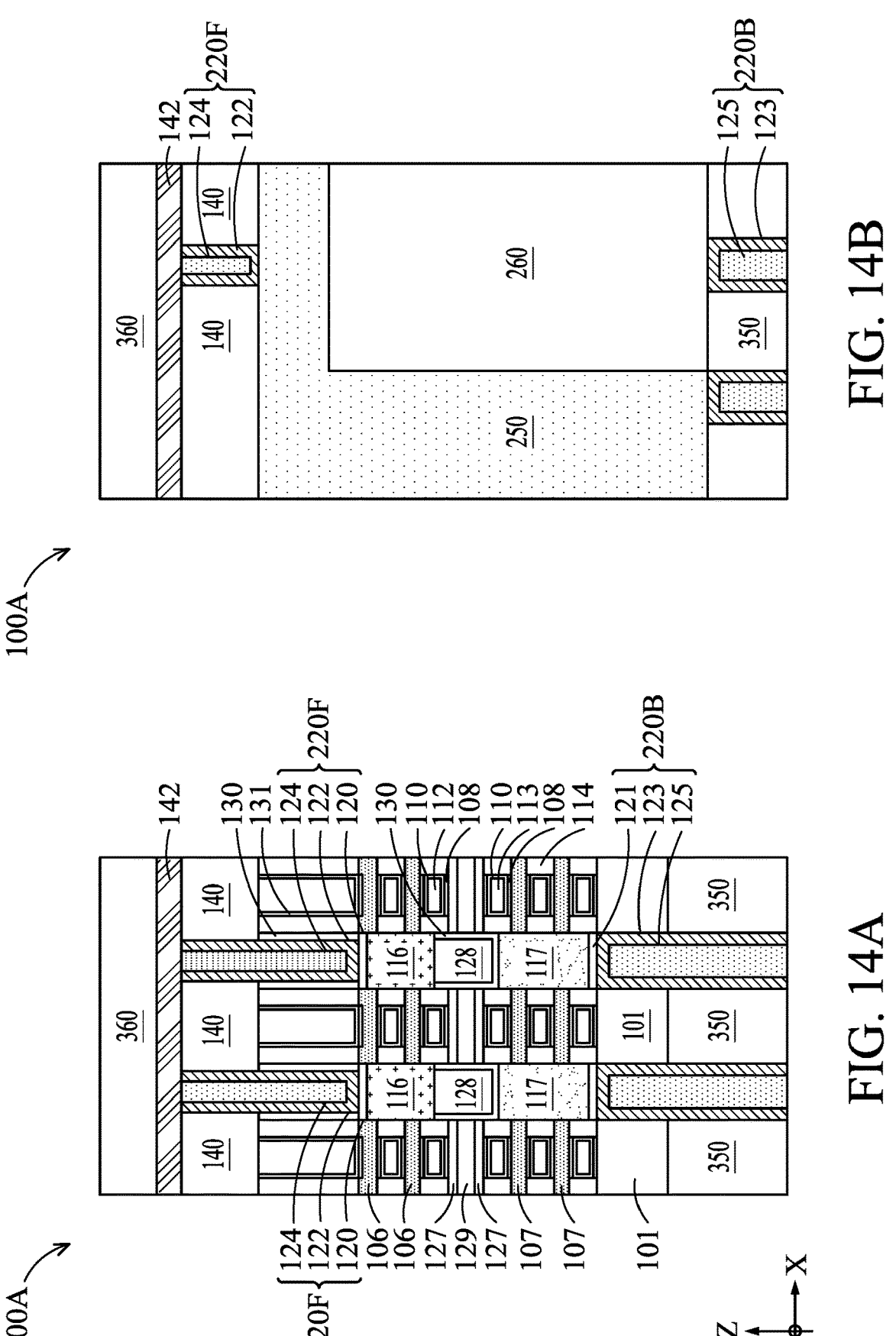
Figure 14C:
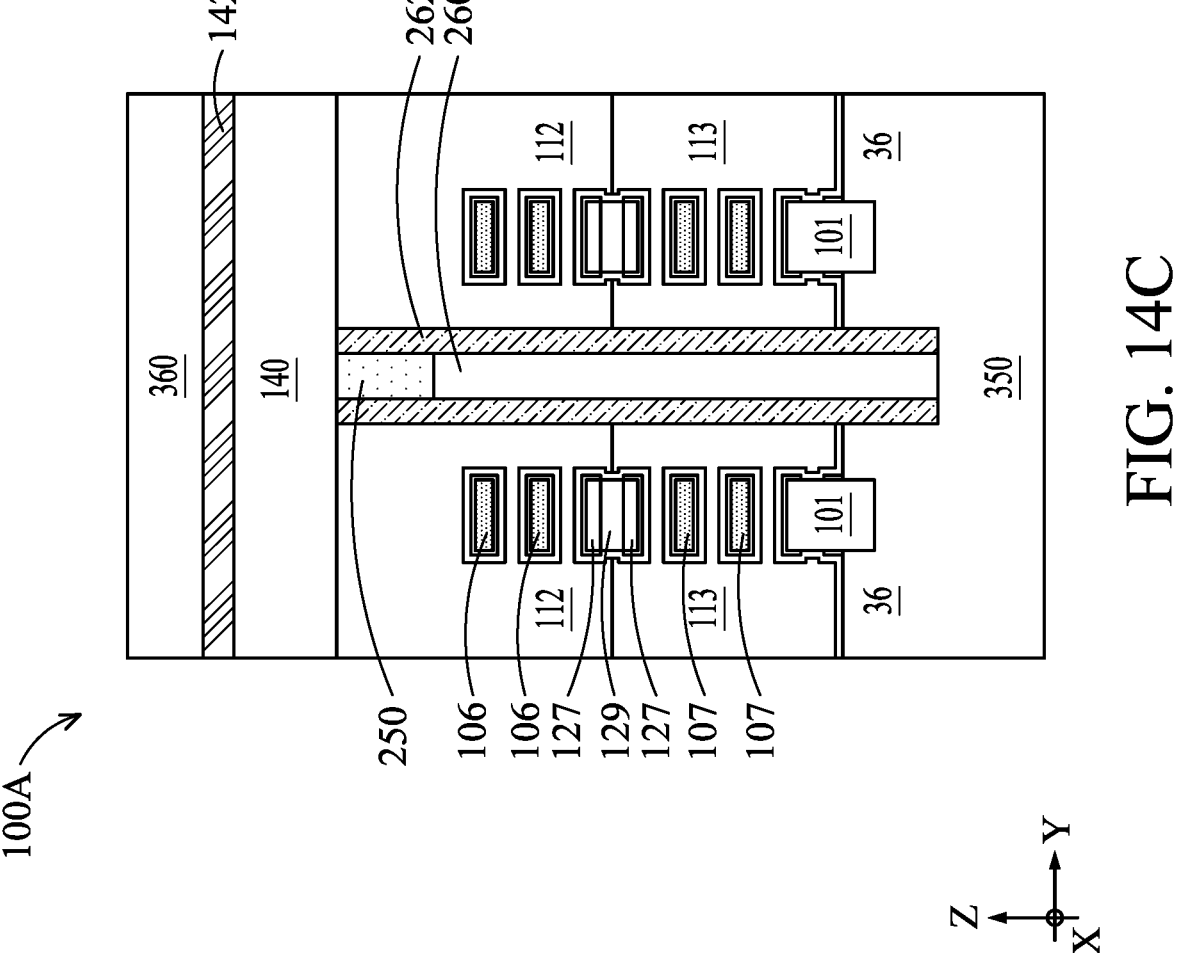
Figures 14D, 14E:
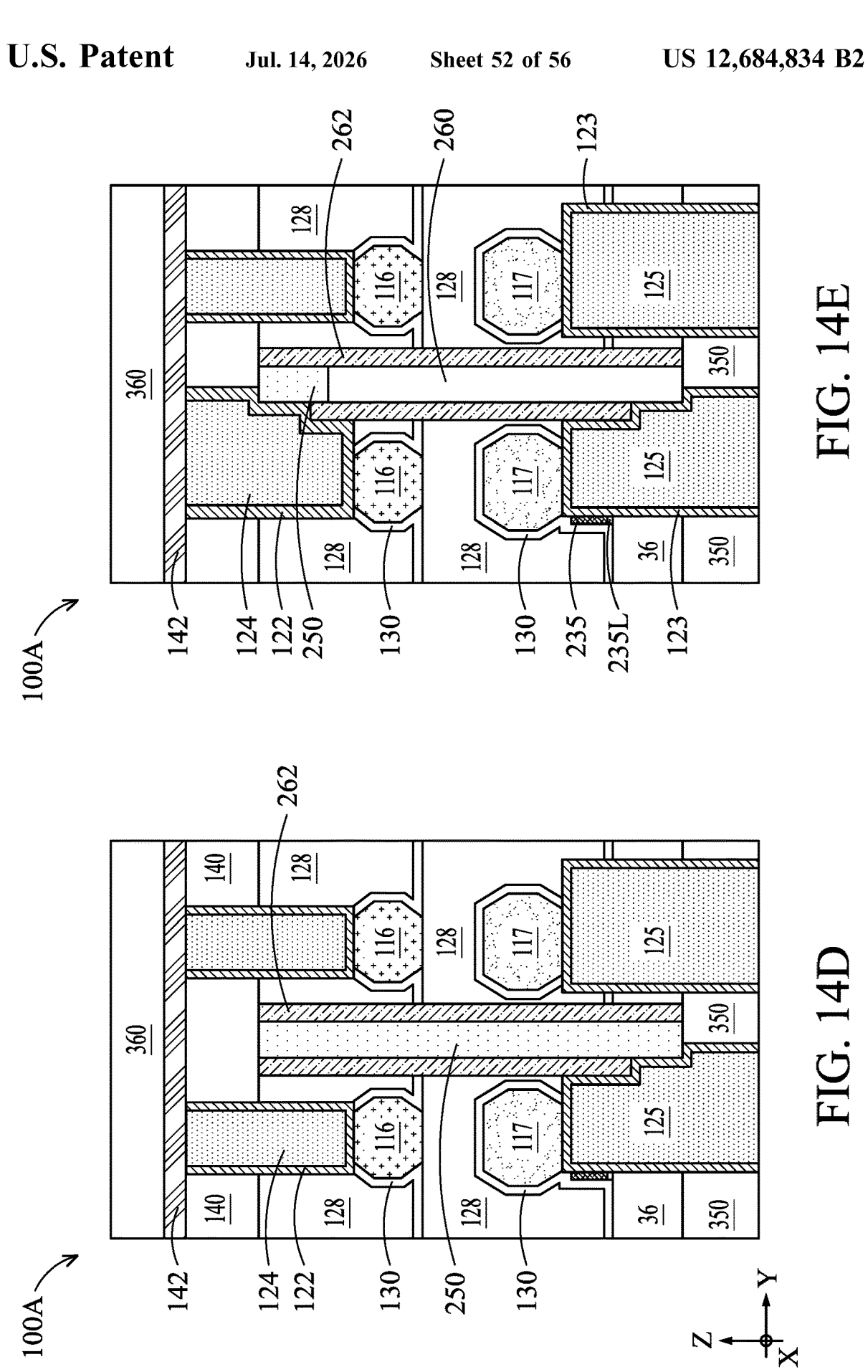

In FIGS. 13A-13E, the dielectric layer 260 is formed in the opening 53, corresponding to operation 2600 of FIG. 18. FIGS. 13F and 13G illustrate formation of the dielectric layer 260 in the opening 53A. Formation of the dielectric layer 260 is similar to that described with reference to FIGS. 8A-8E.

In FIGS. 14A-14E, the backside source/drain contacts 220B are formed, corresponding to operation 2700 of FIG. 18. Formation of the backside source/drain contacts 220B is similar to that described with reference to FIGS. 10A-10E. Due to presence of the dielectric layer 260, one or more of the backside source/drain contacts 220B may partially land on the dielectric layer 260, for example, the bottom-left backside source/drain contact 220B shown in FIG. 14E. This is advantageous in relaxing overlay accuracy for forming the backside source/drain contacts 220B.

Figure 15:
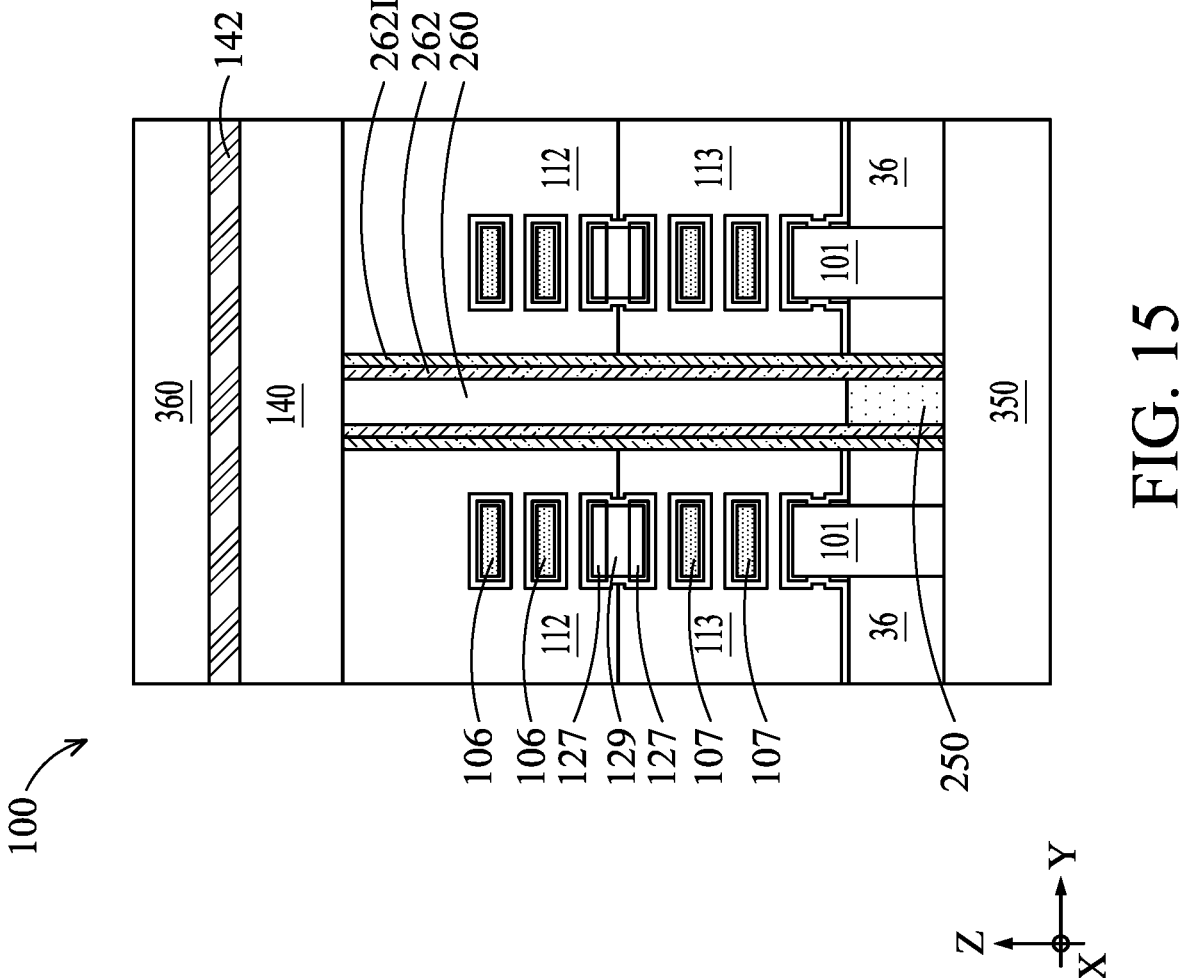

FIG. 15 shows the integrated circuit 100 having the L-shaped conductive TSL 250 and the liner layer 262L. The liner layer 262L extends vertically from the upper surface of the gate metal 112 to the bottom surface of the isolation region 36 or the top surface of the backside ILD layer 350.

FIG. 16 shows the integrated circuit 100A having the inverted-L-shaped conductive TSL 250 and the liner layer 262L. The liner layer 262L extends vertically from the upper surface of the gate metal 112 to the bottom surface of the isolation region 36 or the top surface of the backside ILD layer 350.

Embodiments of the present disclosure provide an integrated circuit with a CFET having improved electrical characteristics. The CFET includes a first transistor stacked vertically on a second transistor. The first and second transistors each have a plurality of semiconductor nanostructures that act as the channel regions for the first and second transistors. A first gate metal surrounds the semiconductor nanostructures of the first transistor. A second gate metal surrounds the semiconductor nanostructures of the second transistor. The CFET includes an isolation structure positioned between the lowest semiconductor nanostructure of the first transistor and the highest semiconductor nanostructure of the second transistor. The CFET includes a gate isolation structure with embedded conductive through-silicon layer (TSL) that has a cutout region which reduces parasitic capacitance.

This helps ensure that the conductive TSL will not unduly increase parasitic capacitance with nearby gate metal and/or source/drain regions. Furthermore, the presence of the dielectric layer in the cutout region can relax overlay accuracy for forming source/drain contacts. This results in better functioning CFETs, better functioning integrated circuits, and increased wafer yields.

In some embodiments, a device includes: a complementary transistor including: a first transistor having a first source/drain region and a second source/drain region; and a second transistor stacked on the first transistor, and having a third source/drain region and a fourth source/drain region, the third source/drain region overlapping the first source/drain region, the fourth source/drain region overlapping the second source/drain region. The device further includes: a first source/drain contact electrically coupled to the third source/drain region; a second source/drain contact electrically coupled to the second source/drain region; a gate isolation structure adjacent the first and second transistors; and an interconnect structure electrically coupled to the first source/drain contact and the second source/drain contact. The interconnect structure includes: a conductive layer in contact with the first source/drain contact and the second source/drain contact, the conductive layer being in the gate isolation structure; an opening in the conductive layer, the opening overlapping the fourth source/drain region, the second source/drain region or both; and a dielectric layer in the opening and on the conductive layer in the gate isolation structure.

In some embodiments, a method includes: forming a first transistor and a second transistor stacked on the first transistor; forming a first opening adjacent the first transistor and the second transistor; forming a gate isolation layer in the first opening; forming a conductive layer on the gate isolation layer, the conductive layer being in the first opening; forming a cutout region in the conductive layer; forming a dielectric layer on the conductive layer in the cutout region; forming a frontside source/drain contact in contact with the second transistor and the conductive layer; and forming a backside source/drain contact in contact with the first transistor and the conductive layer.

In some embodiments, a method includes: forming a first transistor and a second transistor stacked on the first transistor; forming a first opening adjacent the first transistor and the second transistor; forming a gate isolation layer in the first opening; forming a conductive layer on the gate isolation layer, the conductive layer being in the first opening; forming a frontside source/drain contact in contact with the second transistor and an upper surface of the conductive layer; forming a cutout region in the conductive layer after the forming a frontside source/drain contact; forming a dielectric layer on the conductive layer in the cutout region; and forming a backside source/drain contact in contact with the first transistor and the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first transistor and a second transistor stacked on the first transistor;
forming a first opening adjacent the first transistor and the second transistor;
forming a gate isolation layer in the first opening;
forming a conductive layer on the gate isolation layer, the conductive layer being in the first opening;
forming a cutout region in the conductive layer;
forming a dielectric layer on the conductive layer in the cutout region;
forming a frontside source/drain contact in contact with the second transistor and the conductive layer; and
forming a backside source/drain contact in contact with the first transistor and the conductive layer.

2. The method of claim 1, wherein the cutout region is rectangular.

3. The method of claim 1, wherein the cutout region is triangular.

4. The method of claim 1, wherein the forming a gate isolation layer includes:
forming a first dielectric layer in the first opening; and
forming a second dielectric layer on the first dielectric layer, the second dielectric layer having a higher dielectric constant than the first dielectric layer.

5. The method of claim 1, wherein the forming a frontside source/drain contact includes:
forming a second opening that exposes a source/drain region of the second transistor, recesses a portion of the gate isolation layer, and exposes an upper surface of the conductive layer; and
forming the frontside source/drain contact in the second opening.

6. The method of claim 1, further comprising:
forming a second frontside source/drain contact that lands on the dielectric layer.

7. A method, comprising:
forming a first transistor and a second transistor stacked on the first transistor;
forming a first opening adjacent the first transistor and the second transistor;
forming a gate isolation layer in the first opening;
forming a conductive layer on the gate isolation layer, the conductive layer being in the first opening;
forming a frontside source/drain contact in contact with the second transistor and an upper surface of the conductive layer;
forming a cutout region in the conductive layer after the forming a frontside source/drain contact;
forming a dielectric layer on the conductive layer in the cutout region; and
forming a backside source/drain contact in contact with the first transistor and the conductive layer.

8. The method of claim 7, wherein the forming the cutout region comprises:
removing a portion of the conductive layer that overlaps respective gate metals of the first transistor and the second transistor.

9. The method of claim 7, wherein the forming the cutout region comprises:

etching the conductive layer from a side of the conductive layer vertically opposite the frontside source/drain contact.

10. The method of claim 9, wherein the conductive layer has a tapered sidewall following the etching.

11. A method, comprising:

forming a first transistor and a second transistor stacked on the first transistor;

forming a first opening adjacent the first transistor and the second transistor;

forming a gate isolation layer in the first opening;

forming a lower portion of a conductive layer in a bottom portion of the first opening;

forming a dielectric layer in the first opening on the lower portion of the conductive layer;

forming a second opening in the dielectric layer that exposes the lower portion of the conductive layer;

forming an upper portion of the conductive layer in the second opening and in contact with the lower portion;

forming a frontside source/drain contact in contact with the upper portion; and forming a backside source/drain contact in contact with the lower portion.

12. The method of claim 11, wherein the second opening is narrower than the first opening in a horizontal direction.

13. The method of claim 11, further comprising performing a chemical mechanical planarization process to remove excess material of the upper portion from an upper surface of the dielectric layer.

14. The method of claim 11, wherein the dielectric layer comprises a low-k dielectric material.

15. The method of claim 11, further comprising forming a second frontside source/drain contact that lands on the dielectric layer.

16. The method of claim 11, wherein forming the gate isolation layer includes forming a liner layer having a lower dielectric constant than the gate isolation layer.

17. The method of claim 11, wherein the lower portion and the upper portion are formed of one or more of W, Co, Cu, or Ru.

18. The method of claim 11, wherein the lower portion has a vertical height that is less than about 100 nm.

19. The method of claim 11, wherein the first transistor is an N-type transistor and the second transistor is a P-type transistor.

20. The method of claim 11, further comprising forming a silicide layer between the frontside source/drain contact and a source/drain region of the second transistor.

\*    \*    \*    \*    \*